(12) United States Patent
Sandhu

(10) Patent No.: US 8,663,532 B2
(45) Date of Patent: Mar. 4, 2014

(54) MASKING TECHNIQUES AND CONTACT IMPRINT RETICLES FOR DENSE SEMICONDUCTOR FABRICATION

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/888,042

(22) Filed: May 6, 2013

(65) Prior Publication Data

US 2013/0244436 A1 Sep. 19, 2013

Related U.S. Application Data

(63) Continuation of application No. 12/822,625, filed on Jun. 24, 2010, now Pat. No. 8,449,805, which is a continuation of application No. 11/445,766, filed on Jun. 1, 2006, now Pat. No. 7,795,149.

(51) Int. Cl.
*B28B 3/00* (2006.01)
*B29C 41/00* (2006.01)
*H01L 21/00* (2006.01)

(52) U.S. Cl.
USPC ........... 264/299; 264/104; 264/220; 425/470; 438/800

(58) Field of Classification Search
None
See application file for complete search history.

(56) References Cited

U.S. PATENT DOCUMENTS

| | | |
|---|---|---|
| 4,234,362 A | 11/1980 | Riseman |
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,648,937 A | 3/1987 | Ogura et al. |

(Continued)

FOREIGN PATENT DOCUMENTS

| | | |
|---|---|---|
| DE | 42 36 609 A1 | 5/1994 |
| EP | 0227303 | 7/1987 |

(Continued)

OTHER PUBLICATIONS

Bergeron, et al., "Resolution Enhancement Techniques for the 90nm Technology Node and Beyond," *Future Fab International*, Issue 15, Jul. 11, 2013, 4 pages.

(Continued)

*Primary Examiner* — Benjamin Schiffman
(74) *Attorney, Agent, or Firm* — Knobbe, Martens, Olson & Bear LLP

(57) ABSTRACT

A reticle comprising isolated pillars is configured for use in imprint lithography. In some embodiments, on a first substrate a pattern of pillars pitch-multiplied in two dimensions is formed in an imprint reticle. The imprint reticle is brought in contact with a transfer layer overlying a series of mask layers, which in turn overlie a second substrate. The pattern in the reticle is transferred to the transfer layer, forming an imprinted pattern. The imprinted pattern is transferred to the second substrate to form densely-spaced holes in the substrate. In other embodiments, a reticle is patterned by e-beam lithography and spacer formations. The resultant pattern of closely-spaced pillars is used to form containers in an active integrated circuit substrate.

20 Claims, 60 Drawing Sheets

(56) References Cited

U.S. PATENT DOCUMENTS

| | | |
|---|---|---|
| 4,716,131 A | 12/1987 | Okazawa et al. |
| 4,776,922 A | 10/1988 | Bhattacharyya et al. |
| 4,803,181 A | 2/1989 | Buchmann et al. |
| 4,838,991 A | 6/1989 | Cote et al. |
| 5,013,680 A | 5/1991 | Lowrey et al. |
| 5,047,117 A | 9/1991 | Roberts |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,858,620 A | 1/1999 | Ishibashi et al. |
| 5,895,740 A | 4/1999 | Chien et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,060,383 A | 5/2000 | Nogami et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,372,649 B1 | 4/2002 | Han et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,531,067 B1 | 3/2003 | Shiokawa et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,627,824 B1 | 9/2003 | Lin |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,730,571 B1 | 5/2004 | Chan et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,429,536 B2 | 9/2008 | Abatchev et al. |
| 7,442,976 B2 | 10/2008 | Juengling |
| 7,537,866 B2 | 5/2009 | Liu |
| 7,687,408 B2 | 3/2010 | Abatchev et al. |
| 7,851,135 B2 | 12/2010 | Jung |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0090002 A1 | 5/2003 | Sugawara et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0137729 A1 | 7/2004 | Norman |
| 2004/0235255 A1 | 11/2004 | Tanaka et al. |
| 2005/0074949 A1 | 4/2005 | Jung et al. |
| 2005/0087892 A1 | 4/2005 | Hsu et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu |
| 2005/0186705 A1 | 8/2005 | Jackson et al. |
| 2005/0230882 A1 | 10/2005 | Watts et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |

(56) References Cited

U.S. PATENT DOCUMENTS

| | | |
|---|---|---|
| 2006/0250593 A1 | 11/2006 | Nishi |
| 2006/0261392 A1 | 11/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0018345 A1 | 1/2007 | Chao |
| 2007/0026672 A1 | 2/2007 | Tang et al. |
| 2007/0045712 A1 | 3/2007 | Haller et al. |
| 2007/0045780 A1 | 3/2007 | Akram et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0200178 A1 | 8/2007 | Yun et al. |
| 2007/0205438 A1 | 9/2007 | Juengling |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0238308 A1 | 10/2007 | Niroomand et al. |
| 2007/0249170 A1 | 10/2007 | Kewley |
| 2007/0261016 A1 | 11/2007 | Sandhu et al. |
| 2007/0275309 A1 | 11/2007 | Liu |
| 2008/0011998 A1 | 1/2008 | Lung |
| 2008/0054350 A1 | 3/2008 | Breitwisch et al. |
| 2008/0085612 A1 | 4/2008 | Smythe |
| 2008/0292991 A1 | 11/2008 | Wallow |
| 2009/0258492 A1 | 10/2009 | Sant et al. |

FOREIGN PATENT DOCUMENTS

| | | |
|---|---|---|
| EP | 0491408 | 6/1992 |
| EP | 1357433 | 10/2003 |
| JP | 57-048237 | 3/1982 |
| JP | 64-035916 | 2/1989 |
| JP | 05343370 | 12/1993 |
| JP | H8-55908 | 2/1996 |
| JP | H8-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 10-1995-0034748 A | 12/1995 |
| KR | 10-0122315 B1 | 9/1997 |
| KR | 1999-0001440 | 1/1999 |
| KR | 1999-027887 | 4/1999 |
| TW | 376582 | 12/1999 |
| WO | WO 94/15261 | 7/1994 |
| WO | WO 02/099864 | 12/2002 |
| WO | WO 2004/001799 | 12/2003 |
| WO | WO 2004/003977 | 1/2004 |
| WO | WO 2005/034215 | 4/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of *Proceedings of SPIE: Advances in Resist Technology and Processing XXI*, vol. 5376, John L. Sturtevant, editor, 2004, 8 pages.

Bruek, "Optical and Interferometric Lithography—Nanotechnology Enablers," 2005, Proceedings of the IEEE, vol. 93, No. 10, pp. 1704-1721.

Cerofolini et al., "Strategies for nanoelectronics", *Microelectronic Engineering*, vol. 81, pp. 405-419, Apr. 7, 2005.

Choi et al., "Sublithographic nanofabrication technology for nanocatalysts and DNA chips," *J. Vac. Sci. Technol.*, Nov./Dec. 2003; pp. 2951-2955.

Chou, et al., "Nanoimprint lithography," J. Vac. Sci. Technol. B 14(6), Nov./Dec. 1996, pp. 4129-4133.

Chou, et al., "Sub-10 nm imprint lithography and applications," J. Vac. Sci. Technol. B 15(6) Nov./Dec. 1997, pp. 2897-2904.

Chung et al., "Nanoscale Multi-Line Patterning Using Sidewall Structure," *Jpn., J. App.. Phys.* vol. 41 (2002) Pt. 1, No. 6B, pp. 4410-4414.

Chung et al., "Pattern multiplication method and the uniformity of nanoscale multiple lines*," *J.Vac.Sci.Technol.* B21(4), Jul./Aug. 2003, pp. 1491-1495.

Ex Parte Cantell, unpublished decision of the Board of Patent Appeals and Interferences, Mar. 4, 2005.

Joubert et al., "Nanometer scale linewidth control during etching of polysilicon gates in high-density plasmas," *Microelectronic Engineering* 69 (2003), pp. 350-357.

Oehrlein et al., "Pattern transfer into low dielectric materials by high-density plasma etching," *Solid State Tech.*, May 2000, 8 pages.

Office Action of Jun. 2, 2008 in U.S. Appl. No. 11/219,067, filed Sep. 1, 2005.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

Sheats et al., "Microlithography: Science and Technology," 1998, Marcel Dekkar, Inc., pp. 104-105.

Zankovych et al., "Nanoimprint lithography: challenges and prospects", *Nanotechnology*, vol. 12, No. 12; Jun. 2001; 6 pages.

US 8,663,532 B2

MASKING TECHNIQUES AND CONTACT IMPRINT RETICLES FOR DENSE SEMICONDUCTOR FABRICATION

CROSS-REFERENCE TO RELATED APPLICATIONS

Any and all applications for which a foreign or domestic priority claim is identified in the Application Data Sheet as filed with the present application are hereby incorporated by reference under 37 CFR 1.57. In addition, this application is related to and incorporates the following by reference in its entirety: U.S. patent application Ser. No. 11/134,982 to Abatchev et al., filed May 23, 2005.

BACKGROUND OF THE INVENTION

1. Field of the Invention

This invention relates generally to masking techniques for semiconductor fabrication, and more particularly to masking techniques for forming contact imprint lithography reticles.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction. Additionally, the spacing between features (e.g., DRAM capacitors) is also being decreased in size to offer a higher density of features.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. DRAM memory cells typically include two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute a memory cell and the sizes of the conducting lines that access the memory cells, the memory devices can be made smaller. Additionally, storage capacities can be increased by fitting more memory cells on a given area in the memory devices. Other examples of integrated circuit memories include MRAM (including magneto resistive elements), programmable fuse memories, programmable conductor memories (including metal-doped chalcogenide glass elements), SRAM, SDRAM, EEPROM and other volatile and non-volatile memory schemes.

Lithography, such as photolithography, is commonly used to pattern features, such as conductive lines. However, due to factors such as optics and the wavelength of light (or electromagnetic radiation) used to pattern features, lithographic techniques each have a lower limit below which a particular technique cannot reliably form features. The lower limit for photolithography is currently between about 30-50 nm.

High resolution processes, such as electron beam ("e-beam") lithography, are typically employed for defining the desired patterns in lithography reticles which can then be repeatedly employed in applying those patterns to substrates (e.g., wafers) in which integrated circuits will be formed. The reticles can be used for photolithography or contact imprint lithography. The lower limit of electron beam lithography is about 10 nm or less, though equipment capable of achieving this limit is expensive. Consequently, the lower limit of a lithographic technique is an impediment to further reduction in feature sizes.

BRIEF DESCRIPTION OF THE DRAWINGS

The appended drawings are meant to illustrate and not to limit the invention:

FIGS. 2-21B illustrate one sequence for forming closely spaced holes on a substrate;

FIGS. 22-24B illustrate transferring the substrate pattern of holes of FIG. 21B to form an inverse pattern of closely spaced pillars in a reticle plate;

FIG. 2 is a schematic, cross-sectional side view of masking layers and a substrate or plate used to form an imprint reticle, in accordance with a preferred embodiment of the present invention;

FIG. 3 shows the structure of FIG. 2 after photolithographic patterning of a first resist layer;

FIG. 4 shows the structure of FIG. 3 after trimming the features in the pattern of FIG. 3;

FIG. 5 shows a schematic, cross-sectional side view of masking and substrate layers used to form an imprint reticle after the pattern of FIG. 4 has been extended into underlying layers;

FIG. 6 shows the structure of FIG. 5 after overlying layers have been stripped;

FIG. 7 shows the structure of FIG. 6 after blanket deposition of a spacer material;

FIG. 8 shows the structure of FIG. 7 after a spacer etch and subsequent etch, leaving a pattern of free-standing spacers that has been extended into an underlying layer;

FIG. 9 shows the structure of FIG. 8 after blanket deposition of a filler material;

FIGS. 18-20 illustrate a process flow that can be used in conjunction with the structure of FIG. 17 to create a mask grid with small holes that are densely spaced in an advantageous manner;

FIGS. 21A-21B show the structure of FIGS. 20A-20D after the pattern of holes in the third temporary layer has been extended into the substrate and the third temporary layer has been removed;

FIG. 22 is a schematic, cross-sectional side view of a structure formed by depositing a substantially planar layer over the substrate of FIGS. 21A-21B;

FIG. 23 is a schematic, cross-sectional side view of the substrate and planar layer of FIG. 22 after bonding a reticle plate to the planar layer using an adhesive layer, the planar layer, the adhesive layer and the plate defining a partially-formed imprint reticle;

FIGS. 24A-24B are schematic, cross-sectional side and top plan views of the substrate and partially-formed reticle of FIG. 23 after etching away the substrate;

FIGS. 26A and 26B show a partially-formed imprint reticle after a pattern of pillars has been formed in a photodefinable layer. FIG. 26C shows the structure of FIG. 26B after depositing a conformal spacer layer over the pillars. FIG. 26D shows the structure of FIG. 26C after forming spacers around the pillars to form an altered pattern of pillars. FIG. 26E shows the structure of FIG. 26D after transferring the altered pattern to an underlying chrome layer. FIGS. 26F and 26G show the structure of FIG. 26E after the masking layer has been removed, leaving the pattern of freestanding chrome pillars;

FIGS. 27A and 27B show a partially-formed imprint reticle after a pattern of pillars has been formed in a photodefinable layer. FIG. 27C shows the structure of FIG. 27B after the pattern of pillars has been extended to a hard mask layer. FIG. 27D shows the structure of FIG. 27C after the pattern of pillars has been extended to a temporary layer and the overlying mask layers have been removed. FIG. 27E shows the structure of FIG. 27D after depositing a layer of conformal spacer material over the pillars. FIG. 27F shows the structure of FIG. 27E after forming spacers around the pillars to form an altered pattern of pillars. FIG. 27G shows the structure of FIG. 27F after transferring the altered pattern to an underlying chrome layer. FIGS. 27H and 27I show the structure of FIG. 27G after the masking layer has been removed, leaving the pattern of freestanding chrome pillars;

FIGS. 28A and 28B show a partially-formed imprint reticle after a pattern of pillars has been formed in a photodefinable layer. FIG. 28C shows the structure of FIG. 28B after depositing a layer of conformal spacer material (e.g., silicon nitride, silicon oxide, amorphous carbon, silicon) over the pillars. FIG. 28D shows the structure of FIG. 28C after forming spacers around the pillars to form an altered pattern of pillars. FIG. 28E shows the structure of FIG. 28D after transferring the altered pattern to an underlying quartz substrate. FIGS. 28F and 28G show the structure of FIG. 28E after the masking layer has been removed, leaving the pattern of freestanding quartz pillars;

DETAILED DESCRIPTION OF THE PREFERRED EMBODIMENTS

Figure 1A:
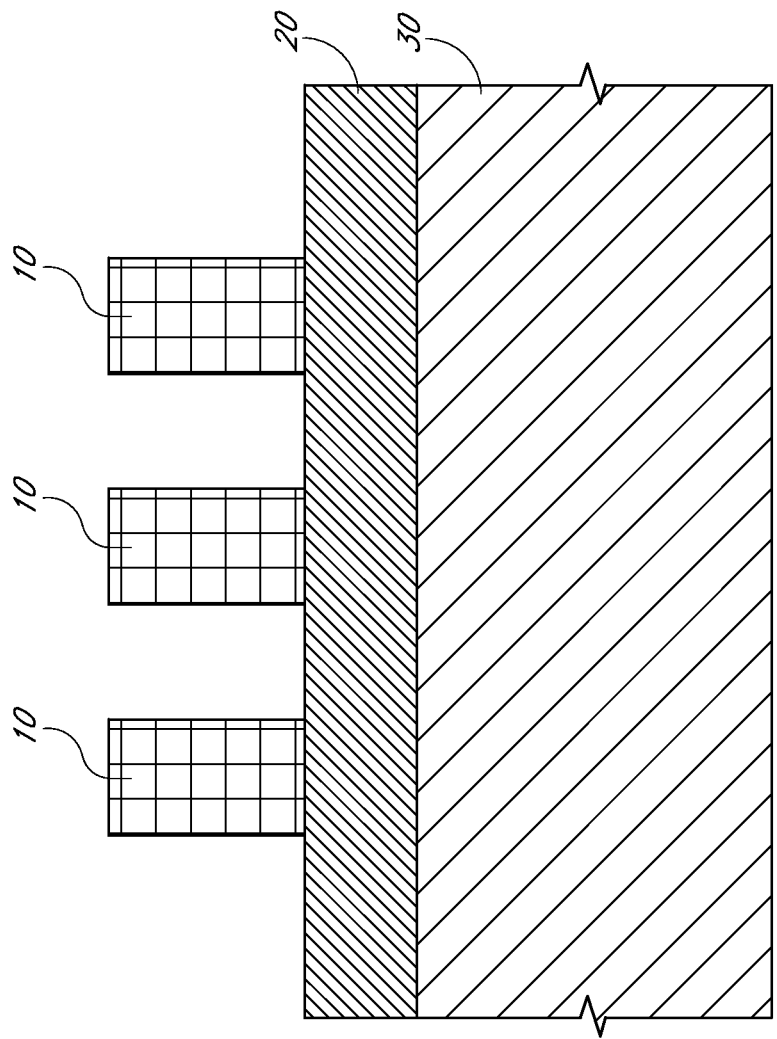
FIGS. 1A-1F are schematic, cross-sectional side views of a sequence of masking patterns for forming conductive lines, in accordance with a prior art pitch multiplication method.

The reduction in feature sizes and the concomitant increase in the complexity of device features may increase the number of processing steps in semiconductor fabrication, which can in turn increase the processing time and costs. Thus, a need exists for methods of forming closely-spaced and in some cases densely-packed isolated features with feature spacing either below that obtainable by conventional lithography (e.g., photolithography, electron beam lithography) alone, or more cheaply (or more reliably) than such processes.

Contact Imprint Lithography

Contact imprint lithography ("imprint lithography") has the potential for forming device features on semiconductor surfaces while substantially reducing the production costs associated with semiconductor fabrication. A method of forming templates or reticles for use in imprint lithography is described by U.S. patent application Ser. No. 11/155,167 to Sandhu et al., filed Jun. 17, 2005, the entire disclosure of which is incorporated herein by reference. Imprint lithography entails pressing a reticle comprising a pattern into a transfer layer overlying a substrate (e.g., a silicon wafer on which semiconductor devices or integrated circuits are to be formed). The pattern on the reticle deforms the transfer layer to form an inverse or negative image of the pattern in the transfer layer. The reticle is subsequently removed, and an etching process conveys the transfer layer pattern to the substrate.

The size of the features on the pattern and the corresponding features on the substrate are similar. Unlike photolithography, where a mask or reticle pattern is reduced substantially (e.g., 4×) in size when transferred to the surface of the semiconductor device, imprint lithography is considered a "1×" pattern transfer process because it provides no demagnification of the pattern on the reticle that is transferred to the semiconductor device. Hence, there is a one-to-one correspondence between the dimensions of the pattern on the reticle and the pattern on the semiconductor device. This means that it is more challenging to produce imprint reticles compared to photolithography reticles for a given target device pattern, without the benefit of optics to scale between the reticle and the target substrate. Thus, despite the advantages of imprint lithography, forming reticles comprising closely-spaced features by conventional photolithography poses an obstacle to the reduction of features sizes.

The inventor has observed that the use of pitch multiplication and/or other masking techniques with imprint lithography can overcome the obstacles associated with forming closely-spaced features. In several embodiments (FIGS. 26-28), electron beam ("e-beam") lithography is used to define a pattern of features (e.g., pillars), and spacer material is used to further reduce the spacing between the features to form an altered pattern, which is subsequently transferred to an imprint reticle plate. In another embodiment (FIGS. 2-25), conventional lithography (e.g., e-beam lithography or photolithography) and pitch-multiplication are used to form a pattern of closely-spaced holes in a sacrificial substrate and subsequently transferred to form an inverse pattern of pillars in an imprint reticle plate. Imprint reticles formed according to methods of preferred embodiments can be used to form closely-spaced features (e.g., holes, containers) in semiconductor substrates with 1× pattern transfer.

In methods according to preferred embodiments, the topography of the pattern of, e.g., pillars in the reticle is used to imprint holes or containers on a transfer layer overlying an IC substrate (e.g., semiconductor wafer) during integrated circuit fabrication. As described in more detail below with respect to FIG. 29A-31B, in a contact imprinting process, bringing the reticle in contact with the transfer layer imprints the reticle pattern in the transfer layer. The pattern in the transfer layer is subsequently transferred to the IC substrate through a predetermined number of etching steps. The pattern formed in the IC substrate is a negative (or inverse) image of the pattern in the reticle. For example, if the pattern in the reticle is a periodic array of pillars, the pattern in the IC substrate following contact imprinting and subsequent etching is a periodic array of holes or containers.

While the methods and reticles described herein can be used to form any integrated circuit, they are particularly advantageously applied to form devices having arrays of electrical devices, including capacitors and memory cell arrays for volatile and non-volatile memory devices such as DRAM, ROM or flash memory, including NAND flash memory, or integrated circuits having logic or gate arrays. For example, the logic array can be a field programmable gate array (FPGA) having a core array similar to a memory array and a periphery with supporting logic circuitry. Consequently, the integrated circuit pattern can be a pattern comprising, e.g., a memory chip or a processor, which can include both a logic array and embedded memory, or any other integrated circuit having a logic or a gate array. The processes described herein are particularly advantageous for forming isolated devices or device components, such as capacitors, in the arrays. These isolated devices, of course, are separately connected (e.g., by word lines and bit lines of memory arrays) in processes not described herein.

Forming a Pattern of Pillars in an Imprint Reticle by Pitch-Multiplication

In one embodiment of the invention, an imprint reticle configured for use in contact imprint lithography is formed via conventional lithography and pitch-multiplication by first forming a pattern of isolated features, preferably holes, pitch-multiplied in two dimensions in a sacrificial substrate. The pattern of holes is transferred to a reticle plate by forming a planar layer over the sacrificial substrate, subsequent to which a support structure (or reticle plate) is attached to a surface of the planar layer, and the sacrificial substrate is etched away. A pattern transfer from the planar layer to the reticle plate forms a pattern of pillars in the reticle. In other embodiments (not shown), pitch multiplication is used to create a pattern of pillars directly over an imprint reticle plate.

Figure 1B:
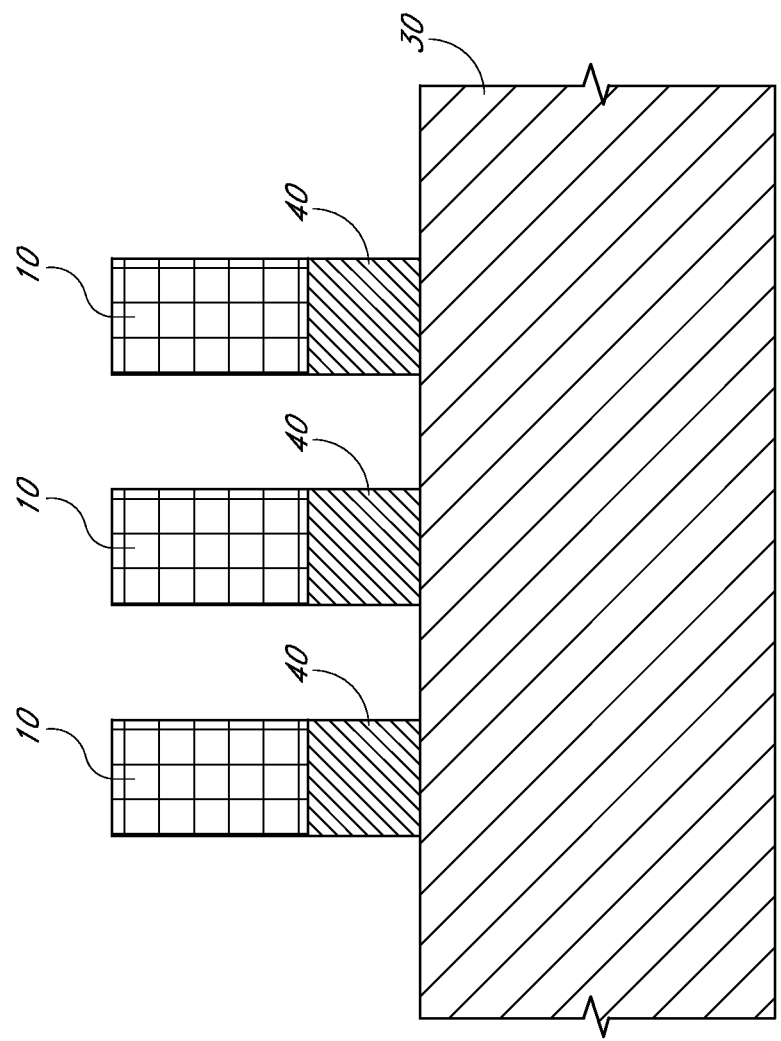
Figure 1C:
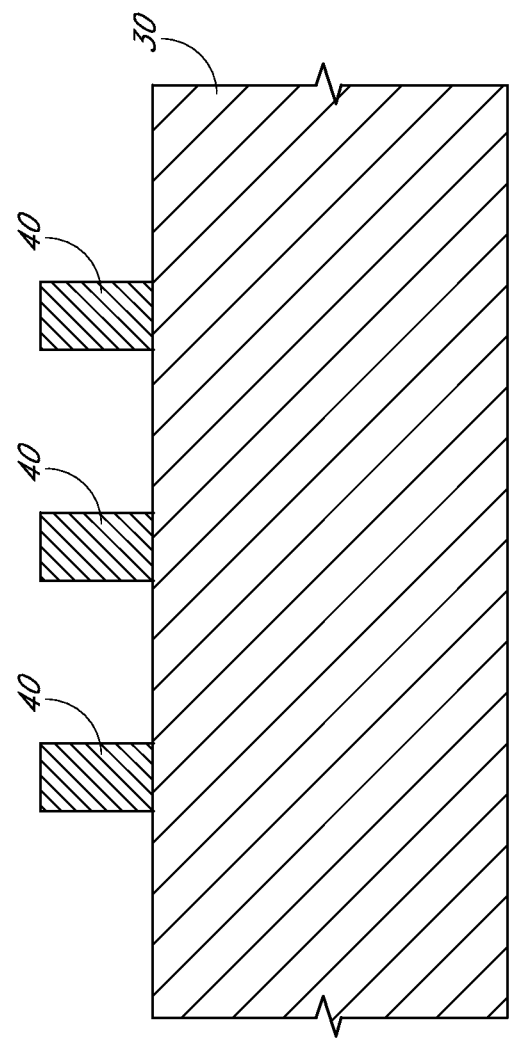
Figure 1D:
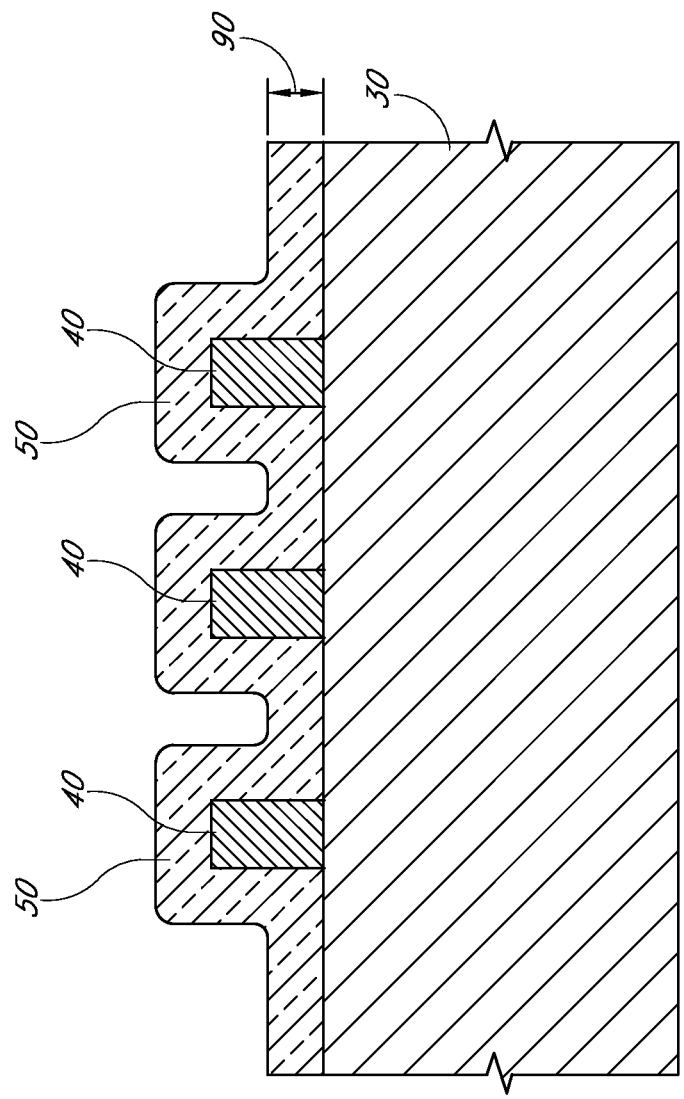
Figure 1E:
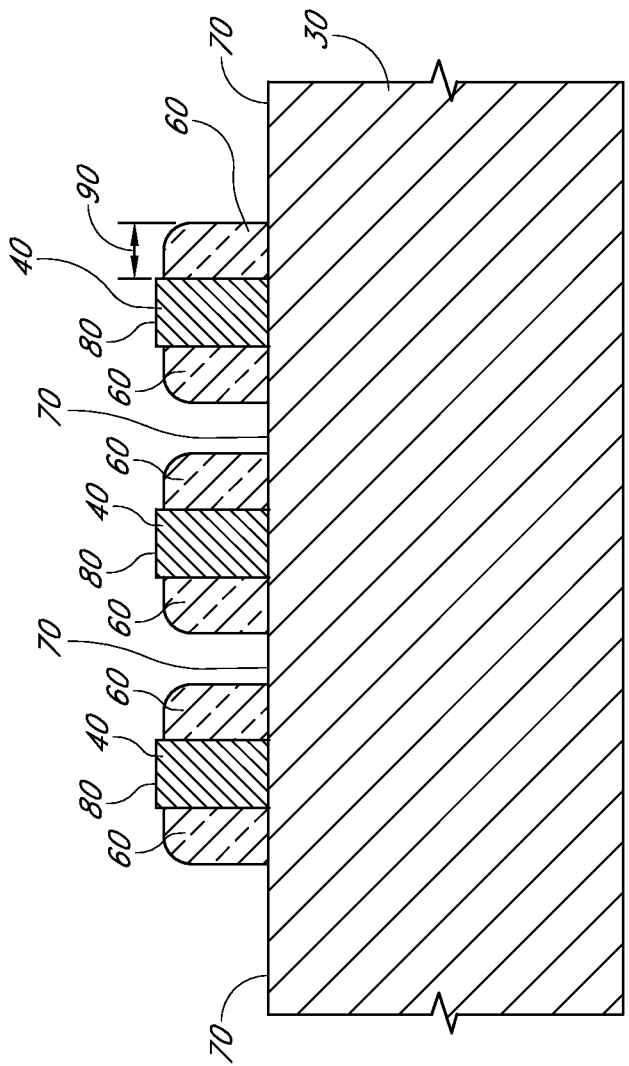
Figure 1F:
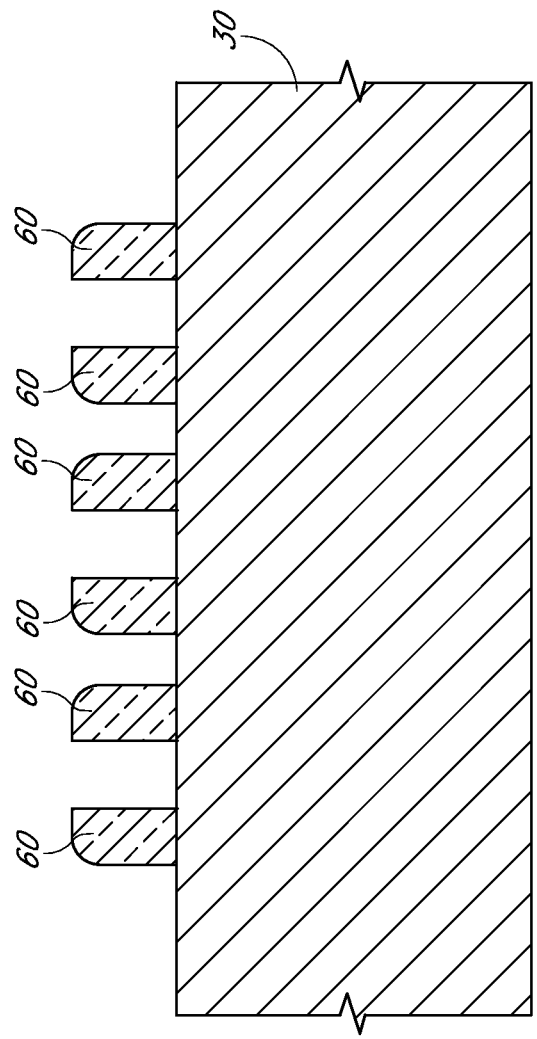

"Pitch multiplication" or "pitch doubling" is one proposed method for extending the capabilities of photolithographic techniques beyond their minimum limits. Pitch can be defined as the distance between an identical point in two neighboring features. These features are typically defined by spaces between adjacent features. Spaces are typically filled by a material, such as an insulator. As a result, for regular patterns (e.g., in arrays) pitch can be viewed as the sum of the width of a feature and of the width of the space on one side of the feature separating that feature from a neighboring feature. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. Pitch can thus be used in two converse senses: (1) the distance between identical elements in a regular pattern or (2) the number of features in a fixed linear distance.

It has been found that pitch multiplication techniques can encounter difficulty in transferring spacer patterns to a substrate. In common methods of transferring patterns, both the spacers and the underlying substrate are exposed to an etchant, which preferentially etches away the substrate material. The etchant, however, can also wear away the small spacers, albeit at a slower rate, and change the intended pattern dimensions. Thus, over the course of transferring a pattern to an underlying material, the etchant can wear away the spacers before the pattern transfer is complete. These difficulties are exacerbated by the trend towards decreasing feature sizes, which, for example, increasingly leads to the need to form isolated and periodic features (e.g., holes and pillars in memory cell arrays) of increasingly smaller dimensions and higher packing densities. Thus, pattern transfer limitations make the application of pitch multiplication principles to integrated circuit manufacturing even more difficult.

Reference will now be made to the figures, wherein like numerals refer to like parts throughout. It will be appreciated that the figures and features therein are not necessarily drawn to scale.

According to some embodiments of the present invention, an imprint reticle configured for use in imprint lithography is formed in a plurality of phases. In a first phase of methods in accordance with the preferred embodiments, depicted in FIGS. 2-10, a pattern of spacers is formed by pitch multiplication and used to create an underlying striped structure (see FIG. 10) for subsequent method steps. In a second phase, depicted in FIGS. 11-17, a second pattern of spacers is formed by pitch multiplication and used to create an overlying striped structure (see FIG. 17) that crosses the underlying striped structure of FIG. 10. In a third phase, depicted in FIGS. 18-21, the crossing striped structures in FIG. 17 are used to create a grid of material having small holes that can occur at regular intervals in two dimensions (see FIG. 19-20). In a fourth phase, depicted in FIGS. 22-24, a planar layer is deposited over the pattern of features created in the third phase, a support structure is bonded to the planar layer, and the substrate is etched away, leaving an imprint reticle comprising a pattern of densely-spaced pillars.

FIGS. 2-21 collectively define a process of forming closely spaced, isolated features (holes in the illustrated embodiment) using pitch multiplication on transverse sets of lines, as first disclosed in U.S. patent application Ser. No. 11/134,982 to Abatchev et al. ("Abatchev"), filed May 23, 2005, the disclosure of which is incorporated herein by reference. The Abatchev application also discloses other embodiments for producing isolated pillars. While not illustrated herein, the skilled artisan will appreciate that such other sequences can be employed to produce closely spaced, isolated pillars directly over an imprint reticle plate, thus not requiring the transfer process of FIGS. 22-24.

First Phase

In the first phase, a pattern of spacers is formed by pitch multiplication and used to create an underlying striped structure for subsequent method steps. In one embodiment, the first phase comprises an etch sequence according to the following steps: 1) deposition of multiple layers; 2) photolithographic patterning of a first layer; 3) shrinking of features; 4) extension of pattern into underlying layers; 5) removal of remaining portions of overlying layers; 6) blanket deposition of spacer material; 7) spacer etch; 8) removal of spacer mandrels; 9) extension of spacer pattern into underlying material; 10) blanket deposition of a filler material; 11) removal of spacers; and 12) planarization.

Figure 2:
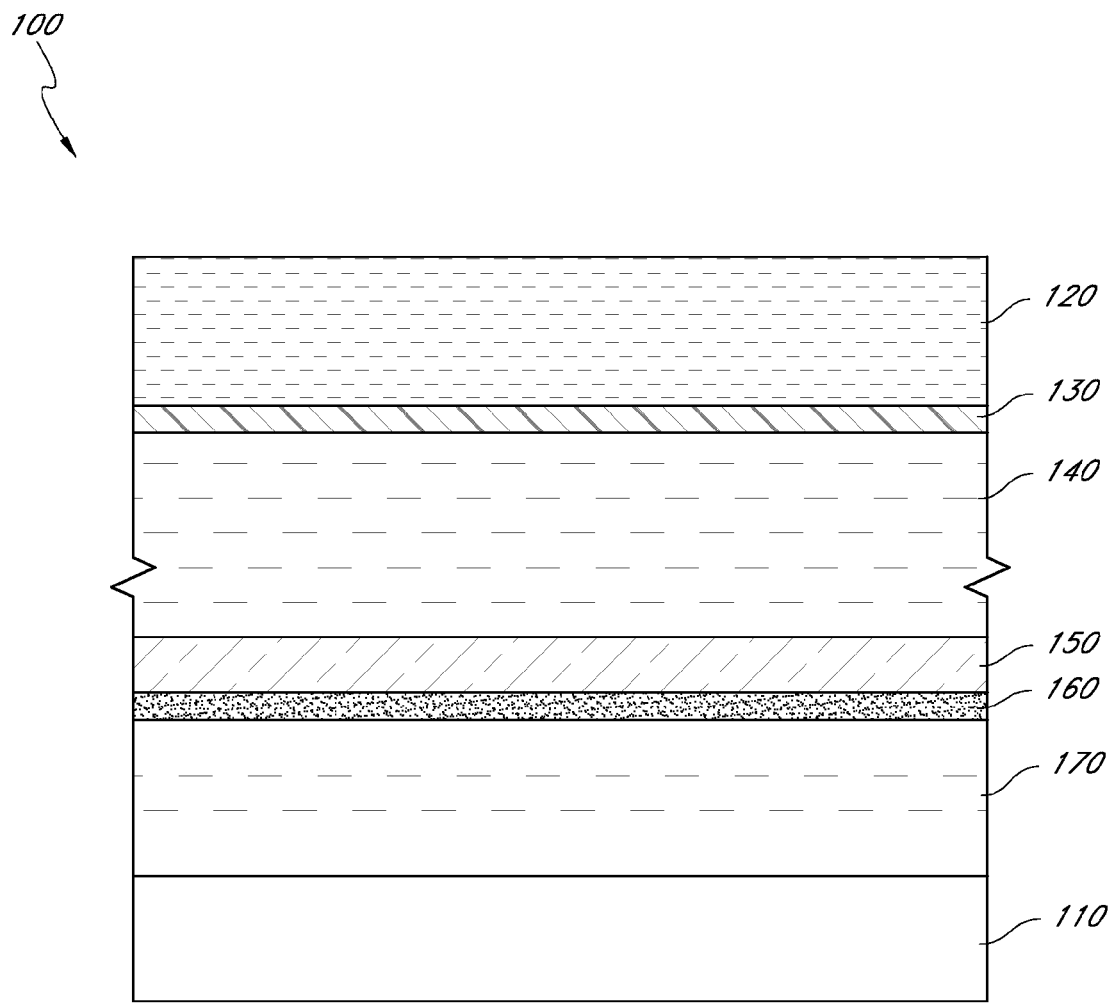

With reference to FIG. 2, a structure 100 comprises a selectively definable layer 120 that overlies a first hard mask, or etch stop, layer 130, which overlies a first temporary layer 140, which overlies a second temporary layer 150, which overlies a second hard mask, or etch stop, layer 160, which overlies a third temporary layer 170 to be etched through a mask, which overlies a sacrificial substrate 110. The substrate is preferably formed of a semiconductor material, more preferably a silicon wafer. In the illustrated embodiment, the third temporary layer 170 will serve as the ultimate mask through which etching of the sacrificial substrate 110 will be performed. In some embodiments, amorphous carbon is a preferred material for the third temporary layer because so many other materials—silicon, silicon oxide, silicon nitride, etc.—can be selectively etched without significantly harming the carbon layer.

Figure 3:
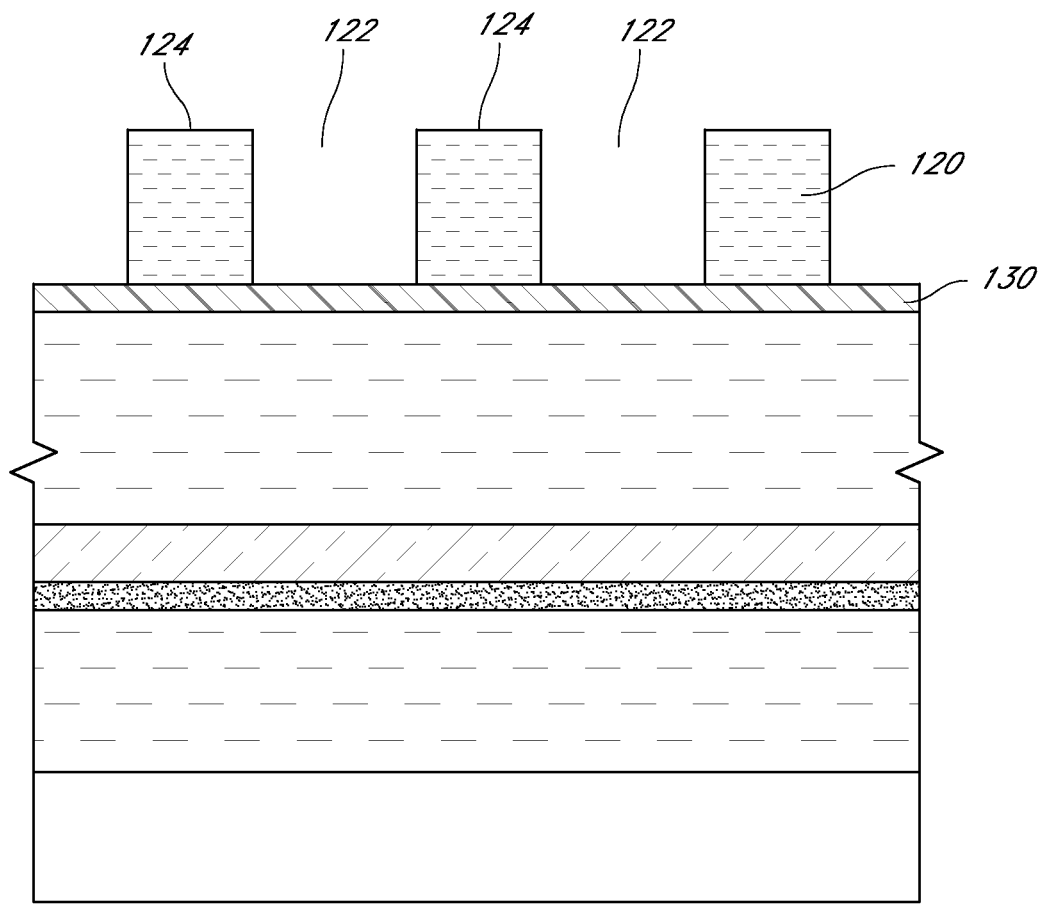

With reference to FIG. 3, a pattern comprising gaps or spaces 122 delimited by definable material features 124 is formed in a definable layer 120. The spaces 122 can be formed by, e.g., photolithography, in which the selectively definable layer 120 is exposed to radiation through a reticle and then developed. After being developed, the remaining definable material, photoresist in the illustrated embodiment, forms mask features such as the illustrated lines 124 (shown in cross-section).

The pitch of the lines 124 is equal to the sum of the width of a line 124 and the width of a neighboring space 122. For example, for photolithography utilizing 248 nm light, the pitch of the lines 124 can be about 200 nm or higher. The spacer pattern discussed below can advantageously have a pitch below the minimum pitch of the photolithographic technique.

As illustrated by FIG. 3, a preliminary step can comprise creating a series of photoresist lines 124. Thus, photolithography can be used to form a plurality of lines in a mask material. Conventional photolithography can form lines having a pitch no smaller than that definable by photons. However, subsequent pitch multiplication can form lines having a pitch that is smaller than that definable by conventional photolithography. In some embodiments, e-beam lithography is used to form lines having a pitch that is smaller than that achievable with photolithography alone, and subsequent pitch multiplication can further reduce the pitch of the lines.

Figure 4:
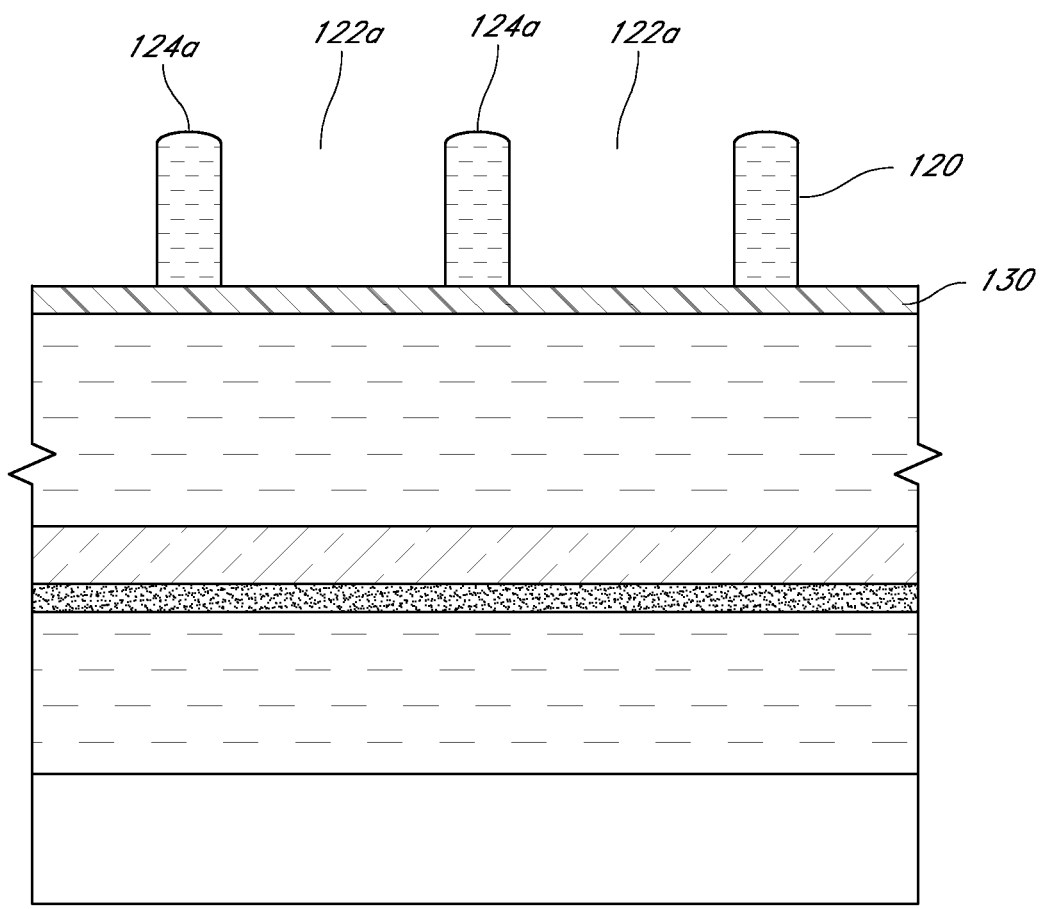
Figure 6:
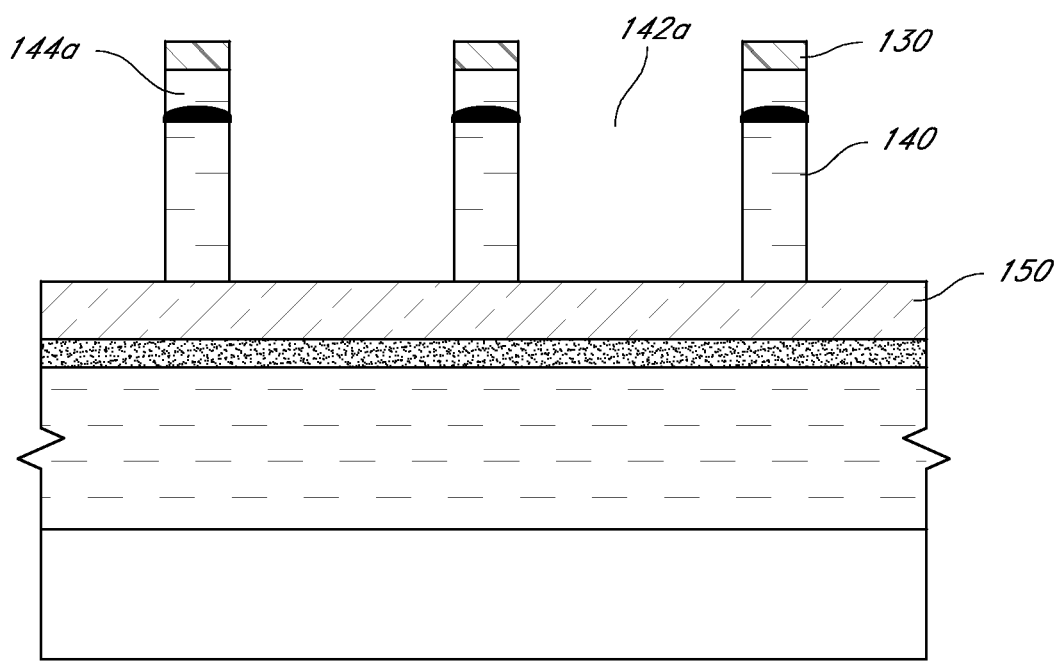

FIG. 4 shows the structure of FIG. 3 after the lines 124 have been shrunk by an isotropic etch to create modified lines 124a. The spaces 122 can optionally be widened or narrowed to a desired dimension. For example, as illustrated in FIG. 6, the spaces 122 have been widened by etching the photoresist lines 124, to form modified spaces 122a and modified lines 124a. The photoresist lines 124 are preferably reduced in size using an isotropic etch, such as a sulfur dioxide ($SO_2$) containing plasma, e.g., a plasma comprising $SO_2$, $O_2$, $N_2$ and Ar, or any other suitable plasma. Other plasmas that can be used, for example, are an $HBr/O_2$ plasma or a $Cl_2/O_2$ plasma. The isotropic etch degrades the exposed surfaces from all directions. Thus, the corners of lines 124a have been depicted as slightly rounded in FIG. 4. The extent of the etch is preferably selected so that the widths of the lines 124a are substantially equal to the desired spacing between the later-formed spacers 182, as will be appreciated from the discussion of FIGS. 7-8. Advantageously, this etch allows the lines 124a to be narrower than would otherwise be possible using the photolithographic technique used to pattern the photodefinable layer 120. That is, if the lines 124 are at or near the resolution limit of the photolithographic technique, this etch can reduce their size even further, taking them below that resolution limit. In addition, the etch can smooth the edges of the lines 124a, thus improving the uniformity of those lines.

In some embodiments, the spaces 122a between the lines 124a can be narrowed by expanding the lines 124 to a desired size. For example, additional material (not shown) can be deposited over the lines 124, or the lines 124 can be chemically reacted to form a material (not shown) having a larger volume to increase their size.

Figure 7:
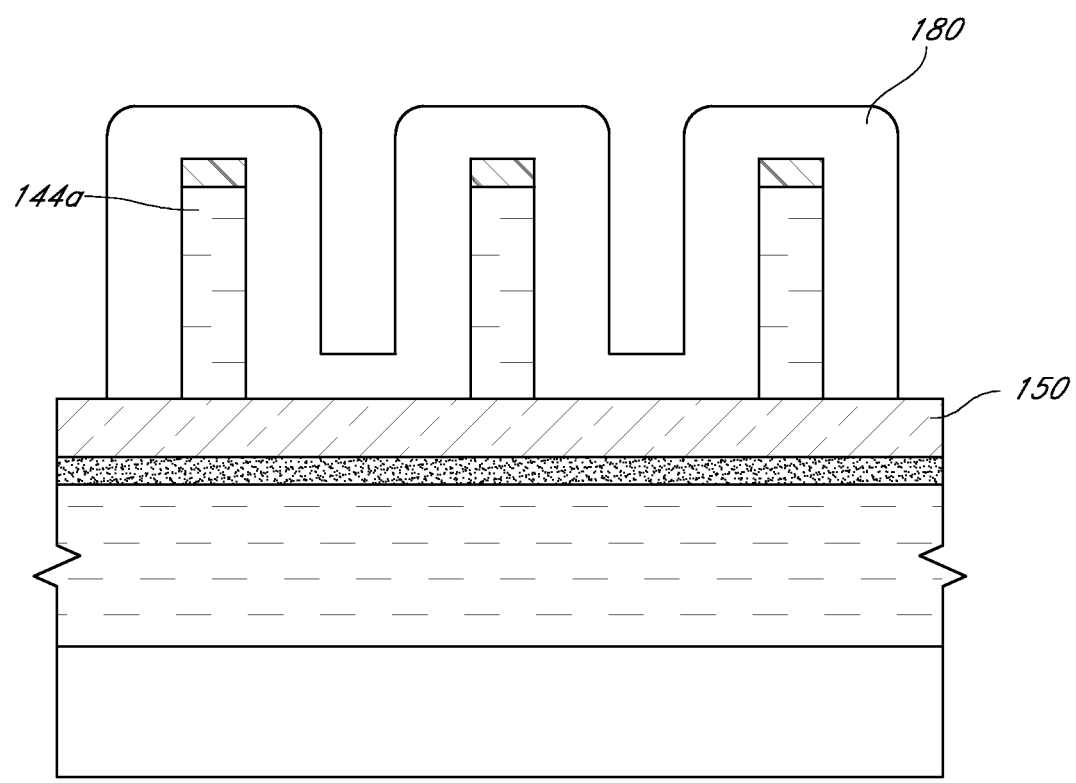

In the illustrated embodiment, the modified lines 124a define the dimensions of placeholders or mandrels along which a pattern of spacers 182 (FIG. 8) will be formed after transfer of the pattern to an underlying layer (FIGS. 5 and 6) and blanket deposition of a spacer material 180 (FIG. 7). In alternative embodiments, if the deposition and etch of spacer material is compatible with the definable layer 120, the temporary layer 140 can be omitted and the spacer material can be deposited directly on the photo-defined lines 124 or the thinner lines 124a.

In other alternative embodiments, the pattern of the lines 124 can be transferred to underlying layers without first being trimmed or having their widths reduced as described above. In such embodiments, a pattern corresponding to that of lines 124 can be formed in the temporary layer 140 and the features of that pattern can be reduced in width with a shrink step.

Figure 5:
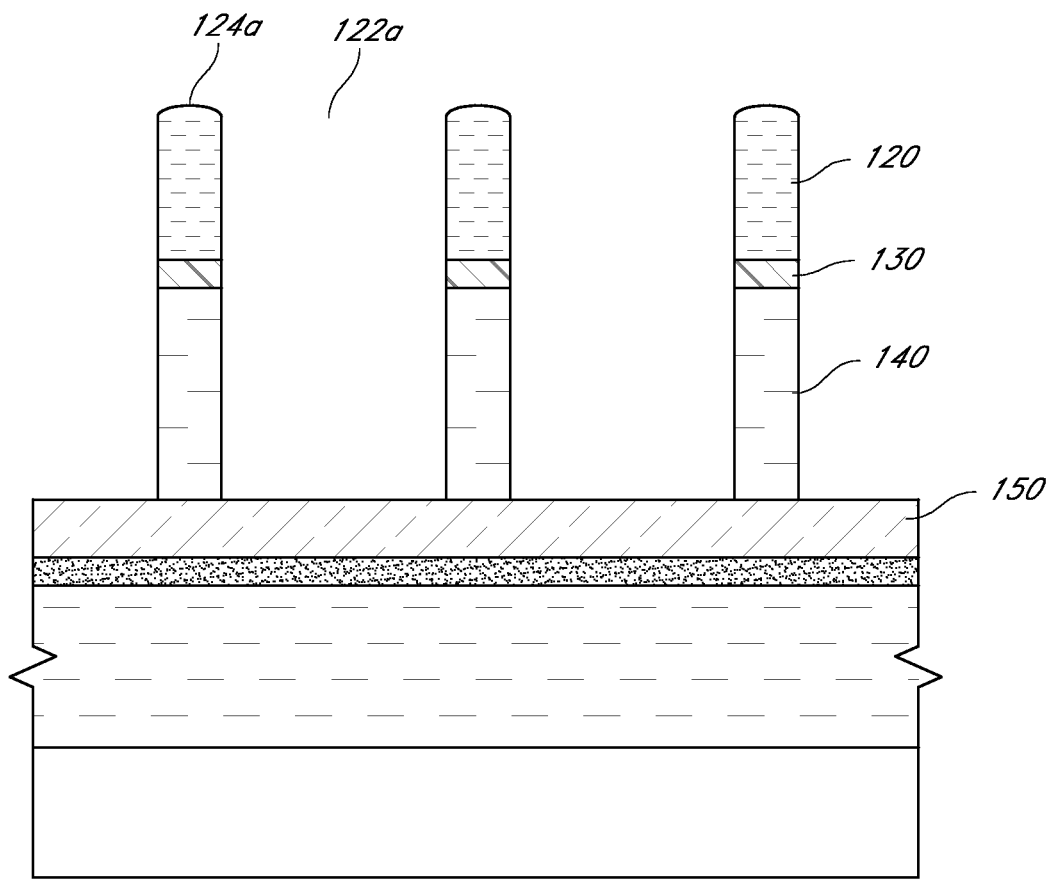

As shown in FIG. 5, after modification of line width (FIG. 4), the pattern in the photodefinable layer 120 is preferably transferred to the first temporary layer 140 to allow for later deposition of a layer 180 of spacer material (FIG. 7). The temporary layer 140 is preferably formed of a material that can withstand the process conditions for spacer material deposition and etch, discussed below. In particular, the material forming the temporary layer 140 preferably has a higher heat resistance than photoresist and is preferably selected such that it can be selectively removed relative to the material for the spacers 182 (FIG. 8) and the underlying layer 150. As noted above, the layer 140 is preferably formed of amorphous carbon.

As shown in FIG. 5, the pattern of lines 124a and spaces 122a in FIG. 4 can be extended into, or transferred to underlying layers. This pattern extension can be accomplished by selectively etching the materials that form layers 130 and 140, while lines 124a form a protective mask that prevents the etchant from removing the material located underneath lines 124a.

To transfer the pattern into the hard mask layer 130, an anisotropic etch can be used, such as an etch using a fluorocarbon plasma. A wet (isotropic) etch may also be suitable if the hard mask layer 130 is thin. Preferred fluorocarbon plasma etch chemistries include $CF_4$, $CFH_3$, $CF_2H_2$ and $CF_3H$ for etching the preferred DARC material.

To transfer the pattern into the first temporary layer 140, an $SO_2$-containing plasma, e.g., a plasma containing $SO_2$, $O_2$ and Ar, is preferably used. Advantageously, the $SO_2$-containing plasma can etch carbon of the preferred temporary layer 140 at a rate greater than 20 times and, more preferably, greater than 40 times the rate that the hard mask layer 130 is etched. A suitable $SO_2$-containing plasma is described in U.S. Patent Publication No. 2006/0046483 to Abatchev et al., published Mar. 2, 2006, entitled "Critical Dimension Control for Integrated Circuits," the entire disclosure of which is incorporated herein by reference and made part of this specification. Although FIG. 5 shows lines 124a intact after the pattern has been extended into the first temporary layer 140, the $SO_2$-containing plasma can simultaneously etch the temporary layer 140 and also remove the remaining portion of definable layer 120.

As shown in FIG. 6, once the line pattern originally formed in the layer 120 has been extended down into the layer 140, the remaining portions of the layer 120 can be stripped away using a selective etch. Alternatively, as noted above, the remaining portions of 120 can be etched away during an amorphous carbon etch step such as the step that extends the pattern down into the layer 140. Thus, the line pattern originally formed in the definable layer 120 has been transferred to the hard mask and temporary layers 130 and 140. The transferred pattern is approximately the same as the line pattern originally formed in layer 120; the transferred pattern has lines 144a and spaces 142a that generally correspond to lines 124a and spaces 122a, respectively. In the illustrated embodiment, portions of the hard mask layer 130 remain in place as protective caps on the lines 144a. These portions of the layer 130 can act as etch stops in subsequent steps.

In the illustrated embodiment, a pattern is formed in an overlying layer and later transferred to an underlying layer. In FIG. 5, the illustrated walls of the features formed in layers 130 and 140 are vertical, where these layers have been etched. In order to achieve vertical sidewalls in this step and in other steps described herein, directional or anisotropic etches can be used.

Variations in etching processes can alter the precision with which a pattern in an overlying layer corresponds to a pattern created in an underlying layer. Although pattern transfer from layer to layer is generally illustrated schematically to be a precise process, with vertical walls, such precision may be difficult to achieve in practice. Thus, pattern transfer is intended to encompass general correspondence between underlying and overlying patterns. Similarly, pattern transfer is meant to encompass modification of the features originally defining the pattern—for example by enlarging or shrinking those features—where such modification does not change the pitch.

As shown in FIG. 7, a layer 180 of spacer material is preferably blanket deposited so that it conforms to the exposed surfaces, including the second temporary layer 150 and the lines 144a. As shown, portions of the hard mask layer 130 can be left in place—to subsequently act as CMP etch stops—on top of lines 144a when the layer 180 of spacer material is deposited. Alternatively, the hard mask portions can be removed with a selective etch before spacer deposition. The spacer material can be any material that can act as a mask for transferring a pattern to underlying layers, or that otherwise can allow processing of underlying structures through the mask being formed. The spacer material preferably: 1) can be deposited with good step coverage; 2) can be deposited at a temperature compatible with the temporary layer 140 and underlying layers; and 3) can be selectively etched relative to the temporary layer 140 and any layer directly underlying the temporary layer 140. Preferred materials include silicon oxides and nitrides. The spacer material is preferably deposited by chemical vapor deposition (CVD) or atomic layer deposition (ALD). The layer 180 is preferably deposited to a thickness of between about 20-60 nm and, more preferably, about 20-50 nm. Preferably, the step coverage is about 80% or greater and, more preferably, about 90% or greater.

Figure 8:
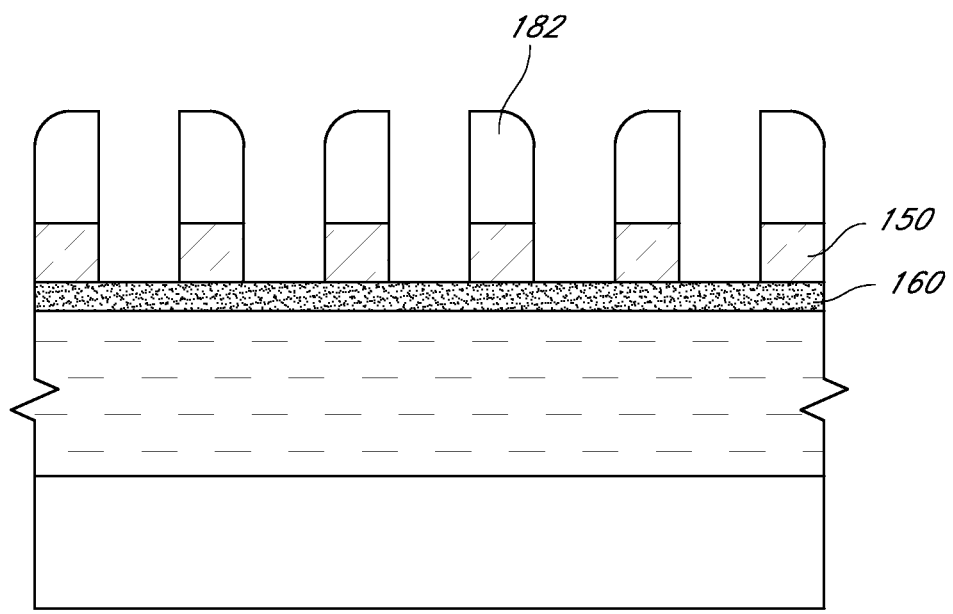

FIG. 8 shows the structure of FIG. 7 after a spacer etch and subsequent etch, leaving a pattern of free-standing spacers that has been extended into an underlying layer. The spacer etch can comprise an anisotropic etch to remove spacer material from horizontal surfaces. The spacer etch can be performed using a fluorocarbon plasma. The spacer etch can also be performed using HBr/Cl plasma for a silicon spacer material. (Note that preferred embodiments use silicon oxide spacers, however). After a spacer etch is performed, it can leave behind a pattern of elongate spacers having effectively reduced pitch relative to the lines.

After the spacer etch, the remaining portions of hard mask layer 130 (if still present) and the temporary layer 140 are next removed to leave freestanding spacers 182. The remaining portions (in the form of lines 144a) of the first temporary layer 140 are selectively removed, preferably using a sulfur-containing plasma etch, such as, e.g., an $SO_2$-containing plasma etch. In this way, features of one pattern are removed to leave behind another pattern formed by the spacers.

Thus, in some embodiments, pitch-reduction has been performed using a spacer material to create masking features. The masking features formed in this way can have a smaller pitch than the photoresist lines and can comprise pitch-reduced masking lines separated by pitch-reduced spaces; pitch multiplication has been accomplished. In the illustrated embodiment, the pitch of the pattern formed by spacers 182 is roughly half that of the pattern formed by photoresist lines 124a and spaces 122a (FIGS. 3-5), where the pitch was originally determined by photolithography. Preferably, a spacer pattern having a pitch of about 100 nm can be formed.

With further reference to FIG. 8, the pattern formed by the spacers 182 can be extended into the underlying second temporary layer 150. The extension can be accomplished with a selective etch chemistry. For example, if the spacers 182 are formed from silicon dioxide and the underlying layer 150 is formed from amorphous silicon, an etch can remove the latter while leaving the former largely intact. A preferred etch includes a physical component and preferably can also include a chemical component and can be, e.g., a reactive ion etch (RIE), such as an $HBr/Cl_2$ etch. Such an etch can be performed, for example, using a LAM TCP9400 (available commercially from LAM Research Corporation of Fremont, Calif.) flowing about 0-50 sccm $Cl_2$ and about 0-200 sccm HBr at about 7-60 mTorr pressure with about 300-1000 W top power and about 50-250 W bottom power.

Figure 9:
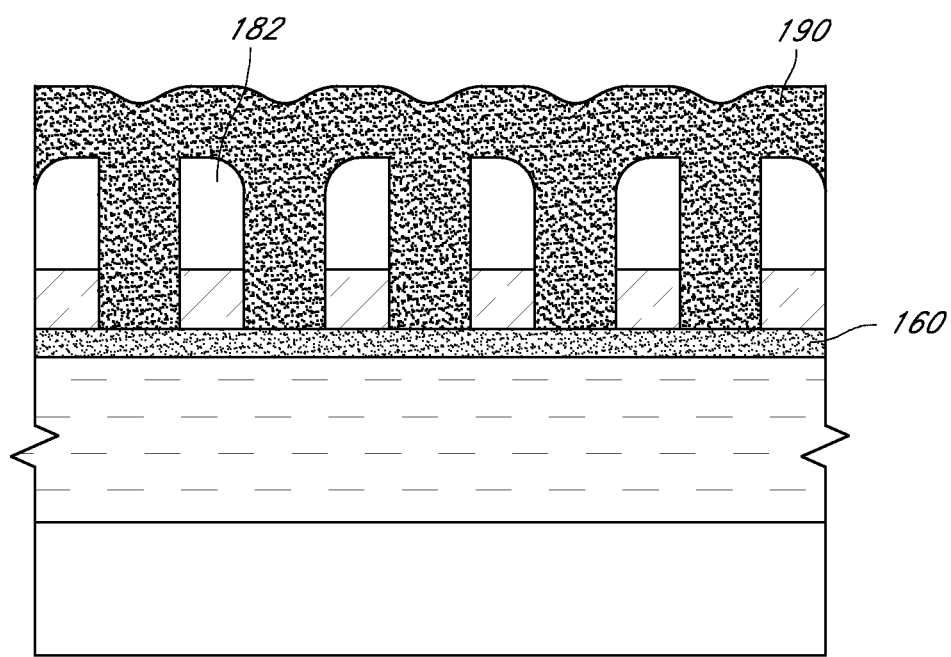

FIG. 9 shows the structure of FIG. 8 after blanket deposition of a filler material 190. The filler material 190 is advantageously formed from silicon dioxide ($SiO_2$). In some preferred embodiments, the spacers 182 and the filler material 190 are formed from the same or similar materials, as will be better understood from the discussion of FIGS. 17-20, 22-23, and 26-27 below. Thus, the spacers 182 and the filler material 190 can both be formed from silicon dioxide. One preferred process for depositing the filler material 190 (i.e., silicon dioxide) is Applied Materials' Producer® HARP™ system. (HARP stands for "High Aspect Ratio Process.")

In an alternative embodiment, the spacers 182 can be removed before the filler material 190 is deposited. A wet etch can be used to remove the spacers if the hard mask layer 160 is formed from a DARC material. Removal of the spacers 182 can allow good coverage by the filler material 190.

FIGS. 10-20 each illustrate at least four corresponding views, lettered A-D as follows: 10A-10D, 11A-11D, etc. The views designated with an "A" consistently show a top or plan view, where hatching has been included for convenience. The views B-C consistently show cross sections of the same structure depicted in the corresponding figure A. Furthermore, those views designated with a "B" consistently show the structure in the same orientation as other views designated with a "B." The orientations are also similar for "C" designations, and likewise for "D" designations.

FIGS. 10A-10D show the structure of FIG. 9 after removal of the spacers 182 and a portion of the filler material 190, through, for example, a chemical mechanical polishing (CMP) process. A dry etch or a plasma etch can also be used for planarization. If a CMP process is used, a thin etch stop layer is preferably added between the hard mask layer 160 and the temporary layer 150. The etch stop layer can be formed from $Si_3N_4$, for example.

Figure 10A:
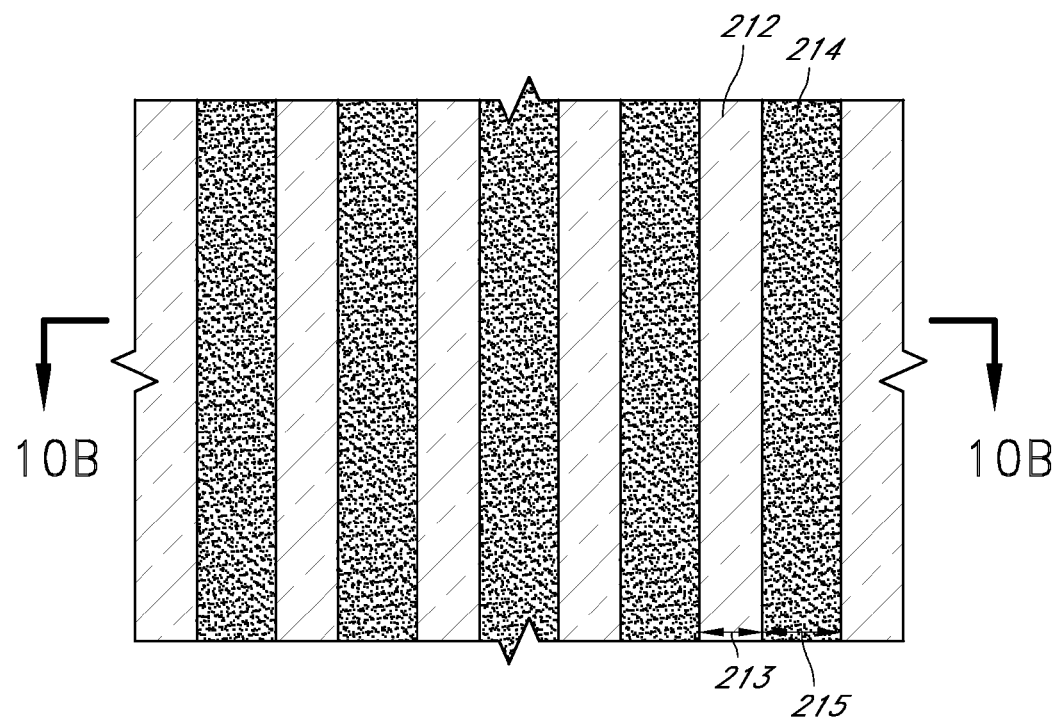
FIGS. 10A-10D show the structure of FIG. 9 after a CMP process or dry etch has removed the spacers and excess filler material.

FIG. 10A shows a schematic plan view of the surface after the planarization. The surface exhibits a striped pattern with alternating stripes of the filler material 212, which is amorphous silicon, for example, and the stripes 214, which can be silicon dioxide, for example. The stripes 212 of amorphous silicon have been formed in the second temporary layer 150 and the stripes 214 of silicon dioxide are the remaining portions of the filler material 190 that fill the spaces between the stripes 212. For convenience, the surface in FIG. 10A is depicted with cross-hatching to show the material that comprises the striped structures. The stripes 212 preferably have widths 213 in a range of approximately 30-70 nm. The stripes 214 preferably have widths 215 in a range of approximately 30-70 nm. More preferably, the stripes 212 and 214 each have widths 213 and 215, respectively, of approximately 50 nm. In the latter case, the pattern formed by the stripes has a pitch of approximately 100 nm.

Figure 10B:
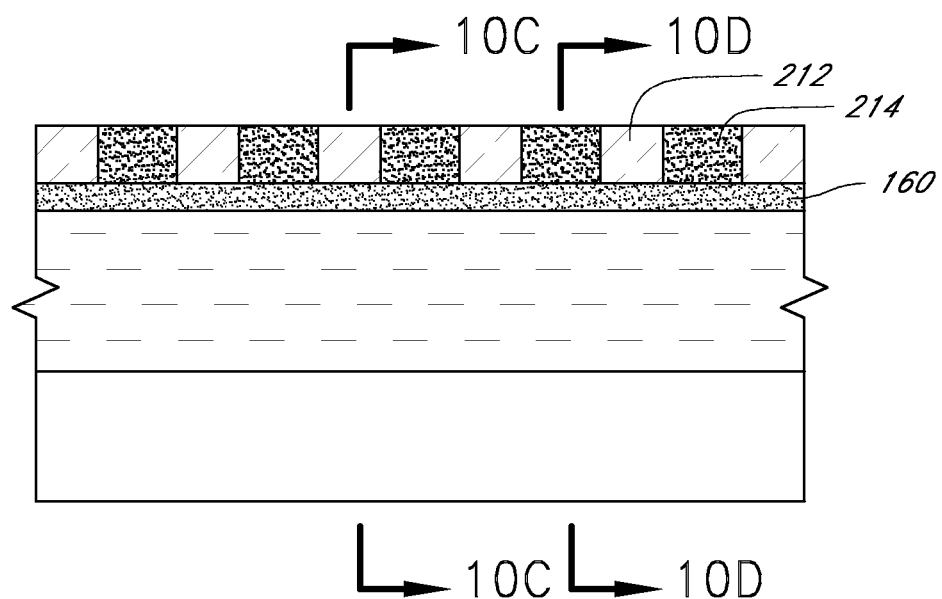

FIG. 10B shows a schematic cross-sectional side view taken along lines 10B-10B of FIG. 10A. This view reveals that the two sets of stripes are formed on the same "level." For convenience in this application, the term "level" is used to designate a portion of the structure 100 that is generally located in a thick plane that is parallel to and equidistant from the plane of the surface of the sacrificial substrate 110. Thus, the layer 160 is located at a different level from that of layer 170, but the stripes 212 and the stripes 214 are located at the same level. In contrast, the term "layer" is generally used to refer to a portion of the structure 100 formed from the same material and deposited together.

Figure 10C:
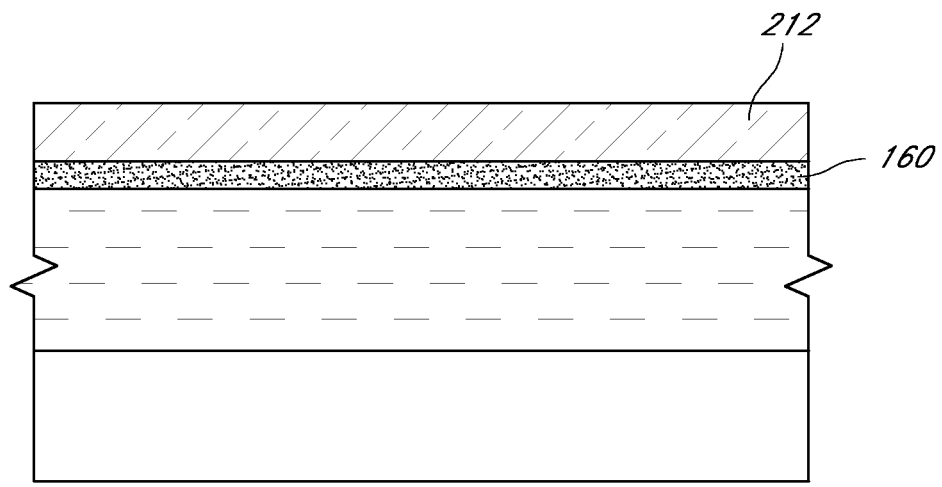
Figure 10D:
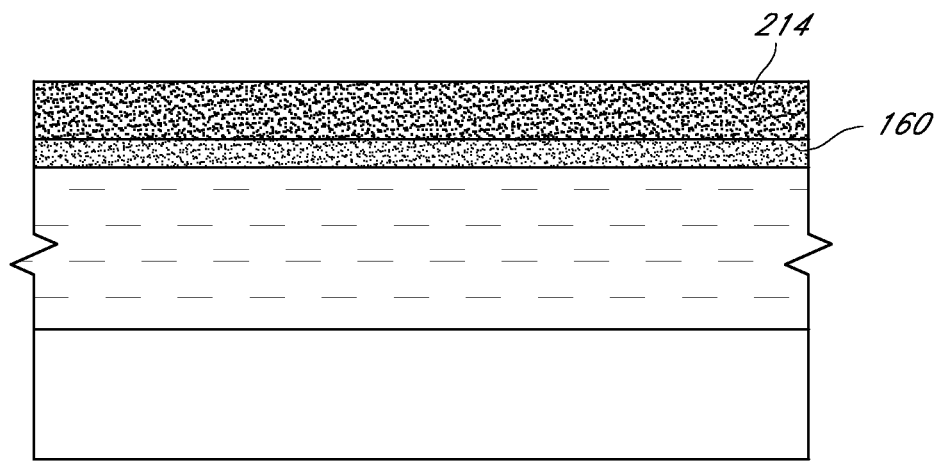

FIG. 10C shows a schematic, cross-sectional side view taken along lines 10C-10C of FIG. 10B. FIG. 10D shows a schematic, cross-sectional side view taken along lines 10D-10D of FIG. 10B.

In the first phase of methods described and illustrated above with reference to FIGS. 2-10, a pattern of spacers has been formed by pitch multiplication and used to create an underlying striped structure or "first pattern" derived from and pitch multiplied relative to the pattern of the first resist mask.

Second Phase

In the second phase, a second pattern of spacers is formed by pitch multiplication and used to create an overlying striped structure that crosses the underlying striped structure of FIG. 10. In one embodiment, the second phase comprises an etch sequence according to the following steps: 1) deposition of multiple layers; 2) photolithographic patterning of an overlying layer; 3) shrinking of features; 4) extension of pattern into underlying layers; 5) removal of remaining portions of overlying layers; 6) blanket deposition of spacer material; 7) spacer etch; 8) removal of spacer mandrels.

FIGS. 11A-11D show the structure of FIG. 10 after deposition of multiple new masking layers, 320-340. The pattern having the stripes 212 and the stripes 214 now underlies multiple new layers of material. As with the layers 120-170, layers 320-340 can also be etched to form masks for patterning the substrate 110.

Figure 11A:
FIGS. 11A-11D show the structure of FIGS. 10A-10D after deposition of multiple new masking layers.
Figure 11B:
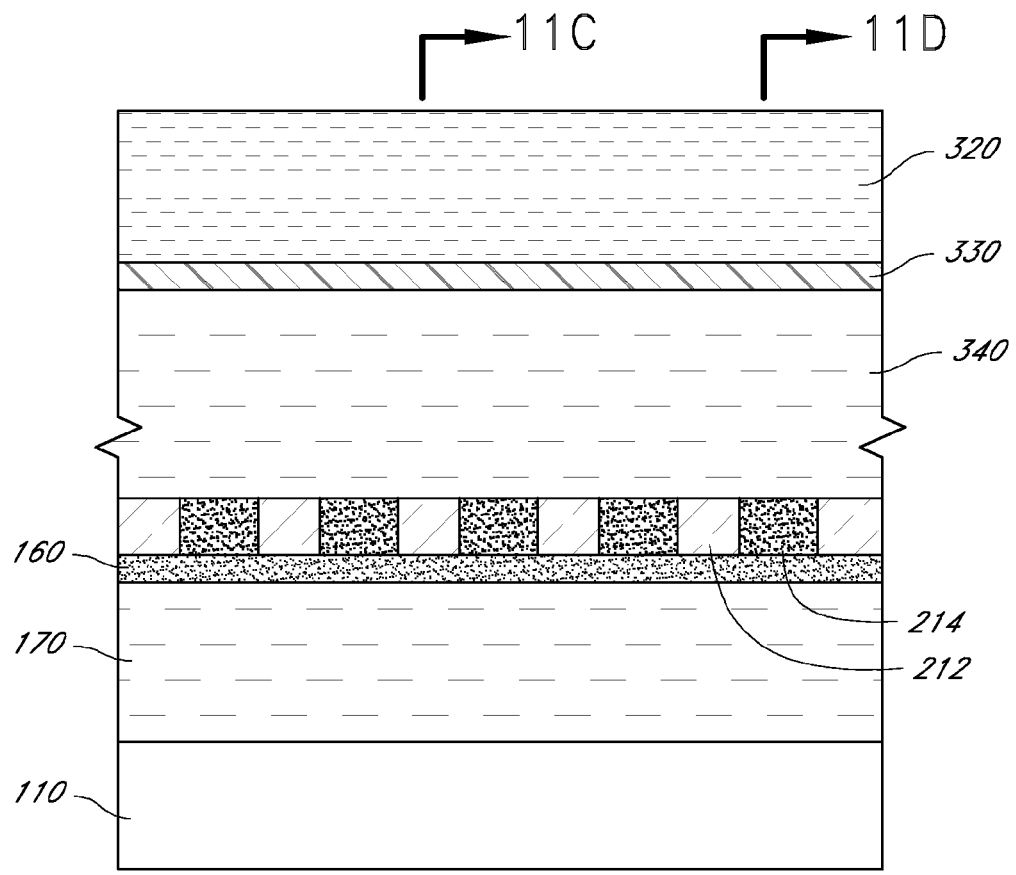
Figure 11C:
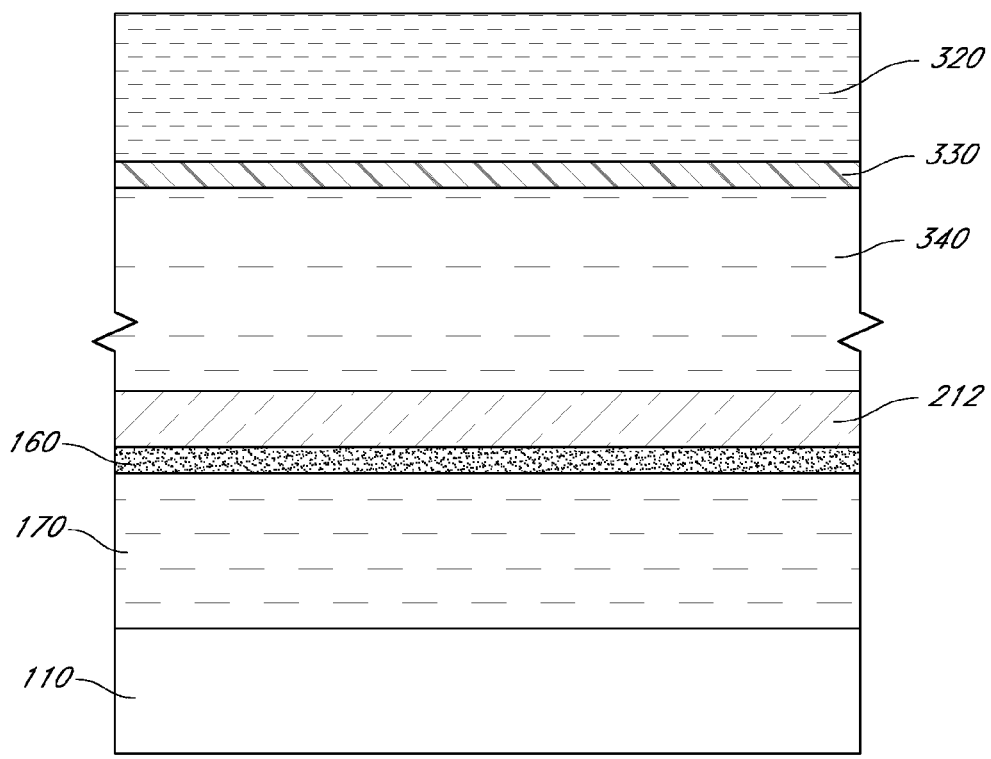
Figure 11D:
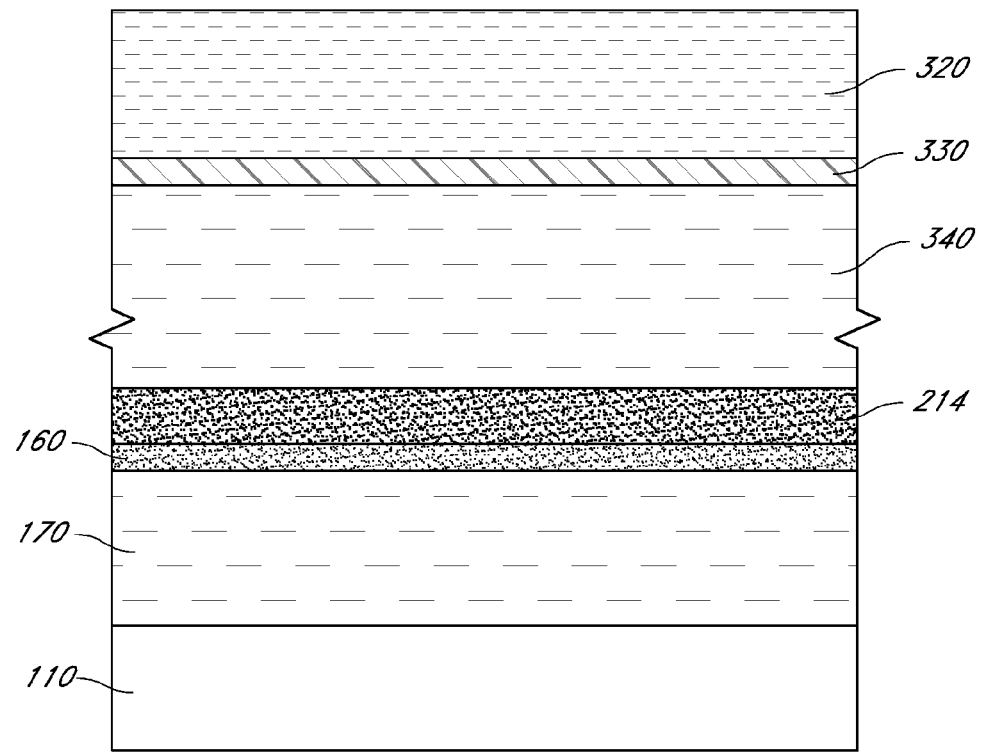

FIG. 11A shows a schematic plan view of the surface. FIG. 11B shows a schematic cross-sectional side view taken along lines 11B-11B of FIG. 11A. FIG. 11C shows a schematic, cross-sectional side view taken along lines 11C-11C of FIG. 11B. FIG. 11D shows a schematic, cross-sectional side view taken along lines 11D-11D of FIG. 11B.

With reference to FIGS. 11A-11D, masking layer 320 is preferably photodefinable and has similar properties to those described above with respect to layer 120.

With reference to FIGS. 11B-11D, layer 330 is a hard mask layer and preferably has similar properties to those described above with respect to layer 130.

With reference to FIGS. 11B-11D, the fourth temporary layer 340 preferably has similar properties to those described above with respect to the layer 140.

As with the materials for the layers 120-170, the materials for layers 320-340 overlying the sacrificial substrate 110 are preferably chosen based upon consideration of the chemistry and process conditions for the various pattern forming and pattern transferring steps discussed herein. Such layers are also preferably chosen so that they can be selectively etched relative to other exposed materials.

In the illustrated embodiment of FIGS. 11A-11D, the second selectively definable layer 320 overlies a third hard mask, or etch stop, layer 330, which overlies a fourth temporary layer 340, which overlies the level having the stripes 212 and 214. Underlying levels 160 and 170, as well as the sacrificial substrate 110, remain intact. As described above with respect to the layers depicted in FIG. 2, one or more of the layers 320-340 can be omitted in some embodiments.

With reference to FIGS. 11A-11D, the second selectively definable layer 320 is preferably formed of a photoresist, including any photoresist known in the art. All the preferred properties and alternatives described above with reference to the layer 120 also apply to the layer 320.

The third hard mask layer 330 preferably comprises an inorganic material, and in the illustrated embodiment, the layer 330 is a DARC. All the preferred properties and alternatives described above with reference to the layer 130 also apply to the layer 330.

The fourth temporary layer 340 is preferably formed of amorphous carbon. All the preferred properties and alternatives described above with reference to the layer 140 also apply to the layer 340. The layer 340 is formed from amorphous carbon in some embodiments. Because it is sometimes difficult to achieve good step coverage of amorphous carbon deposition, the underlying striped surface has been planarized (see FIG. 10).

As with the layers 120-170, the thicknesses of the layers 320-340 are preferably chosen depending upon compatibility with the etch chemistries and process conditions described herein. Thus, as described above, thicknesses are selected to allow for appropriate pattern transfer, and the hard mask layer 330 is advantageously thin so that its transfer or removal can occur quickly, exposing surrounding materials to less wear.

In the illustrated embodiment, the second selectively definable layer 320 is a photodefinable layer preferably between about 100-250 nm thick and, more preferably, between about 130-200 nm thick. The third hard mask layer 330 is preferably between about 10-30 nm thick and, more preferably, between about 15-25 nm thick. The fourth temporary layer 340 is preferably between about 130-200 nm thick and, more preferably, between about 140-160 nm thick.

Furthermore, the layers 320, 330, and 340 can be formed by various methods known to those of skill in the art. For example, the methods described above for forming layers 120, 130, and 140 can be used to form layers 320, 330, and 340, respectively.

FIGS. 12A-12D illustrate a pattern formed in the layer 320, having lines 324 interspersed with spaces 322. The preferred properties of and methods for forming the lines 124 described above in FIG. 3 et seq. also apply to lines 324, however, the lines 324 are not parallel to the lines 124. This can be seen— even though the lines 124 have been removed—by observing that the stripes 212 and the stripes 214 are not parallel to the lines 324. Thus, because the stripes 212 and 214 are elongate in the same elongate dimension of the lines 124, the lines 124 and the lines 324 are not parallel.

Because the lines 324 are not parallel to the stripes 212 and 214, the illustrated method can be said to call for applying a crossing pattern of photoresist over an underlying pattern. Thus, one pattern "crosses" a second pattern when an elongate dimension of the first pattern is not aligned with or parallel to an elongate dimension of the second pattern. The elongate dimension of the lines 124 is aligned with the elongate dimension of the stripes 212 and 214, but the elongate dimension of the stripes 212 and 214 crosses the elongate dimension of the lines 324. Thus, the lines 124 can be described as aligned with the stripes 212 and 214, and the stripes 212 and 214 can be described as crossing the lines 324. In the illustrated embodiments, the lines 324 not only cross, they cross perpendicularly the stripes 212 and 214. However, the term "cross" is intended to include other non-parallel angles, not just a 90 degree angle. Thus, though the exemplary pillars and/or holes formed by the illustrated methods have a generally rectangular footprint (see, e.g., FIGS. 20F, 25A, and 28A), other footprints such as skewed quadrangle or diamond-shaped footprints are also contemplated.

Figure 12A:
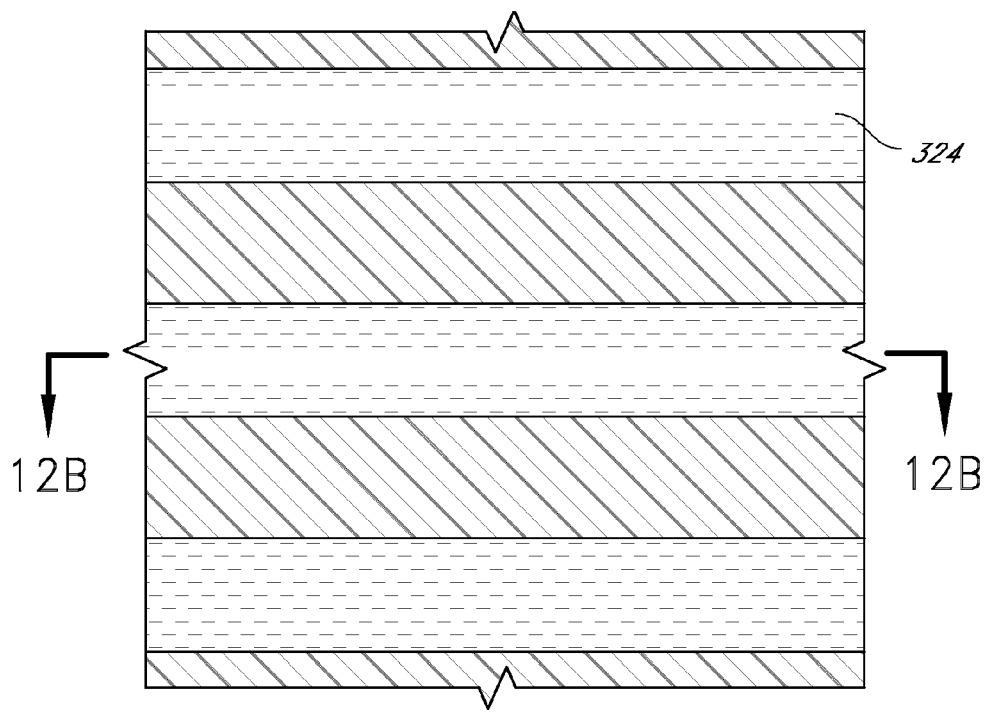
FIGS. 12A-12D show the structure of FIGS. 11A-11D after photolithographic patterning of a second resist layer.
Figure 12B:
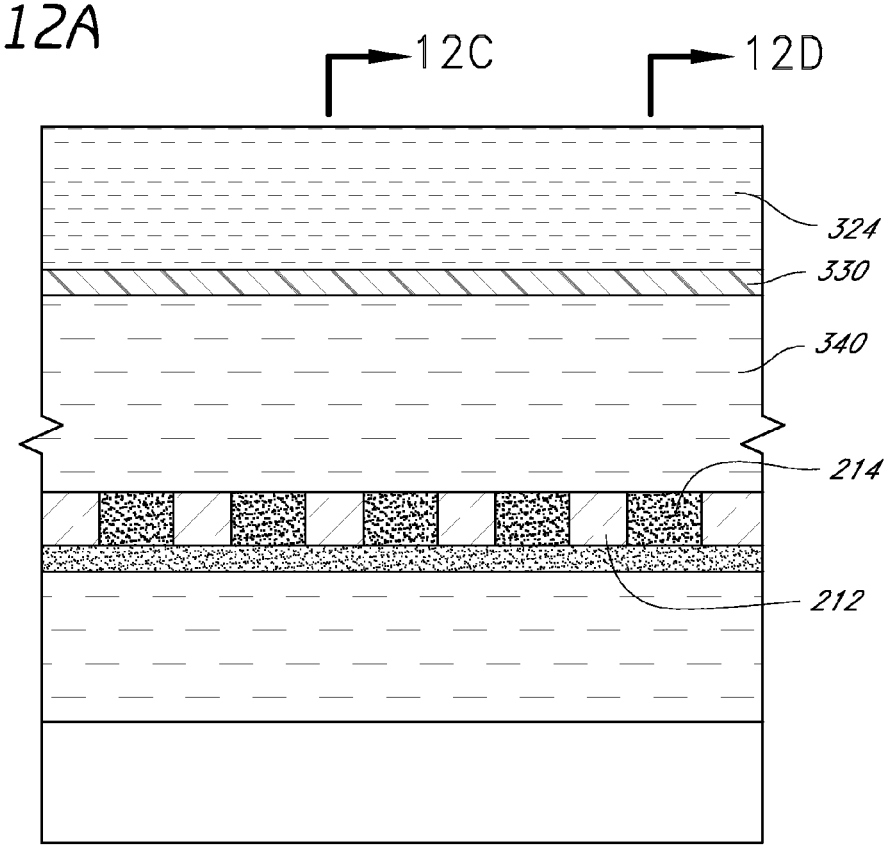
Figure 12C:
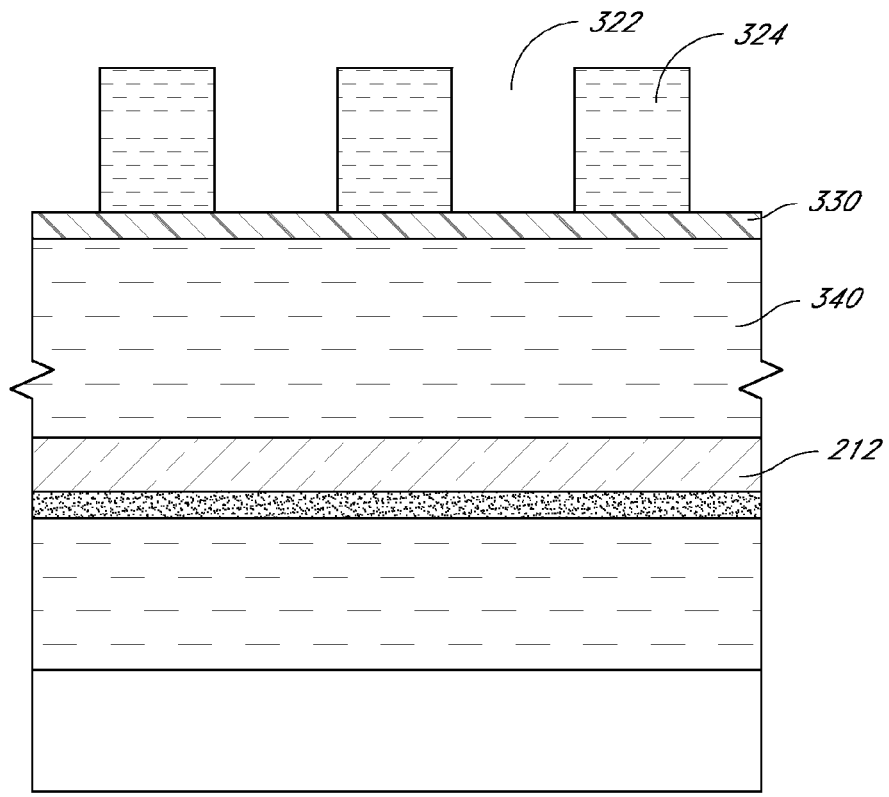
Figure 12D:
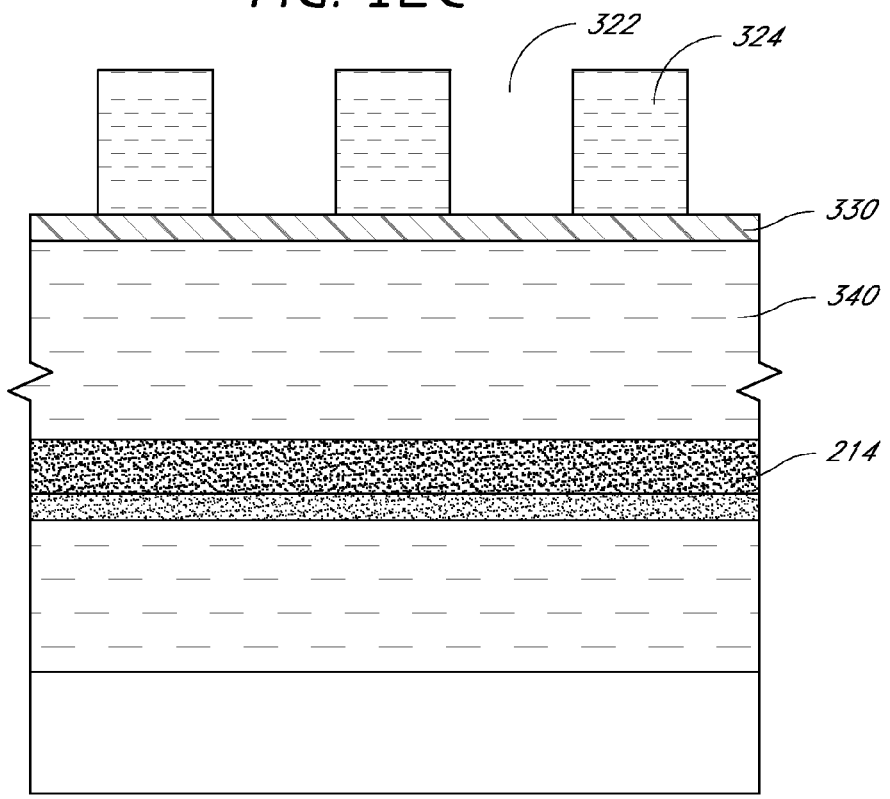

With reference to FIGS. 12A-12D, a pattern comprising spaces 322 delimited by definable material features 324 is formed in the second definable layer 320 in a similar way to what was described above with respect to lines 124 and depicted in FIG. 3. Thus, FIGS. 12A-12D show the structure of FIG. 11 after photolithographic patterning of an overlying resist layer. FIG. 12A shows a schematic plan view of the surface. FIG. 12B shows a schematic cross-sectional side view taken along lines 12B-12B of FIG. 12A. FIG. 12C shows a schematic, cross-sectional side view taken along lines 12C-12C of FIG. 12B. FIG. 12D shows a schematic, cross-sectional side view taken along the lines 12D-12D of FIG. 12B.

As with the pattern depicted in FIG. 3, the pattern created by the series of photoresist lines 324 has been formed through conventional photolithography. As with the earlier described pattern, the shrink step can be accomplished to make the lines 324 thinner and spacer formation can be accomplished using the modified lines 324a as mandrels, or the pattern can be transferred to an underlying layer before the shrink step is accomplished. In the illustrated embodiment described below, however, the shrink step is performed on photoresist lines 324, the pattern is then transferred to an underlying layer, and portions of the underlying layer form spacer mandrels.

Figure 13A:
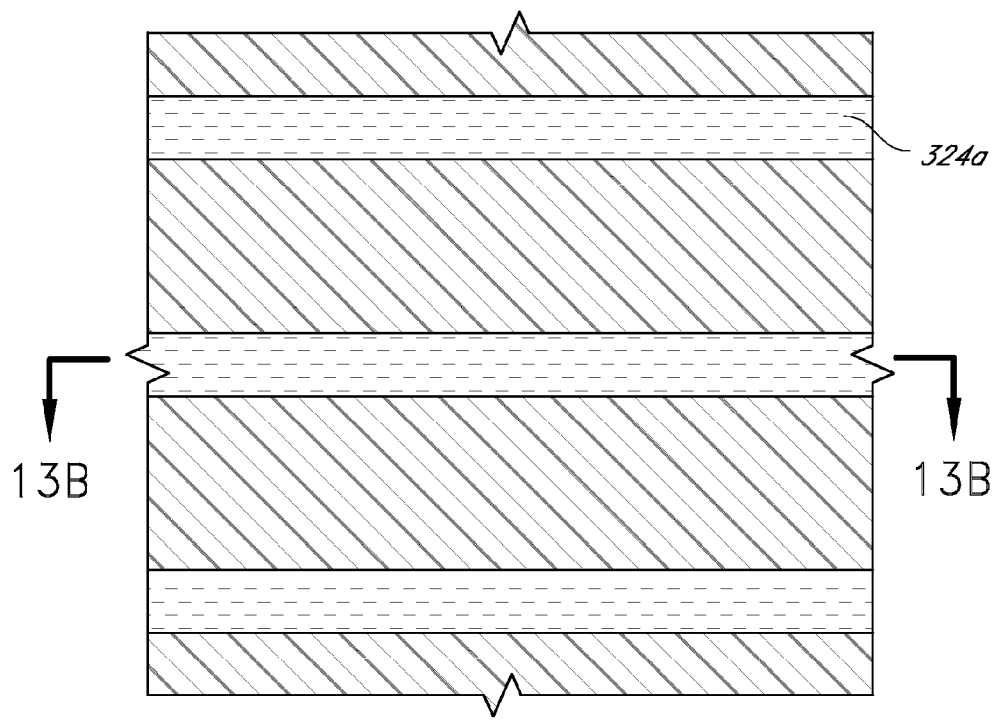
FIGS. 13A-13D show the structure of FIG. 12 after an etch has reduced the size of the features in the pattern of FIGS. 12A-12D.
Figure 13B:
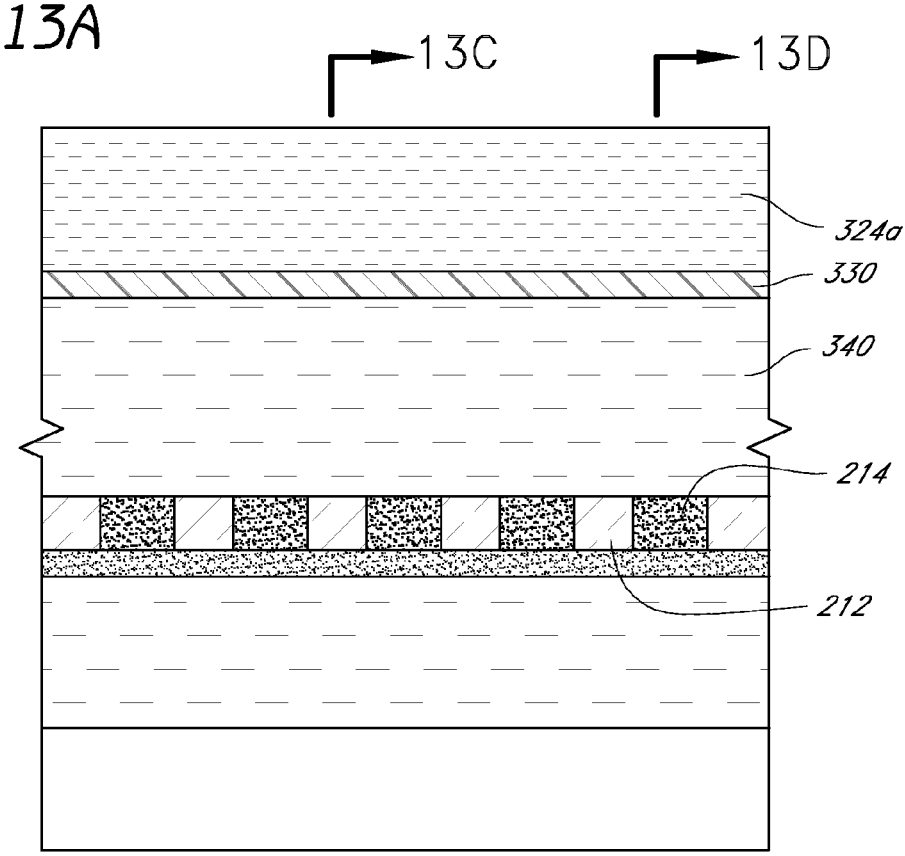
Figure 13C:
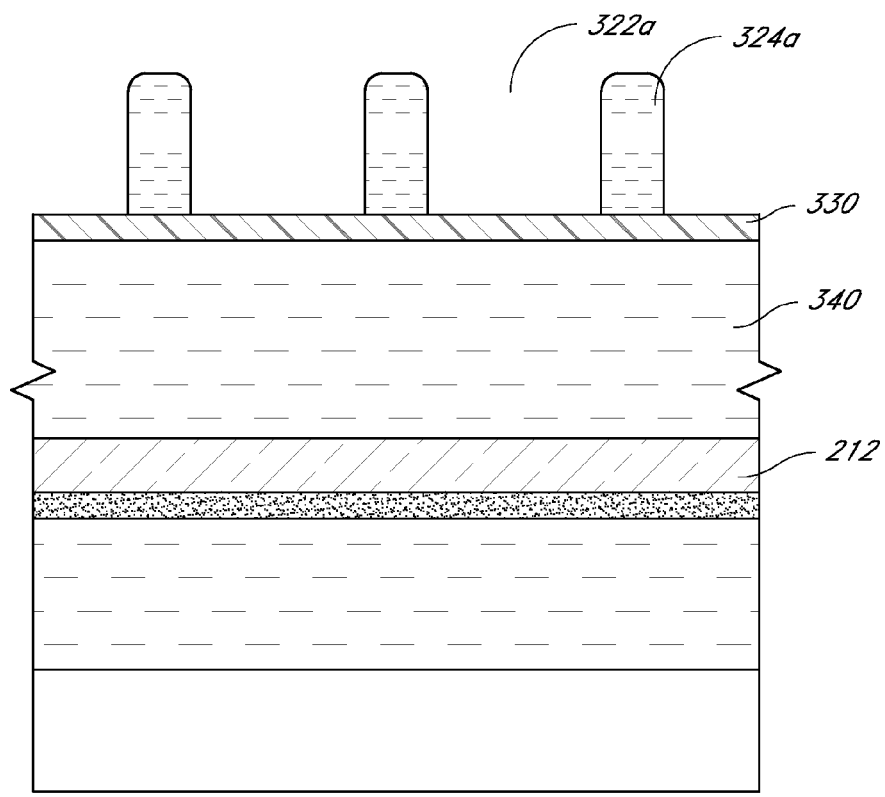
Figure 13D:
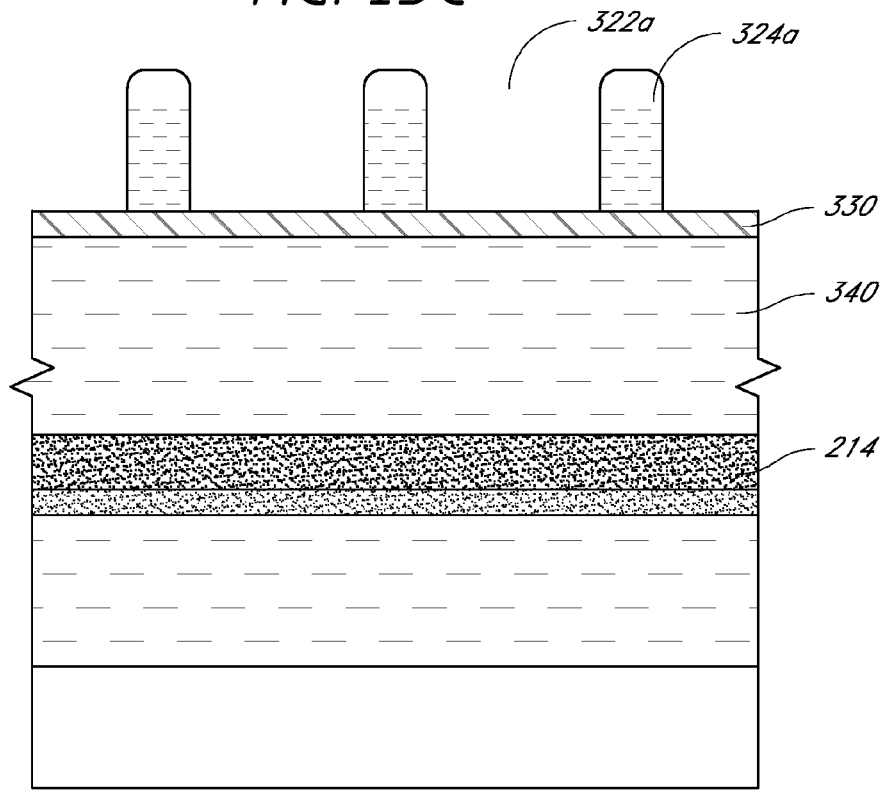

FIGS. 13A-13D show the structure of FIG. 12 after the lines 324 have been shrunk, by an isotropic etch, for example, to create modified lines 324a. The shrink step also widens the spaces 322 to form modified spaces 322a. FIG. 13A shows a schematic plan view of the surface. FIG. 13B shows a schematic cross-sectional side view taken along lines 13B-13B of FIG. 13A. FIG. 13C shows a schematic, cross-sectional side view taken along lines 13C-13C of FIG. 13B. FIG. 13D shows a schematic, cross-sectional side view taken along lines 13D-13D of FIG. 13B.

The structure of FIGS. 13A-13D preferably shares many characteristics of the features described in conjunction with FIG. 4. Similar methods to achieve that structure can also be used; preferred etch materials and methods, and desirable configurations are described above. For example, the photoresist lines 324 are preferably reduced in size using an isotropic etch, such as a sulfur oxide plasma, e.g., a plasma comprising $SO_2$, $O_2$, $N_2$ and Ar, or any other suitable plasma. Two other plasmas that can be used, for example, are an $HBr/O_2$ plasma or a $Cl_2/O_2$ plasma.

As with the lines 124a, the modified lines 324a define the dimensions of the placeholders or mandrels along which a pattern of spacers will be formed. The alternatives described above also apply here. For example, in alternative embodiments, the pattern of the lines 324 can be transferred to underlying layers without first being trimmed or having their width's reduced as described above. In such embodiments, a pattern corresponding to that of lines 324 can be formed in the temporary layer 340 and the features of that pattern can be reduced in width with a shrink step. In other alternative embodiments, if the deposition and etching of spacer material is compatible with the definable layer 320, the temporary layer 340 can be omitted and the spacer material can be deposited directly on the photo-defined lines 324 or the thinner lines 324a.

In the illustrated embodiment, lines 324a create a mask for placeholders or mandrels that will later be formed in the underlying layer 340, along which a pattern of spacers 382 (FIG. 17) will be formed after blanket deposition of a spacer material 380 (FIG. 16).

Figure 14A:
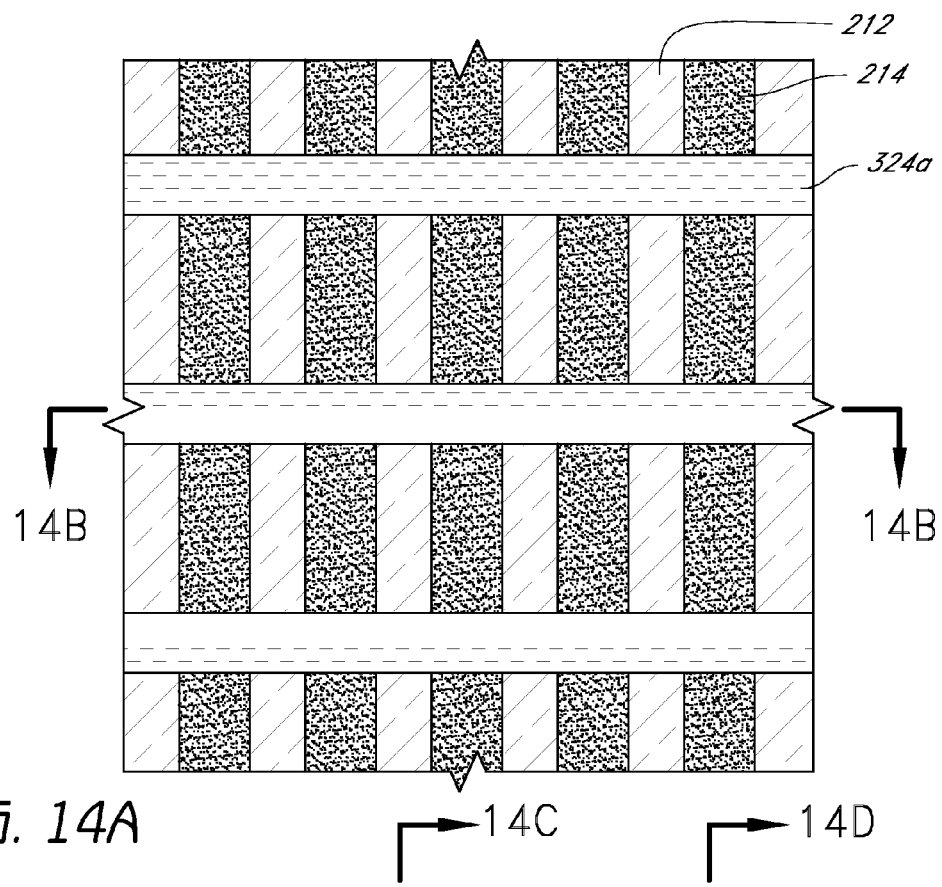
FIGS. 14A-14D show the structure of FIGS. 13A-13D after the pattern of the features of FIGS. 13A-13D has been extended into underlying layers to partially expose the crossing underlying pattern.
Figure 14B:
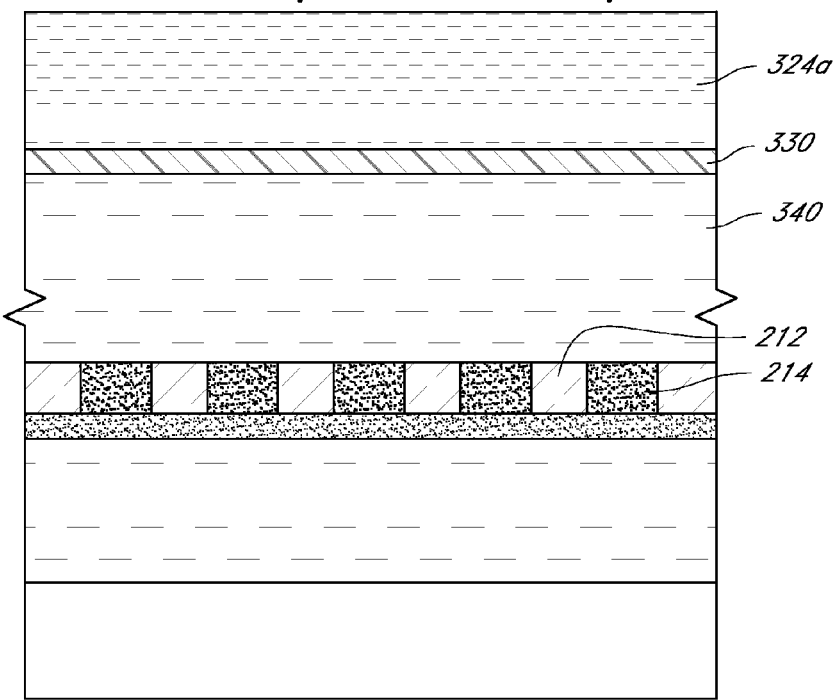
Figure 14C:
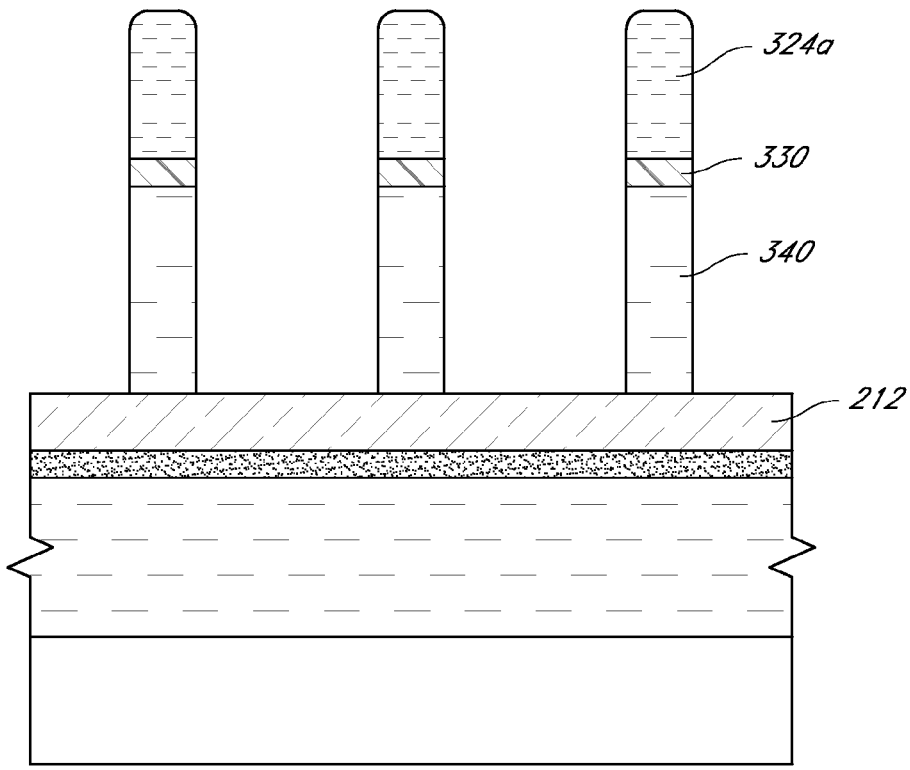
Figure 14D:
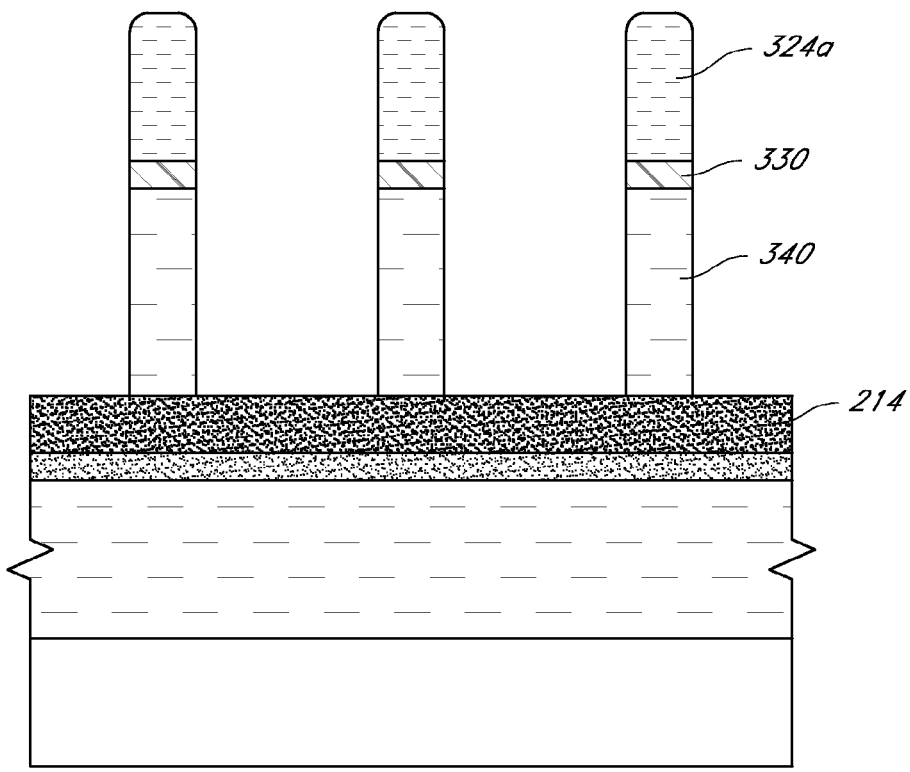

FIGS. 14A-14D illustrate how the pattern in the photodefinable layer 320 can be extended into the fourth temporary layer 340. FIG. 14A shows a schematic plan view of the surface. FIG. 14B shows a schematic cross-sectional side view taken along lines 14B-14B of FIG. 14A. FIG. 14C shows a schematic, cross-sectional side view taken along lines 14C-14C of FIG. 14B. FIG. 14D shows a schematic, cross-sectional side view taken along lines 14-14D of FIG. 14B.

The fourth temporary layer 340 preferably has the advantageous properties described above for the second temporary layer 140 such as high heat resistance. As shown in FIGS. 14A-14D, the pattern of lines 324a and spaces 322a in FIGS. 13A-13D can be extended into or transferred to underlying layers in a similar way to the way the pattern of lines 124a and spaces 122a was transferred to underlying layers, using, for example, a selective etch to transfer the pattern into the hard mask layer 330 and an SO$_2$-containing anisotropic plasma etch to transfer the pattern into the fourth temporary layer 340. Preferred and alternative etch chemistries are described above.

As illustrated in FIG. 14A, the described etch steps remove the portions of the layers 330 and 340 that are not masked by the lines 324a, thus leaving portions of the stripes 212 and 214 exposed. The surfaces visible in FIG. 14A have been hatched to reveal the underlying materials of the structure depicted, and to show how the lines 324a cross the stripes 212 and 214.

Figure 15A:
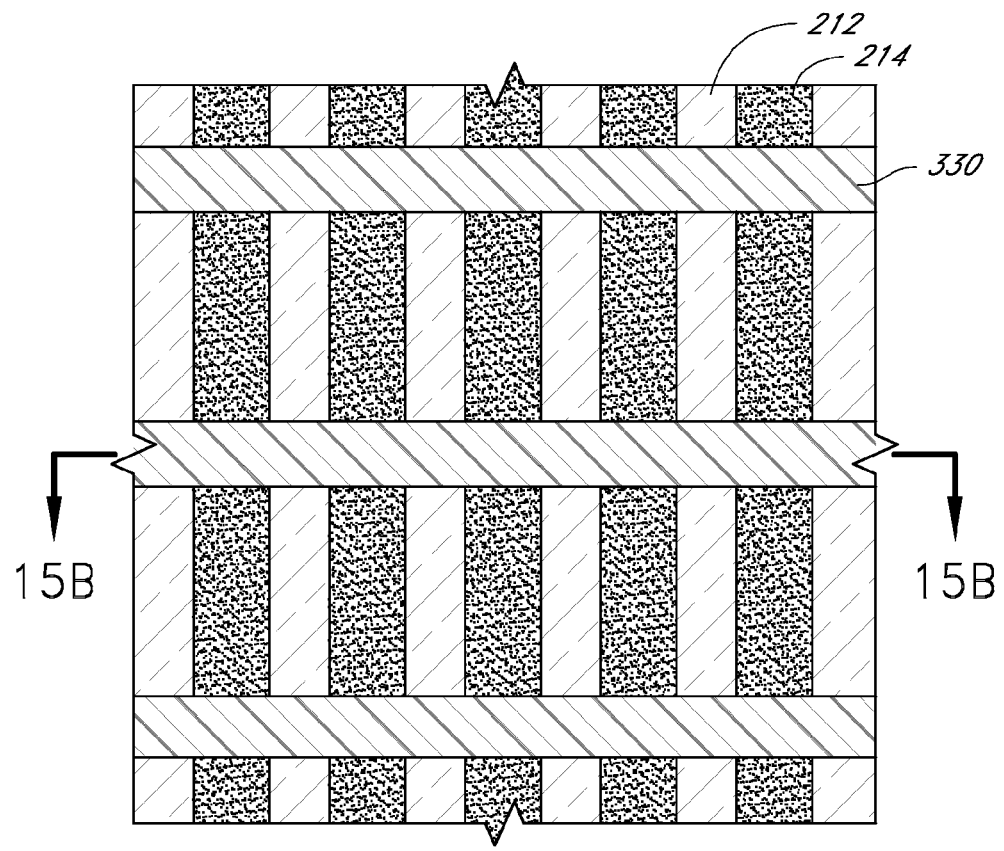
FIGS. 15A-15D show the structure of FIGS. 14A-14D after overlying layers have been stripped.
Figure 15B:
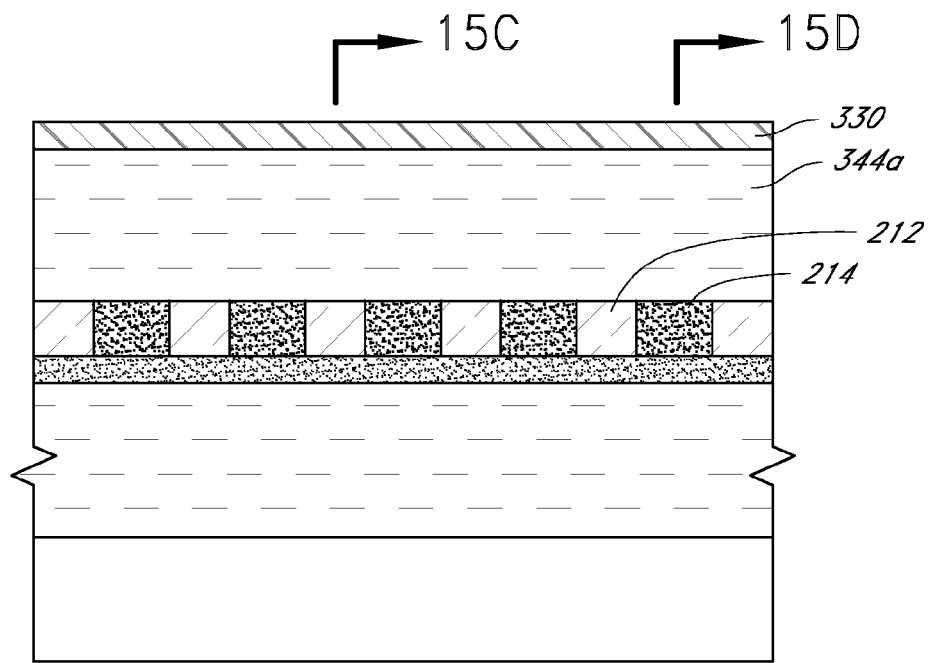
Figure 15C:
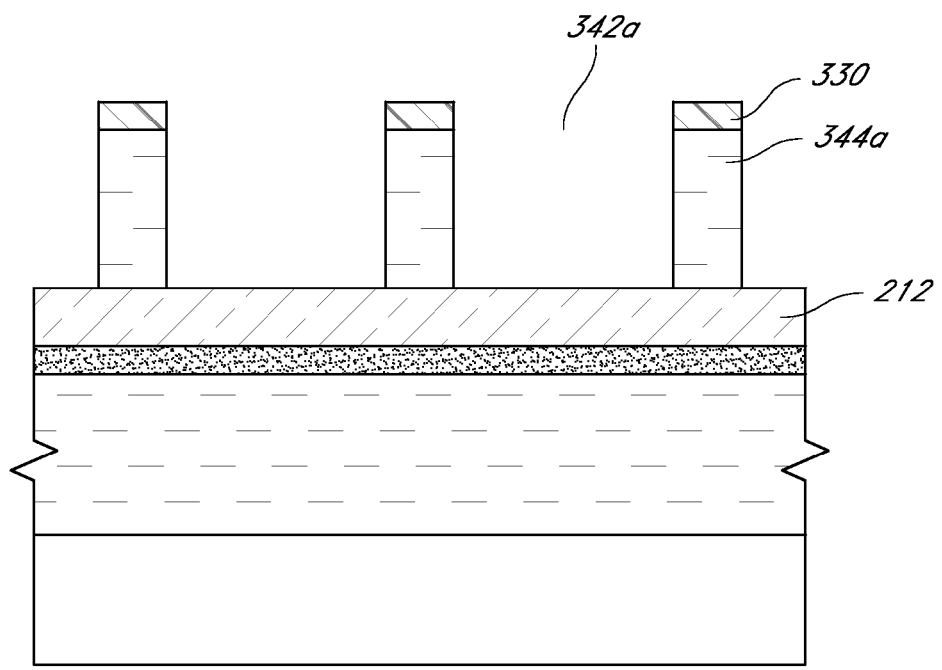
Figure 15D:
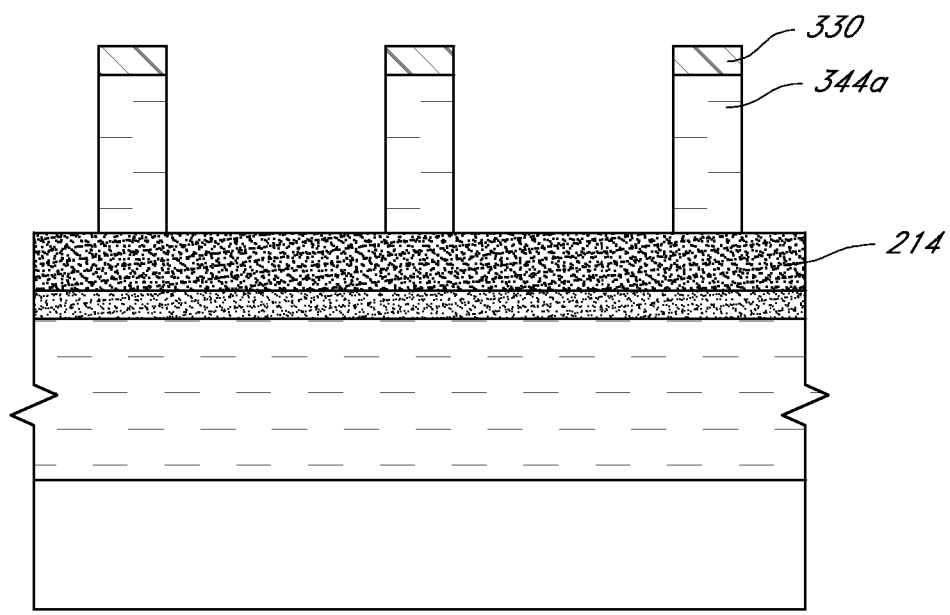

FIGS. 15A-15D show the structure of FIG. 14 after the remaining portions of the overlying layers 320 and 330 have been stripped. Such a process is described above and illustrated in FIGS. 5-6. FIG. 15A shows a schematic plan view of the surface. FIG. 15B shows a schematic cross-sectional side view taken along lines 15B-15B of FIG. 15A. FIG. 15C shows a schematic, cross-sectional side view taken along lines 15C-15C of FIG. 15B. FIG. 15D shows a schematic, cross-sectional side view taken along lines 15D-15D of FIG. 15B. As illustrated by FIGS. 15C-15D, lines 344 and spaces 342 exhibit the same crossing pattern previously apparent in overlying layers (see lines 144a and spaces 142a, for example).

As shown in FIG. 15, once the line pattern originally formed in the definable layer 320 has been extended down into the layer 340, the remaining portions of the definable layer 320 can be stripped away using a selective etch. Alternatively, the remaining portions of layer 320 can be etched away during the carbon etch step that extends the pattern down into the layer 340. Thus, the line pattern originally formed in layer 320 has been transferred to the layers 330 and 340. The transferred pattern is approximately the same as the line pattern originally formed in layer 320; the transferred pattern has lines 344a and spaces 342a that generally correspond to lines 324a and spaces 322a, respectively. In the illustrated embodiment, portions of the hard mask layer 330 remain in place as protective caps on the lines 344a. The lines 344a will serve as mandrels for the subsequently formed spacers.

Figure 16A:
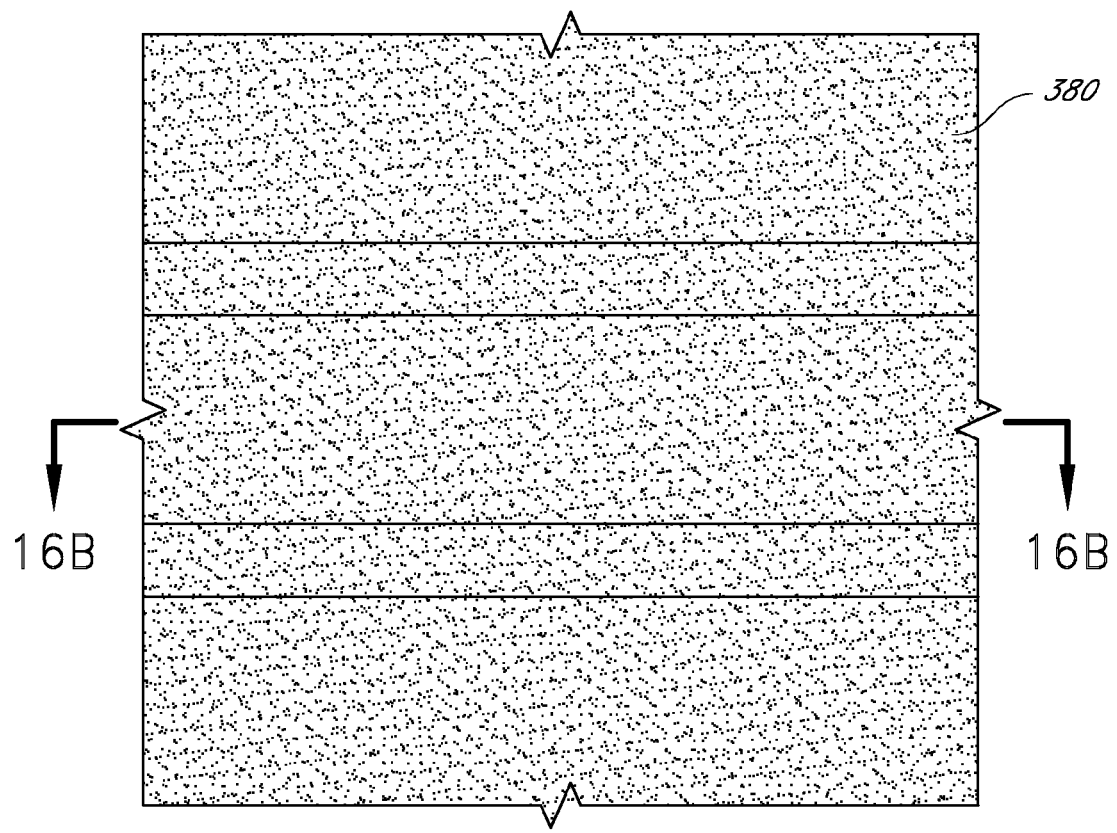
FIGS. 16A-16D show the structure of FIGS. 15A-15D after blanket deposition of a spacer material.
Figure 16B:
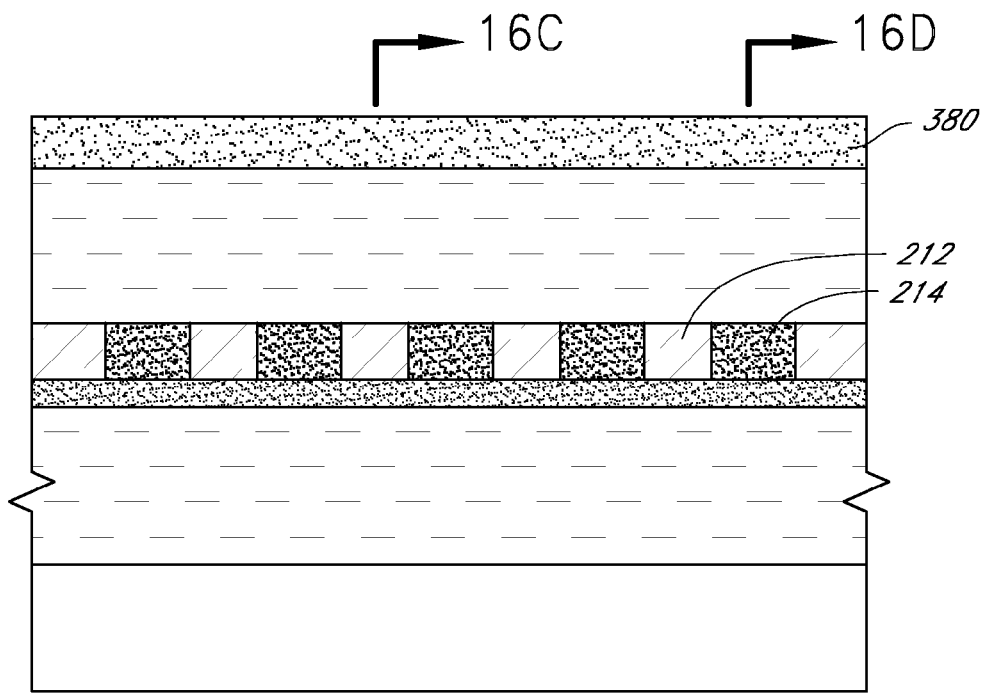
Figure 16C:
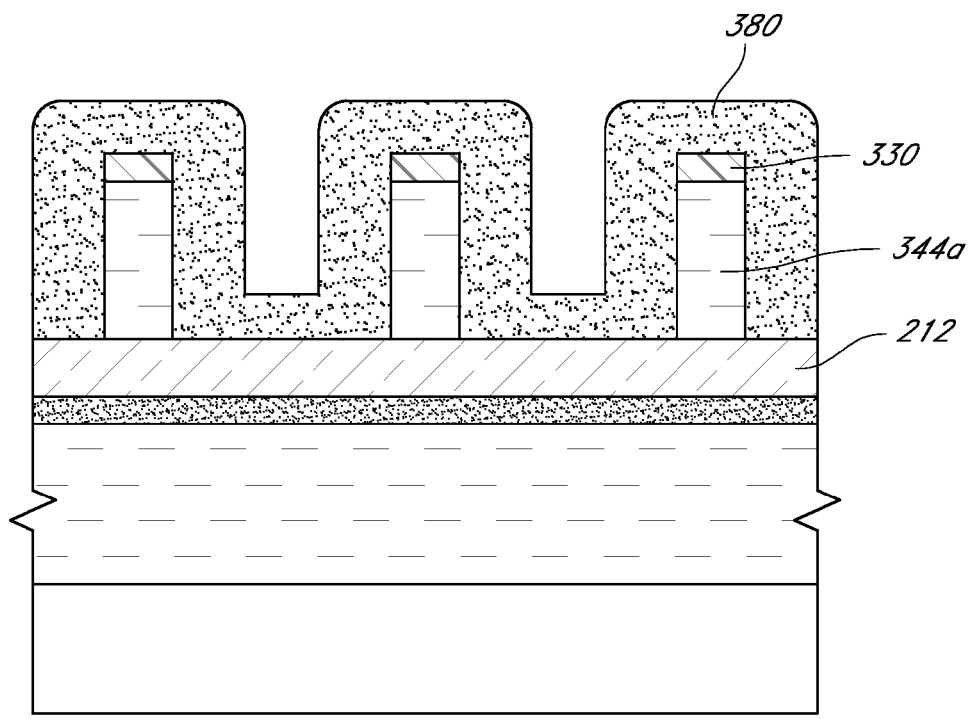
Figure 16D:
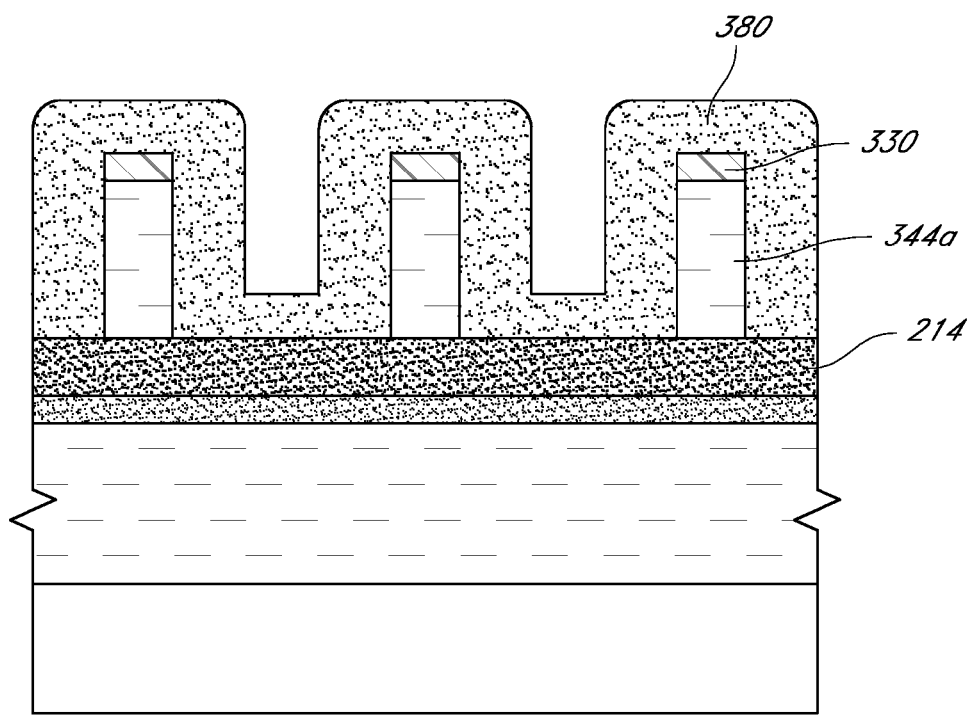

FIGS. 16A-16D show the structure of FIG. 15 after blanket deposition of a spacer material 380 over the mandrels 344a. FIG. 16A shows a schematic plan view of the surface. FIG. 16B shows a schematic cross-sectional side view taken along lines 16B-16B of FIG. 16A. FIG. 16C shows a schematic, cross-sectional side view taken along lines 16C-16C of FIG. 16B. FIG. 16D shows a schematic, cross-sectional side view taken along lines 16D-16D of FIG. 16B.

The layer 380 of spacer material preferably resembles the layer 180 of spacer material described above, in material, in thickness, in coverage, and in mode of deposition. In the illustrated embodiment, portions of the hard mask layer 330 have been left in place, although alternative embodiments do not leave such portions in place. If the portions of the hard mask layer 330 are removed before spacer deposition, a selective etch can be used to remove them. Note that the material of the layer 380 can be different from the materials of the layer 180, provided that each layer can be selectively etched with respect to other surrounding layers as described herein. Silicon dioxide is a preferred spacer material.

Figure 17A:
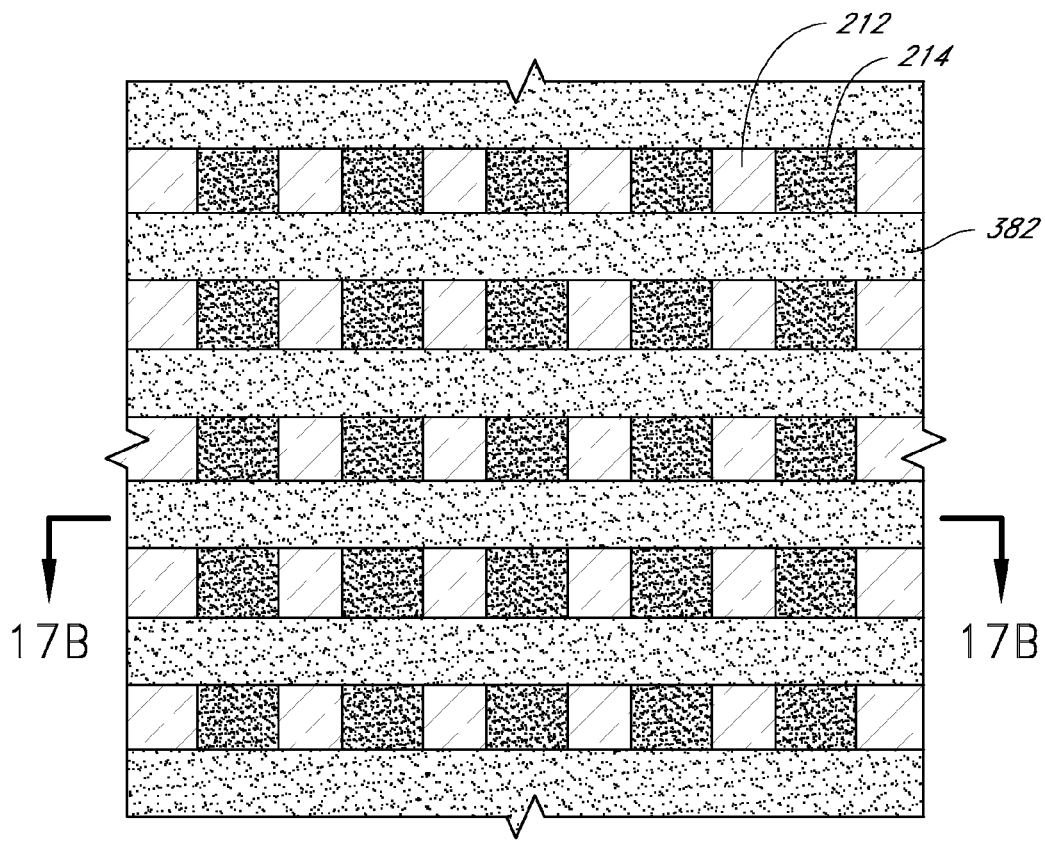
FIGS. 17A-17D show the structure of FIGS. 16A-16D after a spacer etch and subsequent etch (that has removed the mandrels), leaving a pattern of free-standing spacers that are orthogonal to the underlying pattern.
Figure 17B:
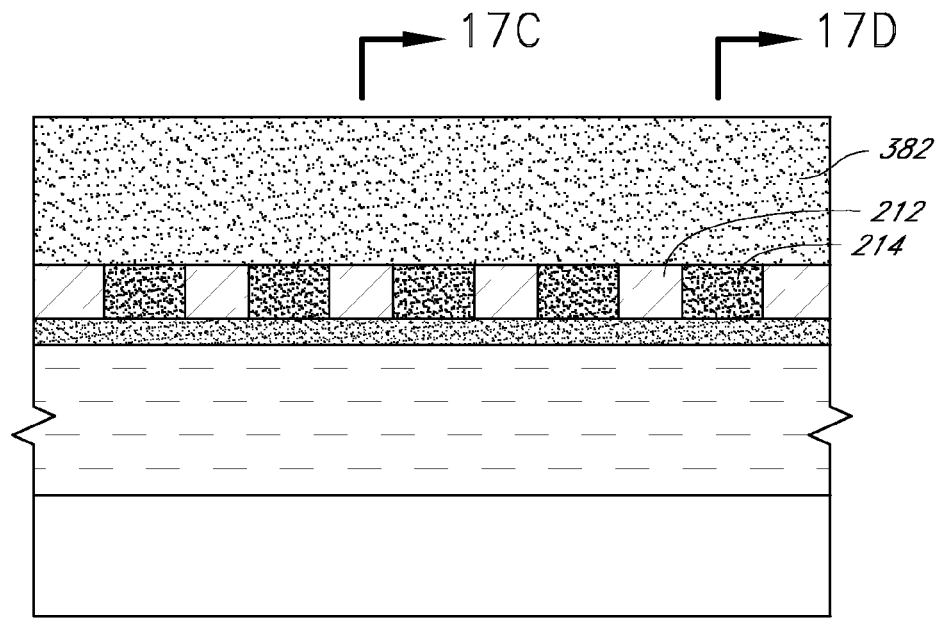
Figure 17C:
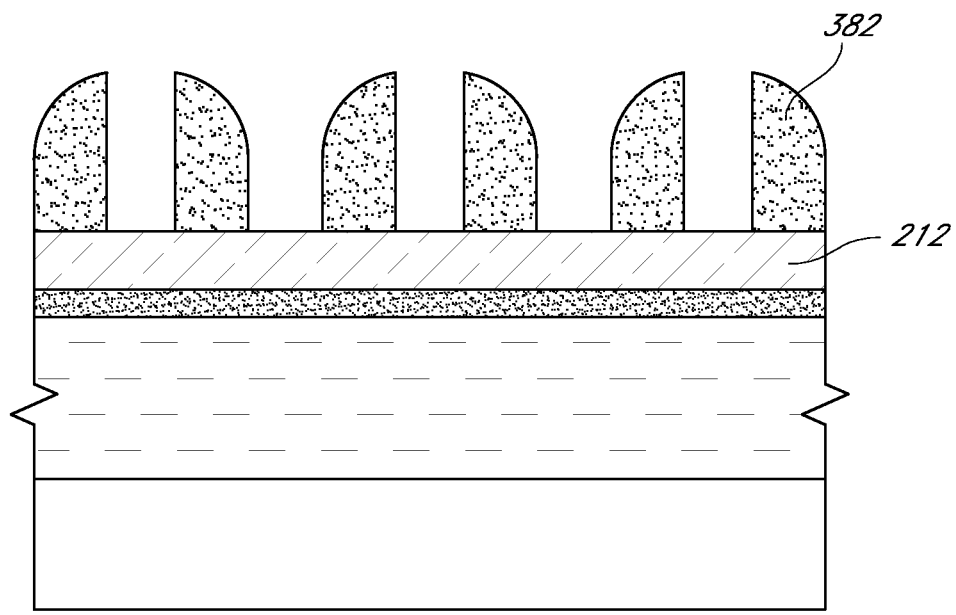
Figure 17D:
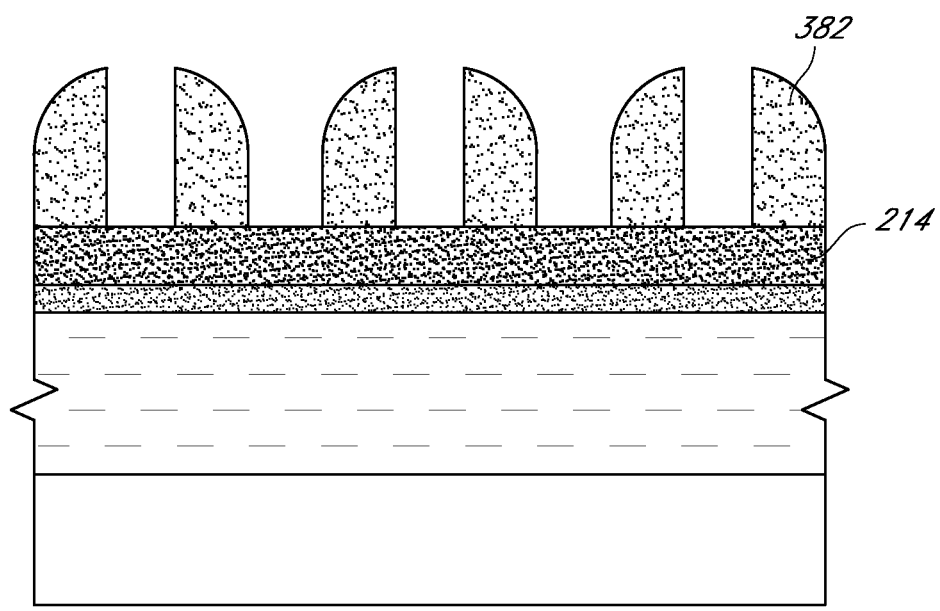

FIGS. 17A-17D show the structure of FIG. 16 after a spacer etch and subsequent etch, leaving a pattern of freestanding spacers. FIG. 17A shows a schematic plan view of the surface. FIG. 17B shows a schematic cross-sectional side view taken along lines 17B-17B of FIG. 17A. FIG. 17C shows a schematic, cross-sectional side view taken along lines 17C-17C of FIG. 17B. FIG. 17D shows a schematic, cross-sectional side view taken along lines 17D-17D of FIG. 17B.

A preferred spacer etch and alternatives are described above with respect to FIGS. 7-8. For example, the spacer etch can be performed using fluorocarbon plasma. As with spacer etch described above, the result is preferably a pattern of elongate spacers having effectively reduced pitch relative to the lines 344a. After the spacer etch, the remaining portions of hard mask layer 330 (if still present) and the fourth temporary layer 340 are next removed to leave freestanding spacers 382. In this way, features of one pattern are removed to leave behind another pattern formed by the spacers 382.

With the elongate spacers 382 in place, crossing the underlying mask lines 212 and 214, a second pitch reduction process has been performed in a crossing dimension—that is, a dimension that is not parallel to the lines 212 and 214. In the illustrated embodiment, the pitch of the pattern formed by spacers 382 is roughly half that of the pattern formed by photoresist lines 344 and spaces 342. Advantageously, the pattern of spacers 382 has a pitch of about 140 nm or less. Preferably, the pattern of spacers 382 has a pitch of about 100 nm or less.

In the second phase of methods described and illustrated above with reference to FIGS. 11-17, a second pattern of spacers has been formed by pitch multiplication and used to create an overlying pattern of lines that crosses the underlying pattern of lines illustrated in FIG. 10.

Third Phase

In the third phase, the crossing striped structures of FIG. 17 are used to create a grid of material having small holes that can occur at regular intervals in two dimensions. In one embodiment, the third phase comprises an etch sequence according to the following steps: 1) removal of portions of several exposed layers made from a common material (such as silicon dioxide), while leaving intact one of the materials (such as amorphous silicon) of exposed portions of the underlying stripe materials; 2) extension of two overlying patterns (such as an oxide spacer pattern and a crossing, amorphous silicon strip pattern) into an underlying mask or temporary layer (such as amorphous carbon); and 3) removal of overlying layers to leave a single underlying layer having holes.

Figure 18A:
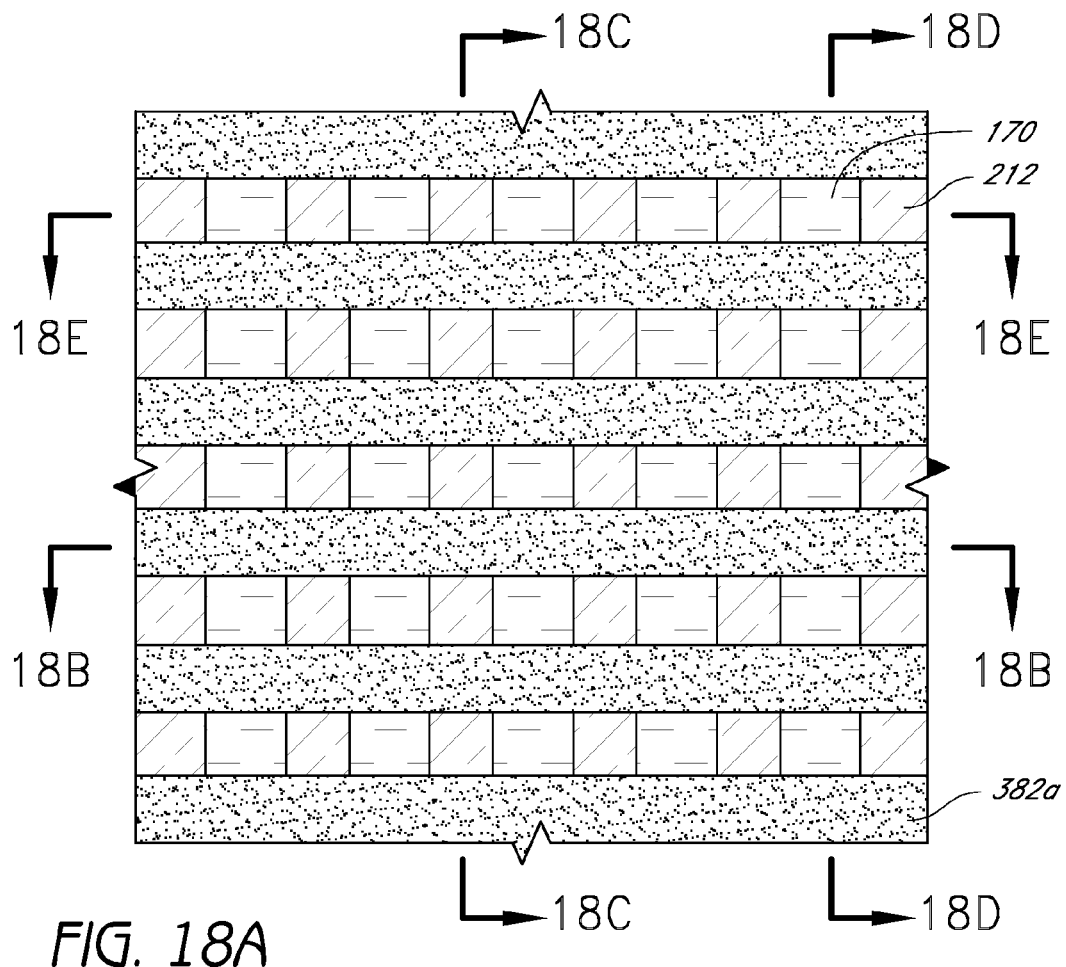
FIGS. 18A-18E show the structure of FIGS. 17A-17D after an etch (e.g., a silicon dioxide etch) has removed portions of several exposed layers, while leaving intact one of the stripe materials of exposed portions of the underlying pattern.
Figure 18B:
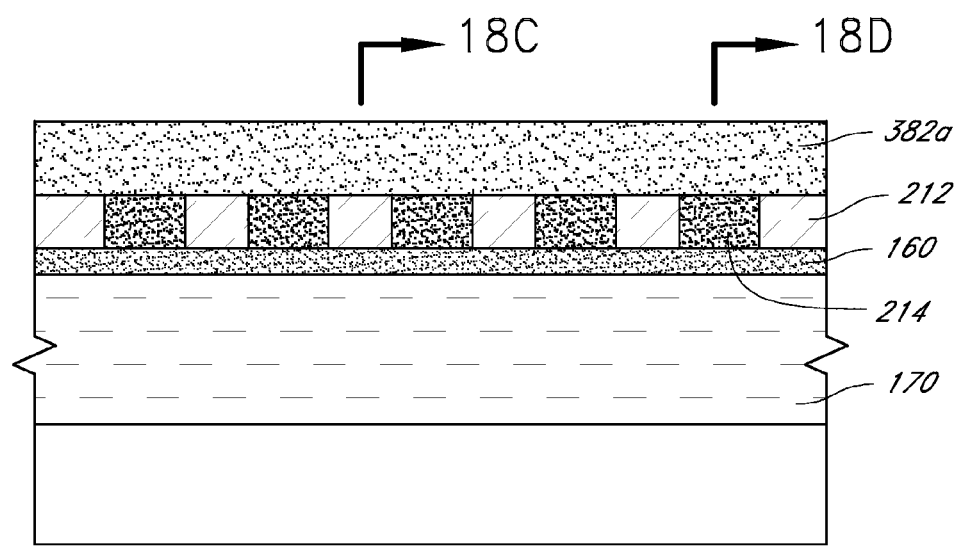
Figure 18C:
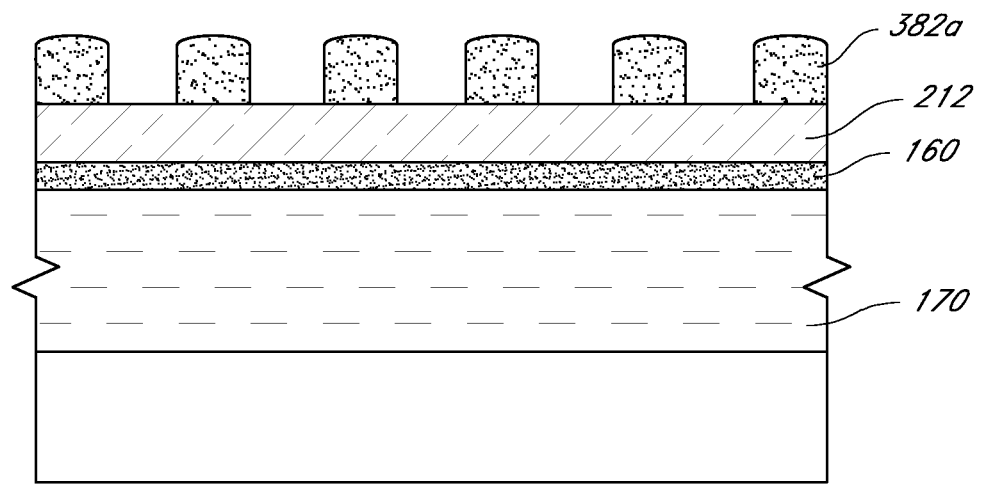
Figure 18D:
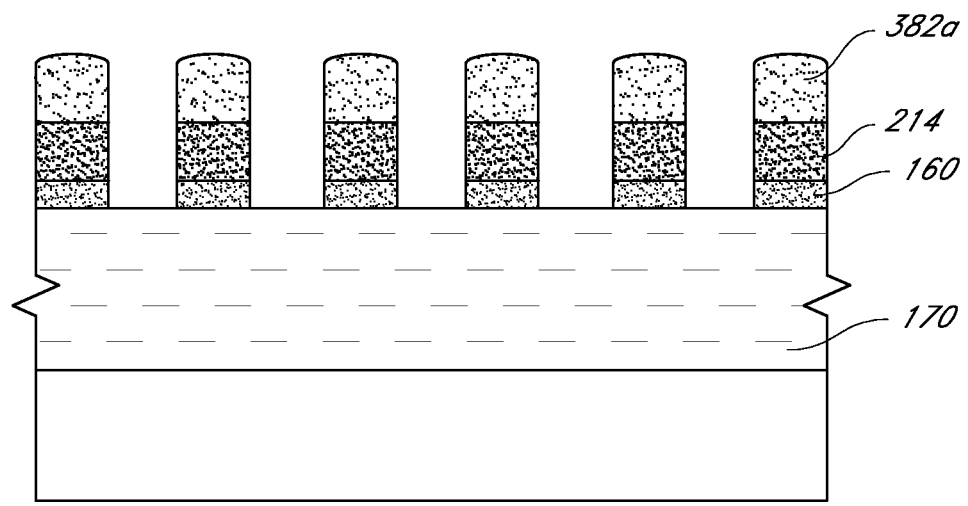
Figure 18E:
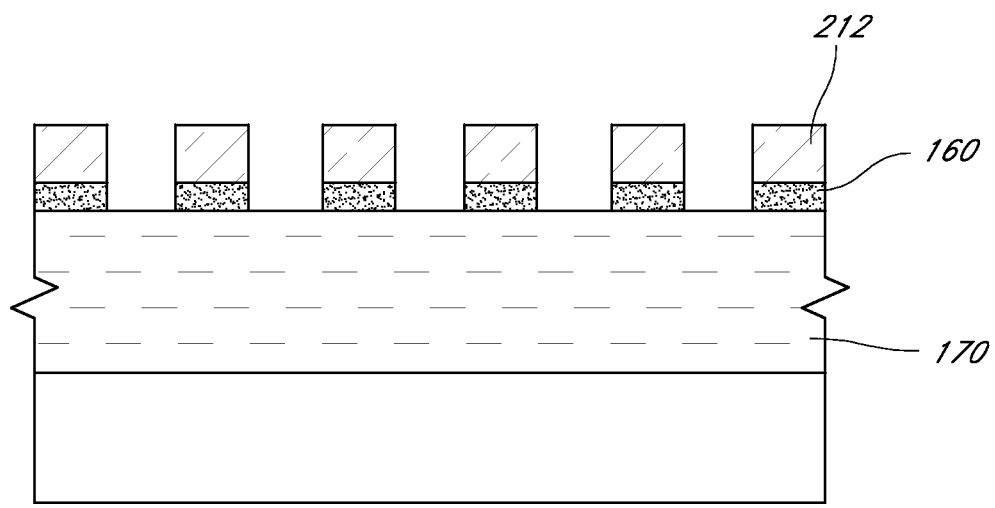

FIGS. 18A-18E show the structure of FIG. 17 after exposed portions of several layers, including the spacers 382 and the stripe 214, have been selectively etched while the stripe 212 has been left largely intact. In a preferred embodiment, the stripe 212 is formed from amorphous silicon and the spacers and the stripe 214 are formed from silicon dioxide, so the etch is a silicon dioxide etch—that is, it etches silicon dioxide selectively with respect to the amorphous silicon that is also exposed. One etch that can be used is a fluorocarbon etch. FIG. 18A shows a schematic plan view of the surface. FIG. 18B shows a schematic cross-sectional side view taken along lines 18B-18B of FIG. 18A. FIG. 18C shows a schematic, cross-sectional side view taken along lines 18C-18C of FIGS. 18A and 18B. FIG. 18D shows a schematic, cross-sectional side view taken along lines 18D-18D of FIGS. 18A and 18B. FIG. 18E shows a schematic, cross-sectional side view taken along line 18E-18E of FIG. 18A.

As revealed by these figures, the exposed portions of the stripes 214 have been left largely intact by the etch step, while exposed portions of the stripes 214, the spacers 382, and the layer 160 have all been etched. Thus, in some embodiments, portions of three different silicon oxide layers are etched by the same etch chemistry. This etch of materials from multiple layers occurs in the illustrated embodiment, as the spacers 382, the stripes 214 and the second hard mask layer 160 each can be formed from silicon dioxide. The materials of these three separate layers have been depicted using stipple of varying weights so that the three layers can be distinguished in the drawings. In some embodiments, each of the three layers can be formed from another common material. As used in this specification, a "common material" can refer to materials that are similar enough in composition to allow each to be etched together, while maintaining selectivity with respect to surrounding materials. Examples of materials that can thus be considered common for this purpose are the various forms of silicon oxide, such as TEOS, BPSG, LSO, $SiO_2$, C-doped oxide, F-doped oxide, porous oxide, SOD, etc. Most preferably, each of these layers is formed using the same composition methods and from the same material (for example, each can be formed from LSO). In other embodiments, the second hard mask layer 160 is formed from a DARC material, as noted above.

The etch step has removed the exposed portions of the stripes 214 first because the stripes 214 are not as thick as the spacers 382. Thus, while the etch has partially removed portions of the spacers 382, creating modified spacers 382a, it has penetrated completely the exposed portions of the stripes 214 and the layer 160. Alternatively, if the layer 160 is formed from a different substance than the spacers 382 and the stripes 214, a separate selective etch can be used to penetrate down through the layer 160 to the third temporary layer 170.

Figure 19A:
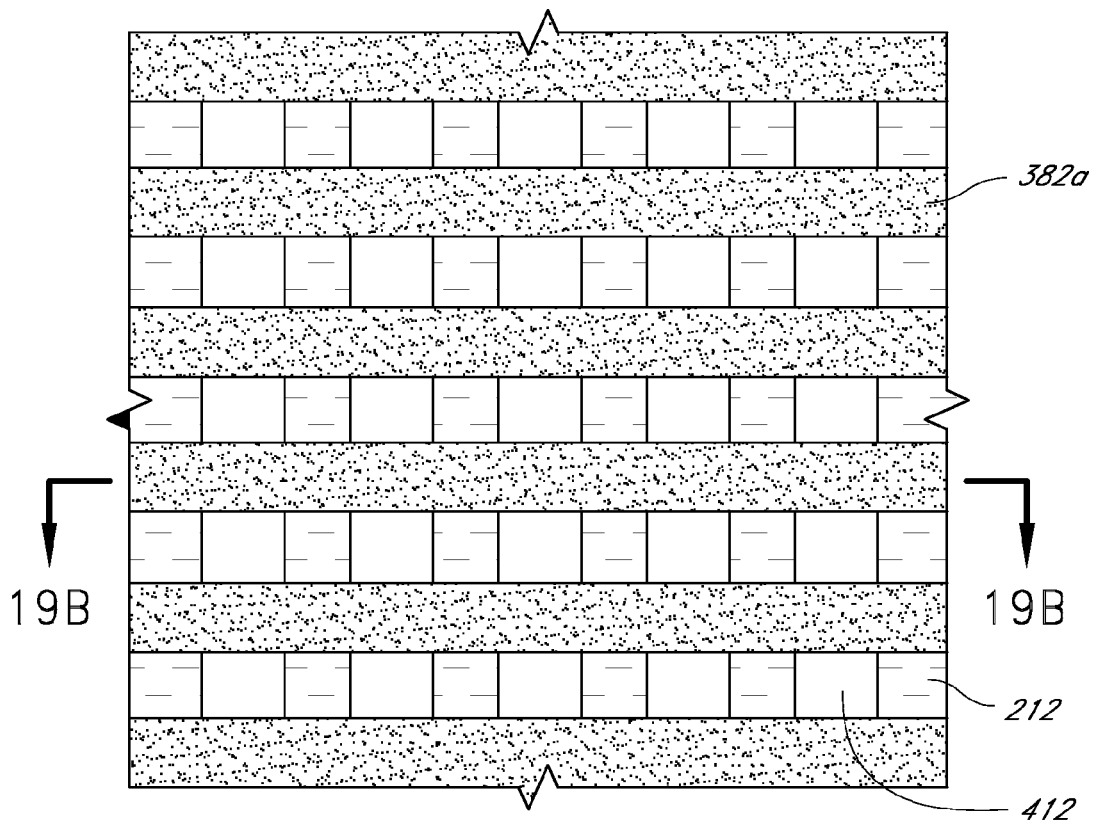
FIGS. 19A-19D show the structure of FIGS. 18A-18E after extending the pattern of two overlying layers into an underlying mask or temporary layer, forming holes in the underlying layer.
Figure 19B:
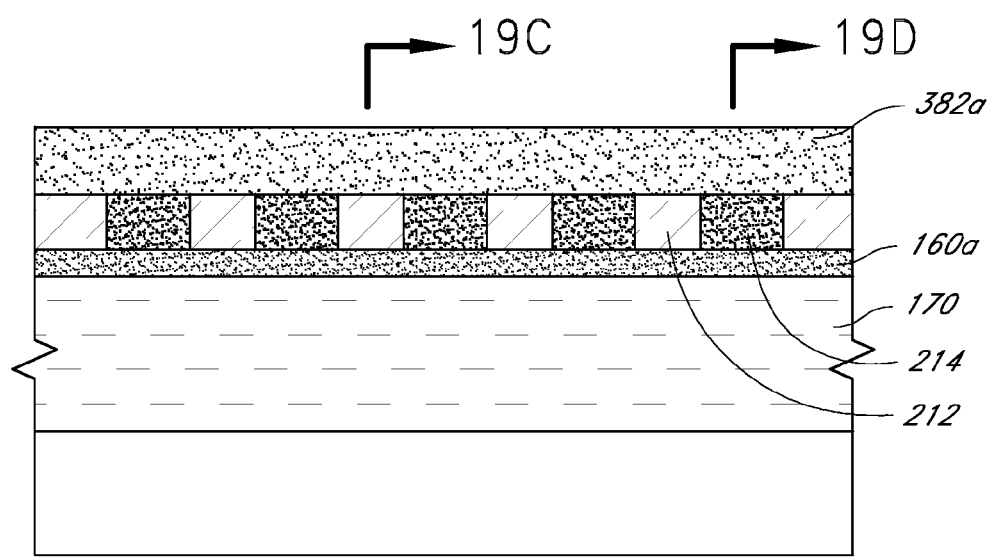
Figure 19C:
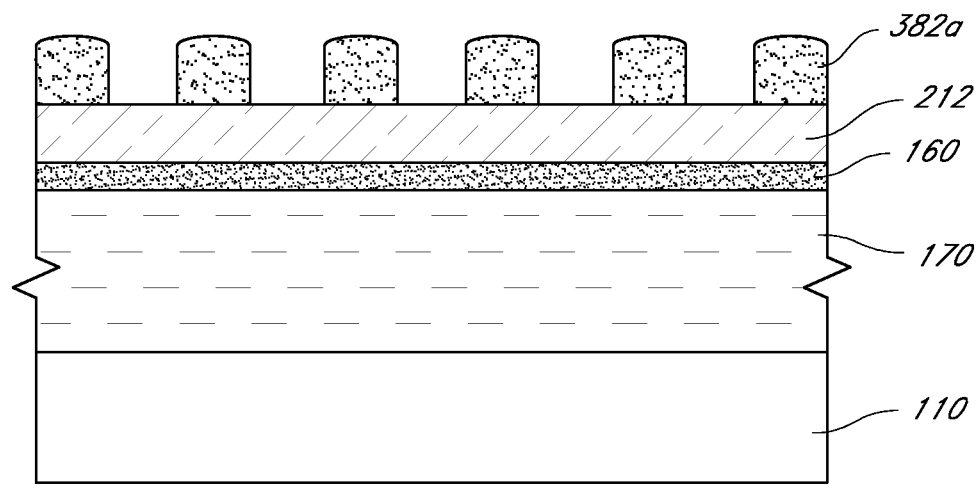
Figure 19D:
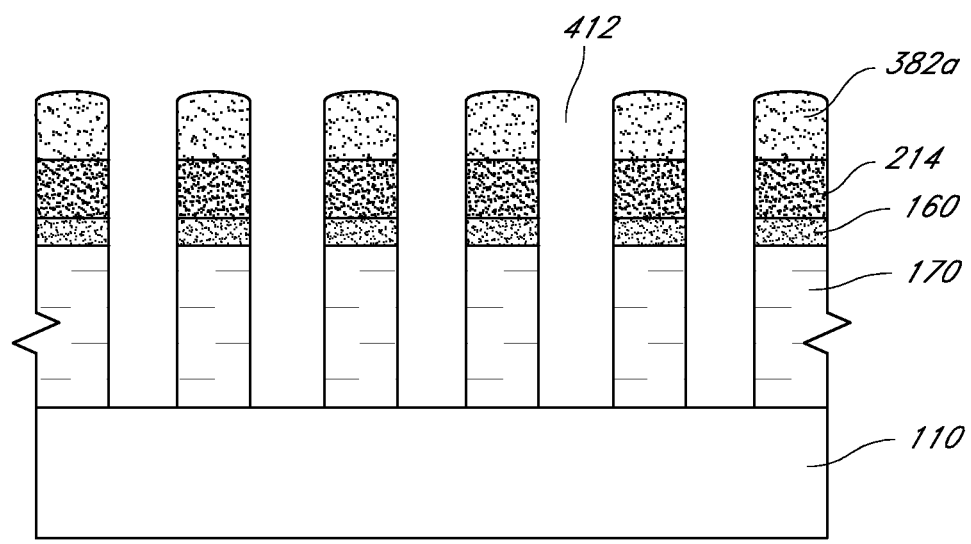

FIGS. 19A-19D show the structure of FIG. 18 after an etch into exposed portions of the third temporary layer 170, which is preferably amorphous carbon. FIG. 19A shows a schematic plan view of the surface. FIG. 19B shows a schematic cross-sectional side view taken along lines 19B-19B of FIG. 19A. FIG. 19C shows a schematic, cross-sectional side view taken along lines 19C-19C of FIG. 19B. FIG. 19D shows a schematic, cross-sectional side view taken along lines 19D-19D of FIG. 19B.

Because of the protective grid formed above the layer 170 by the spacers 382a that cross the stripes 212, the etch removes the material of the underlying layer 170 only in the unprotected areas to form small, densely and/or evenly-spaced holes 412 in the layer 170. FIG. 20C shows the holes in cross section, and reveals how the holes preferably extend all the way down through the layer 170 to the sacrificial substrate 110.

After this etch step, the layer 170 exhibits features that were present in two distinct overlying patterns. Thus, the perspective of FIGS. 19A and 20A illustrate how the pattern formed by pitch multiplication in FIGS. 2-10 and the (crossing) pattern formed by pitch multiplication in FIGS. 11-17 can be combined to form a pattern derived from both overlying patterns.

Figure 20A:
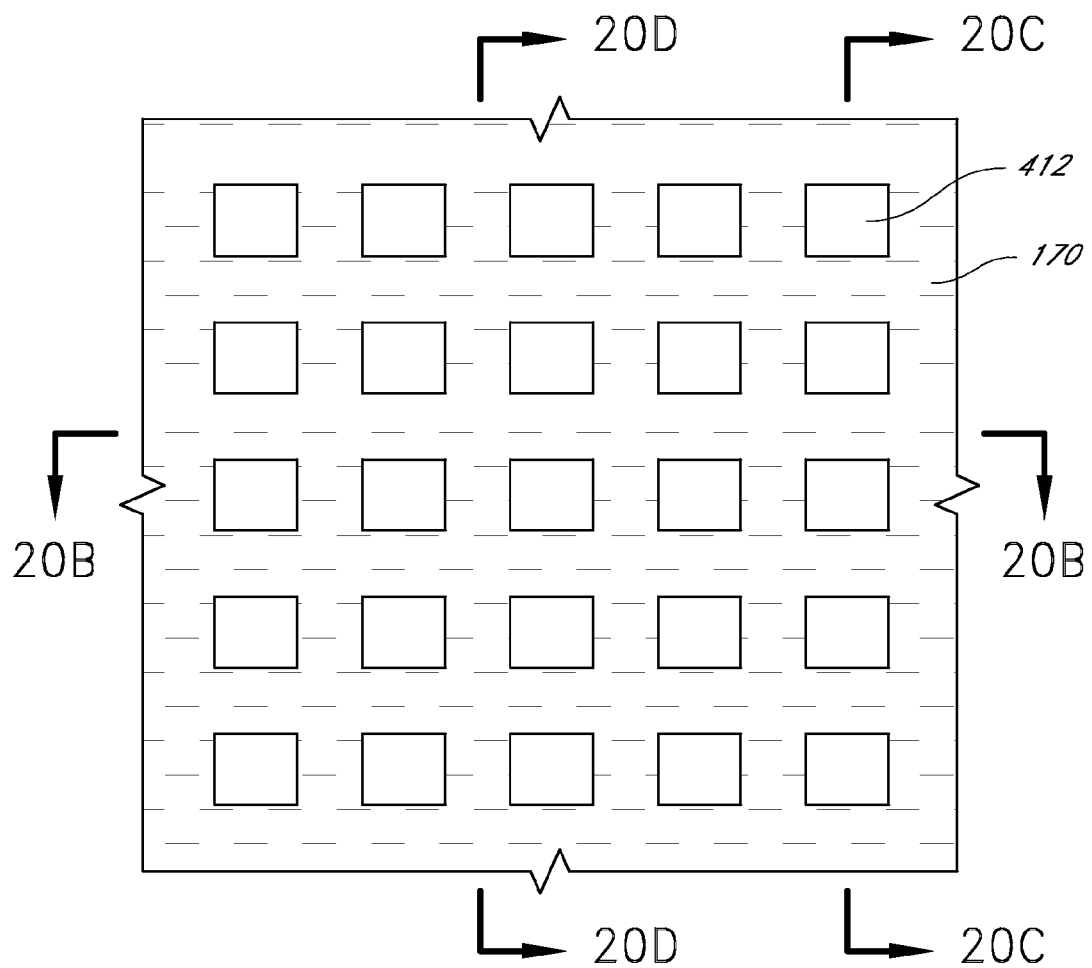
FIGS. 20A-20D show the structure of FIG. 19 after overlying layers have been stripped to leave a pattern of holes in the lower temporary or mask (e.g., amorphous carbon) layer.
Figure 20B:
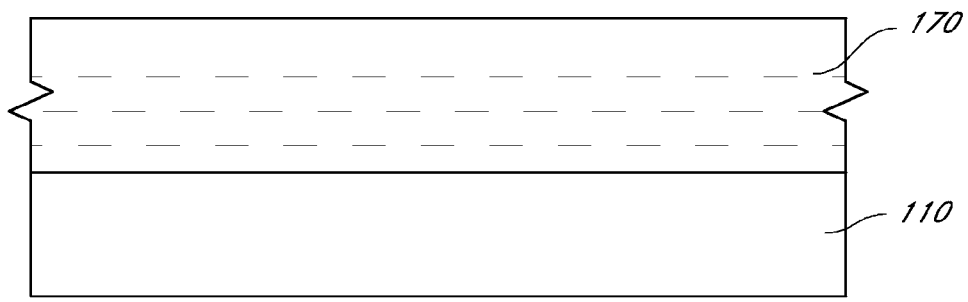
Figure 20C:
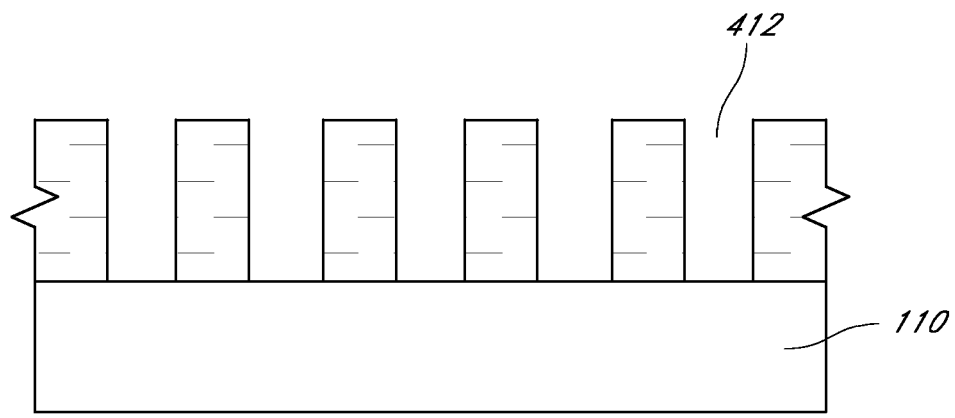
Figure 20D:
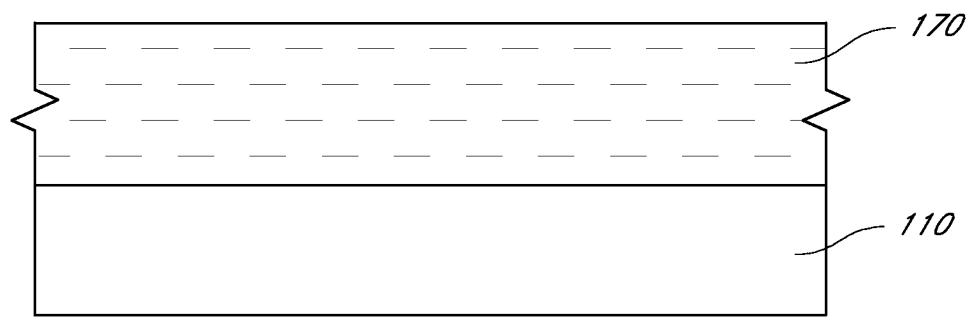

FIGS. 20A-20D show the structure of FIG. 19 after overlying layers have been stripped to reveal the pattern of holes 412 in the third temporary layer 170. FIG. 20A shows a schematic plan view of the surface. FIG. 20B shows a schematic cross-sectional side view taken along lines 20B-20B of FIG. 20A. FIG. 20C shows a schematic, cross-sectional side view taken along lines 20C-20C of FIG. 20A. FIG. 20D shows a schematic, cross-sectional side view taken along lines 20D-20D of FIG. 20A.

One or multiple etch steps can be used to remove the remaining portions of the overlying layers to achieve the structure illustrated in FIGS. 20A-20C. For example, an etch can be used to remove modified spacers 382a, and separate etch steps can be used to remove the remaining portions of the silicon oxide stripes 214, the amorphous silicon stripes 212, and the second hard mask layer 160. Alternatively, a single etch step can remove all of the above layers at once with a CMP process, a sputter etch, a dry etch, a reactive ion etch, or any chemistry or process that removes everything but the materials of layer 170 and the substrate 110. In the illustrated embodiment, the layer 160 has been completely removed in FIG. 20, leaving a carbon grid sitting atop the substrate 110. In some embodiments, the remaining portions of overlying layers will be consumed during the etch of the substrate, so that no separate steps are required to remove these layers.

In this embodiment, the features in the carbon grid are holes having a slightly rectangular footprint. In some embodiments, the footprint of the feature is square—that is, the length and width of the features are approximately the same. Preferably, the features have a first width and a first length that is no more than 10 times the first width. Thus, preferred embodiments form features that are isolated, rather than continuous lines. Pitch multiplication of a pattern in one dimension can result in pitch multiplied lines, but pitch multiplication of crossing patterns can result in dense and closely-spaced isolated features, e.g., holes. The features having a length that is not many times longer than the feature's width are thus different from lines, which may have a length hundreds or thousands of times their width, for example. Preferred embodiments have features with a less-elongate footprint, instead having a more square-shaped (or rectangular) footprint.

The features preferably are spaced apart at intervals of less than approximately 60 nm. In one embodiment, the isolated features each have a rectangular footprint with dimensions of approximately 50 nm by approximately 60 nm. In another embodiment, the isolated features each have a square footprint with dimensions of approximately 50 nm by approximately 50 nm. Regardless of the size of holes, reduced spacing between adjacent holes allows dense arrays of features. By careful choice of the mandrel and spacer dimensions, it will be appreciated that the holes can have larger dimensions than the spacings, which can allow for larger features with close spacing. This can be advantageous, e.g., where the holes pattern provides containers for high surface area capacitors in a memory array.

Figure 21A:
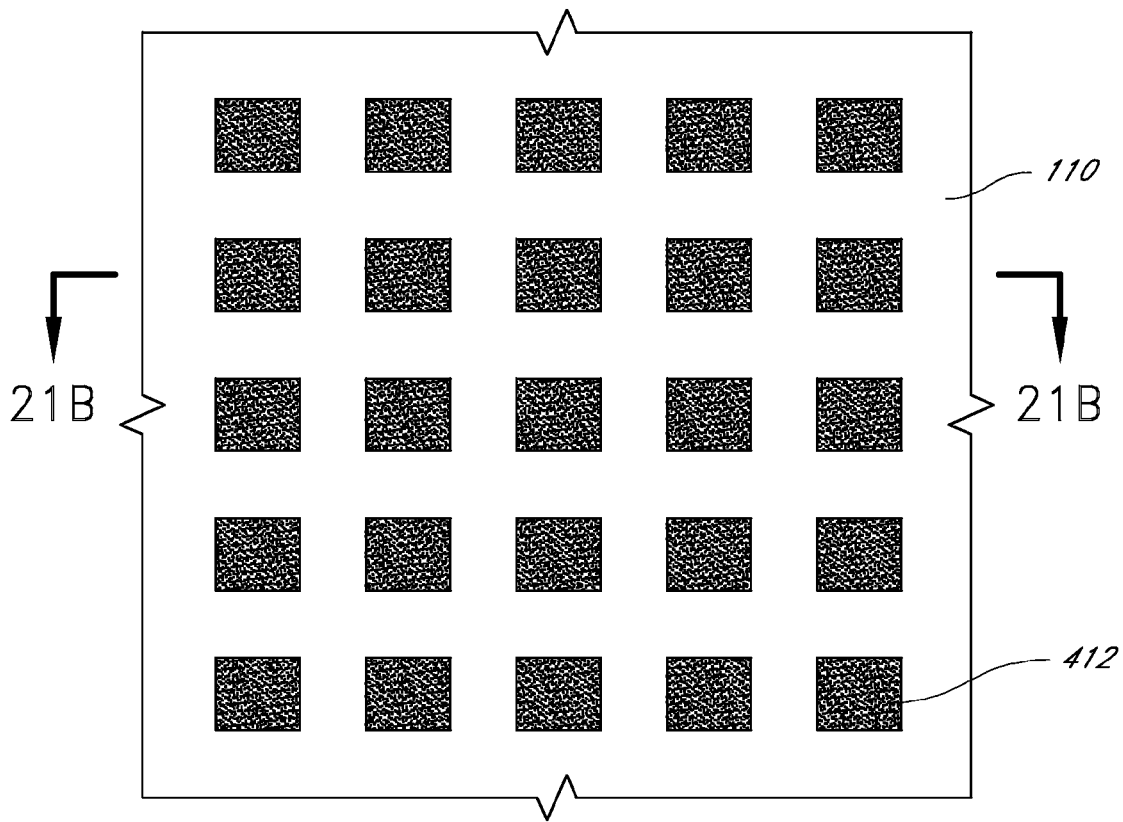
Figure 21B:
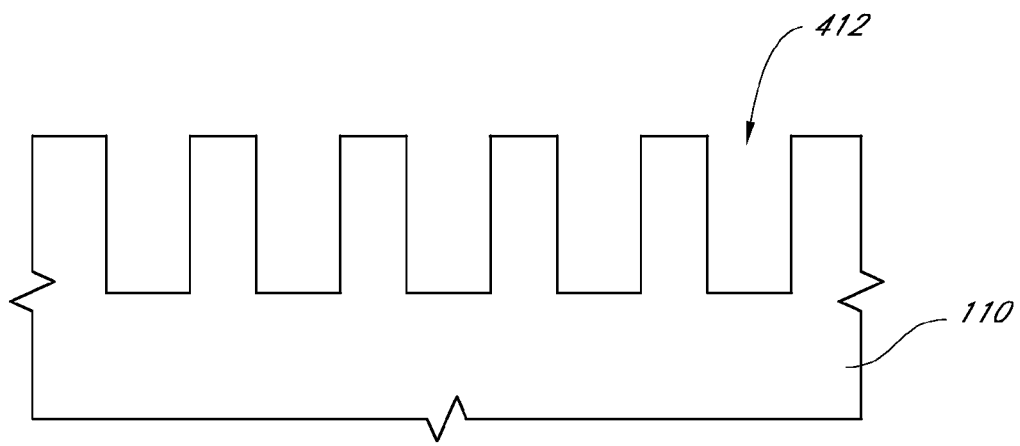
Figure 22:
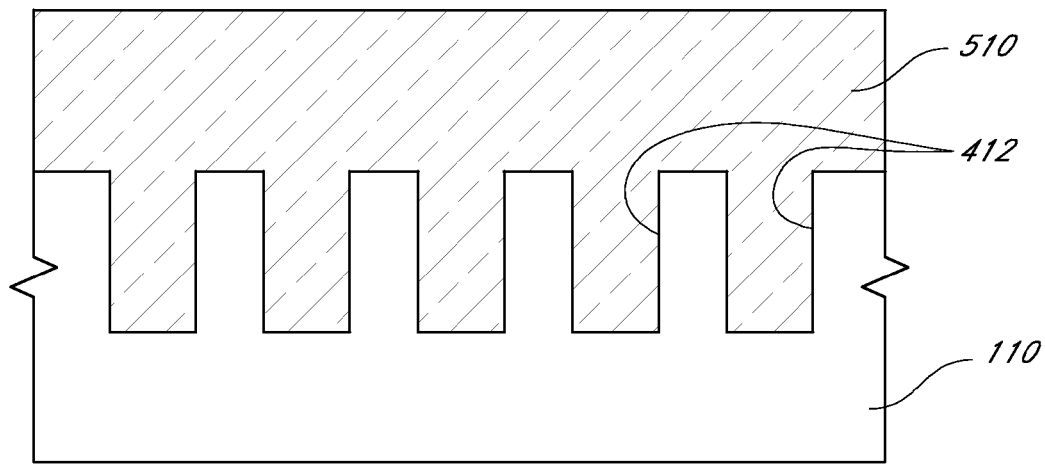

Next, the pattern of holes 412 in the third temporary layer 170 is preferably extended down into the sacrificial substrate 110 and the third temporary layer 170 is removed, thereby creating a pattern of holes 412 in the sacrificial substrate 110, as shown in FIGS. 21A and 21B.

Fourth Phase

In the fourth phase, a layer of a planar material is formed over the holes 412 of the sacrificial substrate 110 of FIGS. 21A and 21B to form an imprint reticle comprising a pattern (or periodic array) of pillars pitch multiplied in two dimensions.

With reference to FIG. 22A, a planar material is deposited over the sacrificial substrate 110 of FIGS. 21A and 21B. Deposition of the planar material substantially fills the holes 412 and forms a layer 510 of the planar material over the sacrificial substrate 110. The transparent material may be, e.g., a form of silicon oxide (e.g., quartz) or amorphous carbon. The upper surface of the planar layer 510 is substantially planar. The planar layer 510 may be deposited using any suitable deposition technique including, without limitation, CVD, ALD, spin coating and combinations thereof. The planar layer 510 is deposited to substantially completely fill the holes 412 without producing voids between the planar layer 510 and the topography on the sacrificial substrate 110. If, in addition to the holes, the topography of the sacrificial substrate 110 includes large spaces, such as features (e.g., lines, landing pads) at the periphery of the pattern (array) of holes 412, the planar layer 510 may be formed by filling the spaces using a combination of ALD to conform to the topography of sacrificial substrate 110 followed by spin coating a similar or different material. The planar layer 510 can be formed by planar deposition, as described, or can be planarized using chemical mechanical polishing (CMP) or a dry etch back process.

Figure 23:
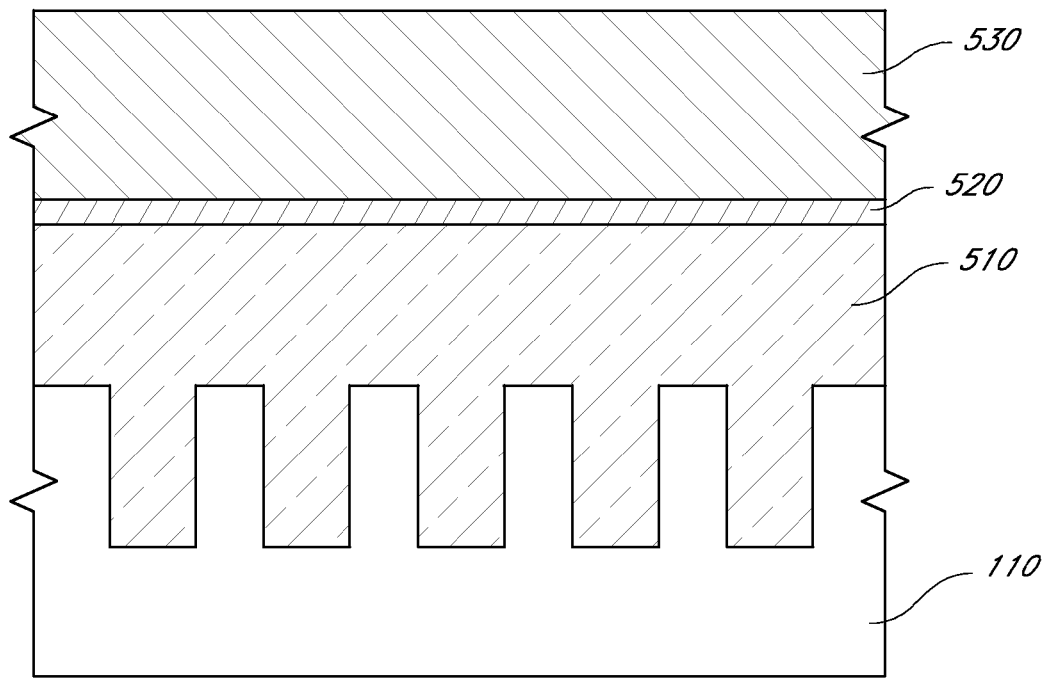

Next, a support structure, such as a reticle plate ("plate") 530, is bonded to the surface of the planar layer 510, as shown in FIG. 23. The plate 530 is configured for use with existing imprint lithography equipment (or may be later modified to conform to existing equipment). The plate 530 is preferably 0.25 inches (0.64 cm) thick with substantially planar surfaces. In one embodiment, the plate 530 is made of transparent material, more preferably a UV-transparent material. In such a case, a preferred material for the plate 530 is quartz, which permits UV radiation to pass through the plate 530. In another embodiment, the plate includes a layer of a metallic material, preferably chrome, over a quartz substrate. Since the surface of the layer 510 is substantially planar, good adhesion may be obtained between the planar layer 510 and the plate 530 using an adhesive layer 520. Adhesive compositions may be selected by one of ordinary skill in the art.

Figure 24A:
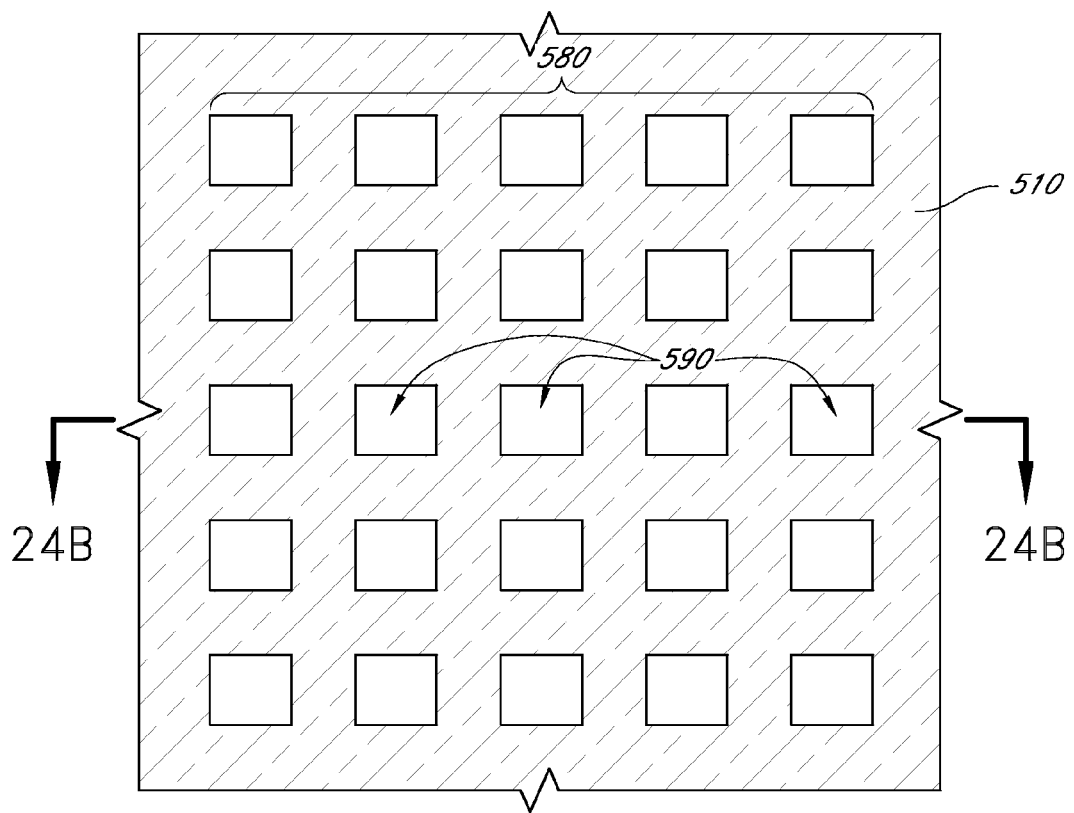
Figure 24B:
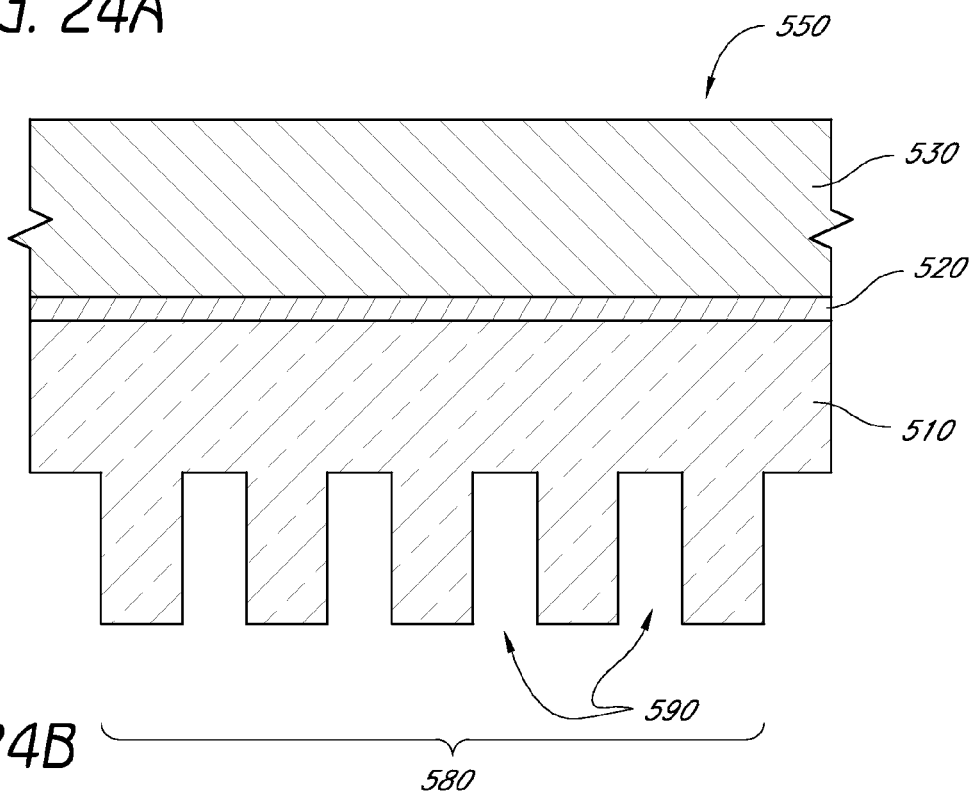

Next, the sacrificial substrate 110 is removed from the planar layer 510, as shown in FIGS. 24A and 24B. FIG. 24B is a schematic, cross-sectional side view taken along line 24B-24B of FIG. 24A. The sacrificial substrate 110 can be removed using, e.g., conventional wet or dry etch techniques selective for the substrate 110 relative to the layer 510. Consequently, the planar layer 510 remains substantially undamaged after removing the substrate 110. Where the sacrificial substrate 110 is an opaque material, e.g., silicon, an etch of the first substrate 110 may be achieved by a rapid and inexpensive conventional wet silicon etch.

With continued reference to FIGS. 24A and 24B, the pillars 590 have square footprints. However, it will be appreciated that the pillars 590 can have other footprints, such as, e.g., square or triangular footprints. The layer 510 and the reticle pattern 580 in the layer 510 collectively define a patterned structure. The pattern 580 formed in the layer 510 is a negative or inverse image of the pattern of holes 412 in the sacrificial substrate 110 of FIGS. 21A and 21B. Pillars 590 in the layer 510 correspond to holes 412 in the sacrificial substrate 110. Thus, a negative image of the pattern of holes 420 in the sacrificial substrate 110 is transferred to the layer 510.

Figure 25A:
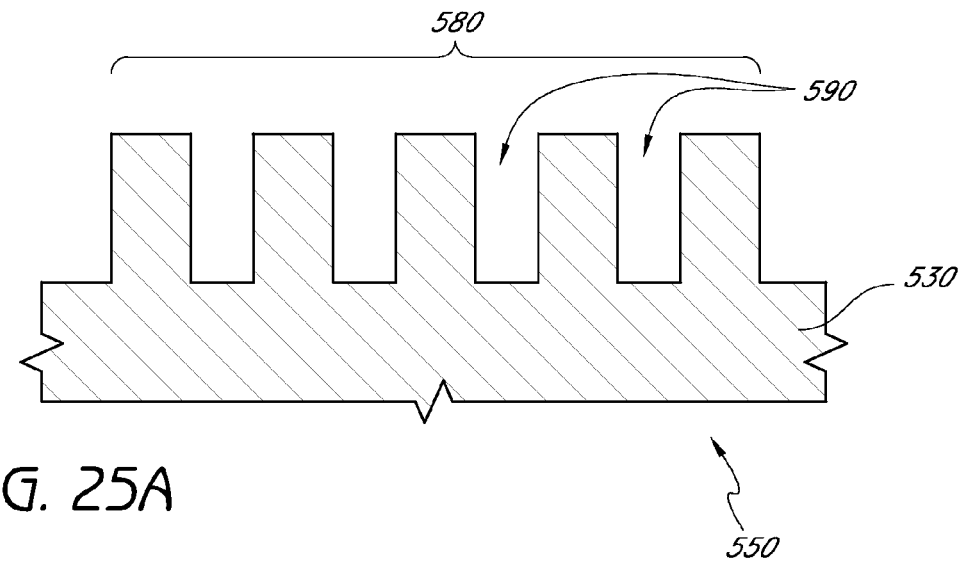
FIGS. 25A and 25B are cross-sectional side and top plan views of the reticle plate of FIGS. 24A and 24B after inversion, transfer of the pillar pattern into the reticle plate, and removal of any remaining transfer and adhesion material.
Figure 25B:
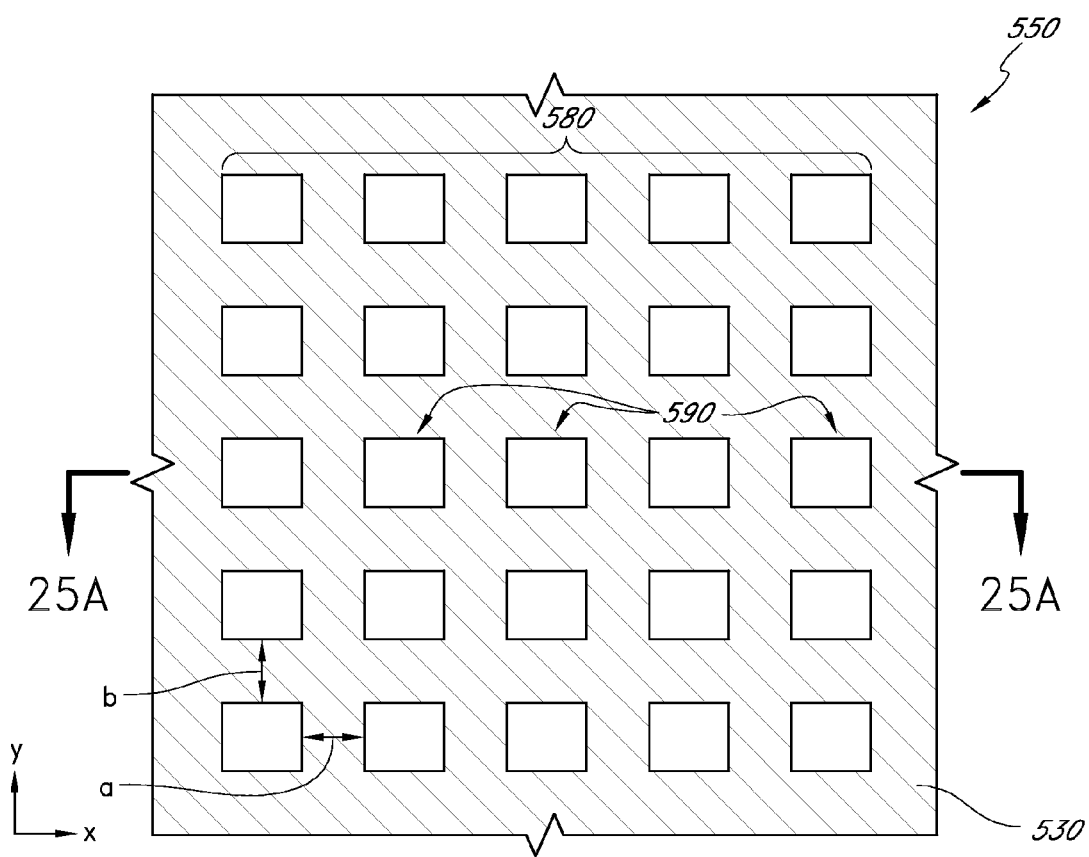

Next, with reference to FIGS. 25A and 25B, the pattern 580 in the layer 510 is transferred to the plate 530 preferably using one or more etch chemistries. FIG. 25A is a cross-sectional side view of FIG. 25B taken along line 25A-25A. The pattern 580 can be transferred from the layer 510 through the adhesive layer 520 to the plate 530 using, e.g., an anisotropic etch. The pattern 580 in the plate 530 defines the reticle 550. The pattern 580 in the reticle 550 may be termed the "imprint pattern." While only a regular array portion of the pattern is shown (representing, e.g., a memory array region), it will be understood that the imprint pattern 580 includes a periodic array of pillars of satisfactory size, configuration and orientation in the plate 530. The imprint pattern 580 may include, at the periphery, a pattern of features that define the peripheral circuitry of the integrated circuit to be formed. For example, the imprint pattern 580 may include landing pads and/or lines. At least some of the lines may be pitch-multiplied.

In the illustrated embodiment of FIGS. 25A and 25B, the spacing between the pillars 590 comprising the reticle 550 is equal along orthogonal surface vectors 'x' and 'y'. That is, with the spacing along vector 'x' equal to 'a' and the spacing along vector 'y' equal to 'b', 'a' is approximately equal to 'b'. Preferably, the pillars 590 are spaced less than about 100 nanometers ("nm") from one another, more preferably from about 50 nm to 60 nm from one another. In some embodiments, 'a' is not equal to 'b'.

It will be appreciated that several alternatives and modifications can be made to the structures and methods of FIGS. 2-25 without departing from the spirit and scope of the invention. The sequence of steps of FIGS. 1-20 for defining closely-spaced holes by employing crossing, pitch multiplied patterns is disclosed in incorporated U.S. patent application Ser. No. 11/134,982 to Abatchev et al. ("Abatchev"), filed May 23, 2005. In the illustrated embodiment, the process is performed on a sacrificial substrate to define closely spaced holes, the inverse image of which is transferred to a reticle to form closely spaced pillars, which can in turn be employed to imprint closely spaced holes on an IC or production substrate.

The skilled artisan will appreciate that in other embodiments, the sequences of FIGS. 22-28 of the incorporated Abatchev application can be employed to form isolated pillars. In this case, the pillar patterns can be formed using the crossing, pitch multiplied spacer patterns directly over the rigid quartz plate (with or without overlying chrome), thus avoiding the need for a sacrificial substrate, bonding and inverse image transfer process.

The advantage of the illustrated sequence, however, is that the complex processing of FIGS. 1-20 can be conducted upon a standard substrate (e.g., silicon wafer) without adjustments to processing equipment to accommodate the rigid reticle plate. In order to withstand the rigors of the subsequently described contact imprinting process, the reticle plate 530 of FIGS. 25A and 25B preferably has a thickness of at least about 0.25 inches.

Forming a Pattern of Pillars in an Imprint Reticle by e-beam Lithography

In another embodiment of the invention, e-beam lithography and spacer material are used to form a pattern of closely-spaced features in an imprint reticle (or template) for use in contact imprint lithography. First, e-beam lithography is used to define a pattern of isolated features, preferably pillars, in a photodefinable layer overlying a substrate, in this case an imprint reticle plate. The dimensions of the pillars are preferably selected to form containers of desirable sizes in another substrate during imprint lithography. Next, a conformal spacer layer is deposited over the pattern of features and etched to form spacers around each of the pillars, thereby forming an altered pattern of pillars. The altered pattern is subsequently transferred to the substrate through one or more etch chemistries. In the illustrated embodiments, the substrate defines the imprint reticle plate.

In preferred embodiments, e-beam is used to define a pattern of pillars in a photodefinable layer, and one or more etch chemistries are used to transfer the pattern to the underlying substrate (reticle plate) through one or more intervening layers. The intervening layers may include, without limitation, amorphous carbon, amorphous silicon, dielectric anti-reflective coating (DARC) material and bottom anti-reflective coating (BARC) material. The combinations of layers may be selected as desired in particular circumstances.

With reference to FIGS. 26A-26G, in one embodiment of the invention, a pattern of closely-spaced pillars is formed in a metal layer overlying an imprint reticle plate. The plate is preferably quartz. The pillars are preferably formed of a metal or metal alloy, most preferably chrome. The reticle plate preferably has a thickness of at least 0.25 inches in order to withstand the contact imprinting process described below with respect to FIGS. 29A-31B.

Figure 26A:
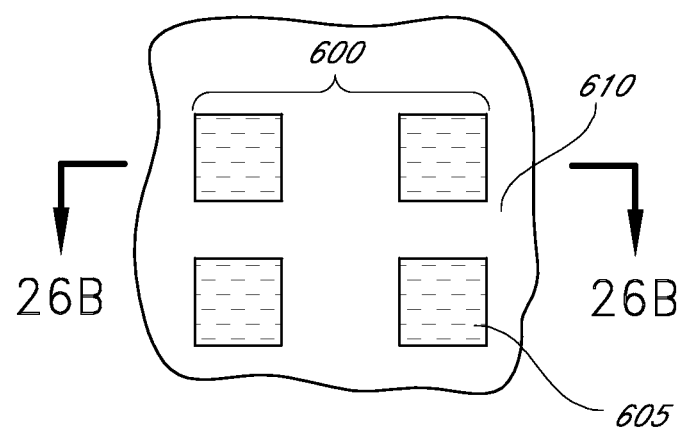
FIGS. 26A-26G are schematic, cross-sectional side and top plan views of a sequence of steps for forming an imprint reticle comprising a pattern of chrome pillars.
Figure 26B:
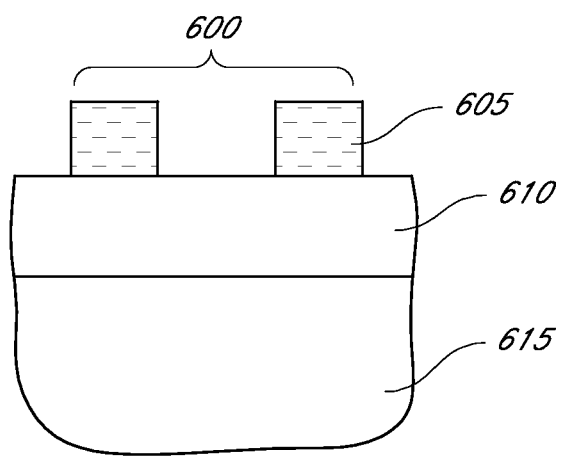

With reference to FIGS. 26A and 26B, a pattern 600 of pillars 605 is formed (or defined) in a photoresist (or photodefinable) layer using e-beam lithography. The pillars 605 in the illustrated embodiment have square footprints (i.e., equal lengths and widths), though footprints of other geometries (e.g., rectangular, circular, oval) and/or dimensions (i.e., lengths and widths) are possible. The pillars 605 are spaced preferably spaced by about 30 nm to 150 nm from one another, more preferably from about 30 nm to 80 nm. The pillars 605 overlie a chrome layer 610, that in turn overlies a quartz substrate or reticle plate 615.

Figure 26C:
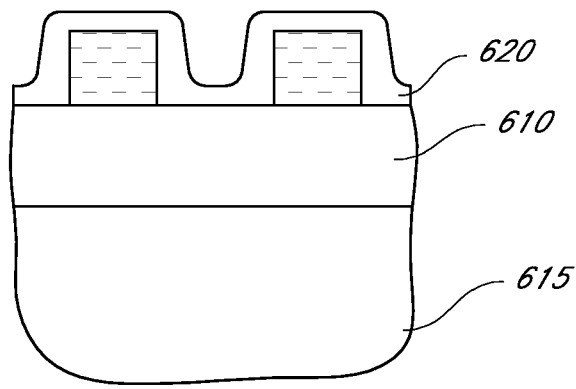
Figure 26D:
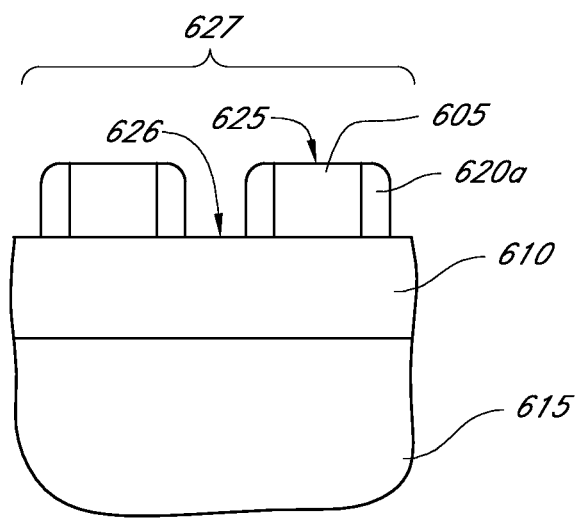

Next, with reference to FIG. 26C, a layer 620 of spacer material (e.g., silicon oxide, silicon nitride) is deposited over the pillars 605, as previously described in the context of FIG. 7. The spacer material is preferably a low temperature oxide material, such as $SiO_2$ formed by, e.g., atomic layer deposition (ALD). Spacers 620a, i.e., the material extending or originally formed extending from sidewalls of another material, are then formed on the sides of the pillars 605. The spacer formation is accomplished by conformal deposition and preferentially etching the spacer material from the horizontal surfaces 625 and 626 in a directional (or anisotropic) spacer etch, as shown in FIG. 26D, thus creating an altered pattern of pillars 627. The anisotropic etch is performed using a standard oxide spacer etching chemistry, such as a fluorocarbon plasma containing, e.g., $CF_4/CHF_3$, $C_4F_8/CH_2F_2$ or $CHF_3/Ar$ plasma. In other arrangements (not shown), sidewall spacers can be formed by covering top surfaces of mandrels and reacting exposed sidewalls with a chemical that forms an expanded compound, such as by oxidizing silicon sidewalls.

Figure 26E:
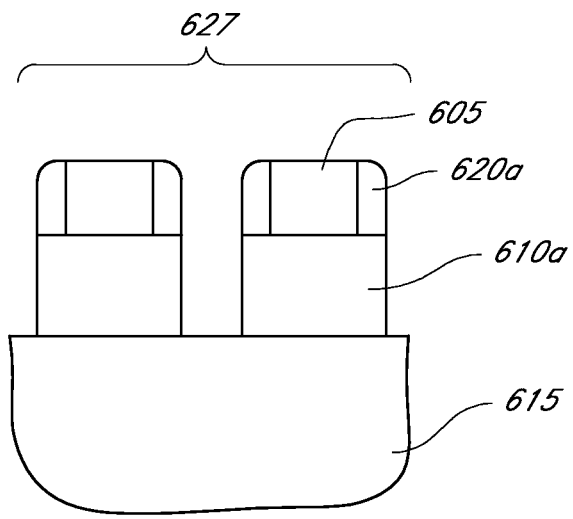
Figure 26F:
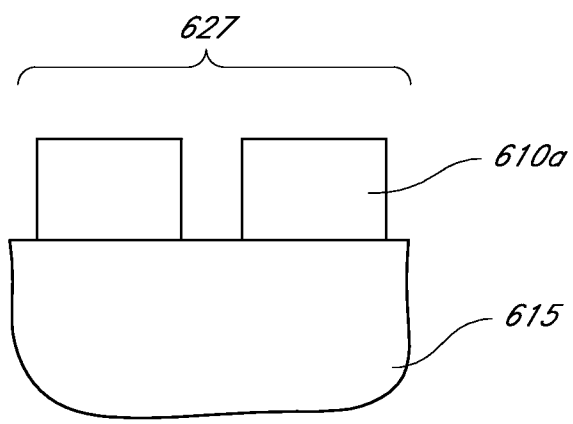
Figure 26G:
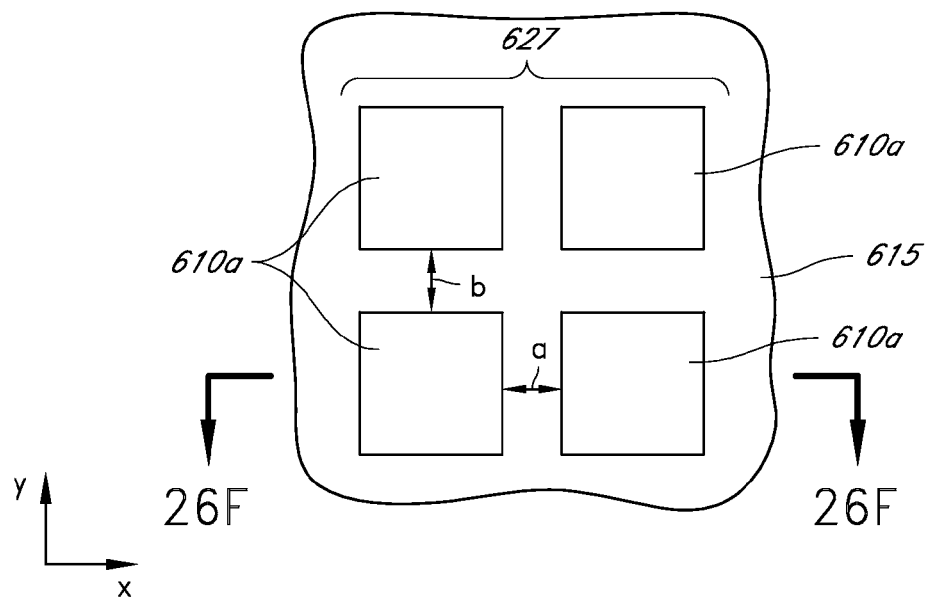

Next, the altered pattern of pillars 627 is transferred to the chrome layer 610 by an anisotropic etch, as shown in FIG. 26E. To transfer the altered pattern 627 to the chrome layer 610, the chrome layer 610 is anisotropically etched using, e.g., a wet chemical etchant, such as CR-14, available from Transene Co. In the illustrated embodiment, the anisotropic etch is selective for chrome and does not substantially etch the quartz substrate 615. However, in some embodiments, the anisotropic etch transfers the altered pattern 627 into the quartz plate 615. In some embodiments, the anisotropic etch into the chrome layer 610 simultaneously removes the mask pillars 605 and spacers 620a. In the illustrated embodiment of FIGS. 26F and 26G, following transfer of the altered pattern 627 into the chrome layer 610, remaining portions of the pillars 605 and spacers 620a are removed by, e.g., an etching chemistry selective for the material comprising the pillars 605 and spacers 620a, or by refilling and chemical mechanical polishing (CMP). Consequently, the altered pattern 627 of chrome pillars 610a is formed on the quartz plate 615. The pillars 610a comprising the altered pattern 627 are preferably spaced closer to one another than the pillars 605 of the pattern 600. In the illustrated embodiment, the spacing between the pillars 610a is equal along orthogonal surface vectors 'x' and 'y'. That is, with spacing along vector 'x' equal 'a' and the spacing along vector 'y' equal 'b', 'a' is approximately equal to 'b'. Preferably, the pillars 610a are spaced from about 2 nm to 25 nm from one another, more preferably from about 5 nm to 10 nm. In some embodiments, 'a' is not equal to 'b'.

In the illustrated embodiment, the combination of chrome pillars 610a and quartz substrate 615 defines the imprint reticle. In some embodiments, the quartz substrate is attached to an additional support structure configured for use with contact imprint lithography machinery. In such a case, the combination of chrome pillars 610a, quartz plate 615 and support structure (not shown) defines the imprint reticle.

While the illustrated embodiment of FIGS. 26A-26G employs one mask layer and spacers thereover, the skilled artisan will appreciate that other masking layers may be used. To illustrate this point, with reference to FIGS. 27A-27I, in an alternative embodiment of the invention, a pattern of pillars 630 is formed in a photodefinable layer overlying, in sequence: a hard mask layer 640 comprised of an inorganic material (e.g., DARC); a temporary layer 642 formed of, e.g., amorphous carbon; a chrome layer 644; and a quartz plate or substrate 646.

Figure 27A:
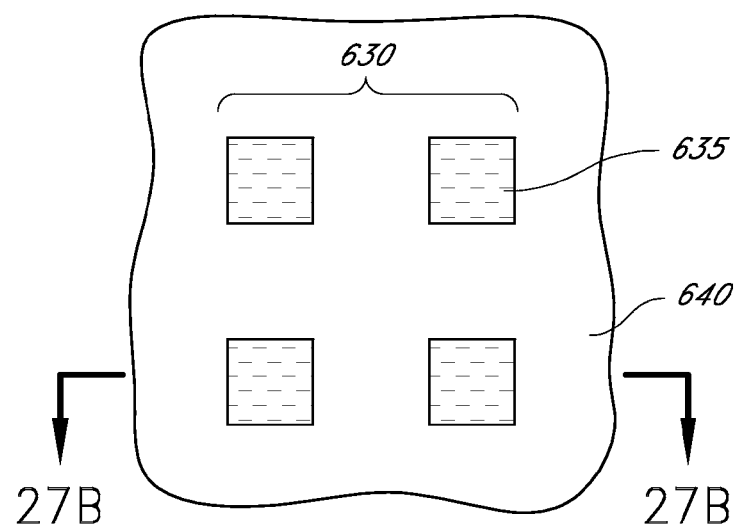
FIGS. 27A-27I are schematic, cross-sectional side and top plan views of a sequence of steps for forming an imprint reticle comprising a pattern of chrome pillars.
Figure 27B:
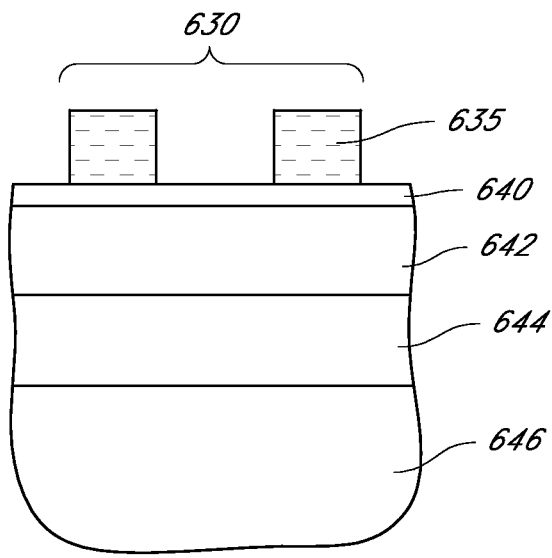
Figure 27C:
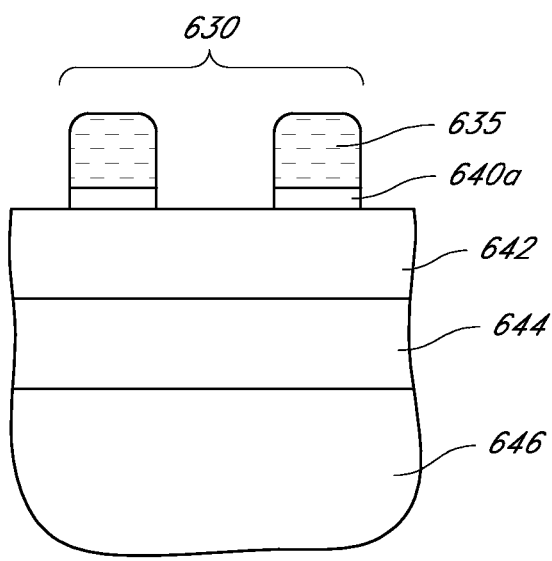
Figure 27D:
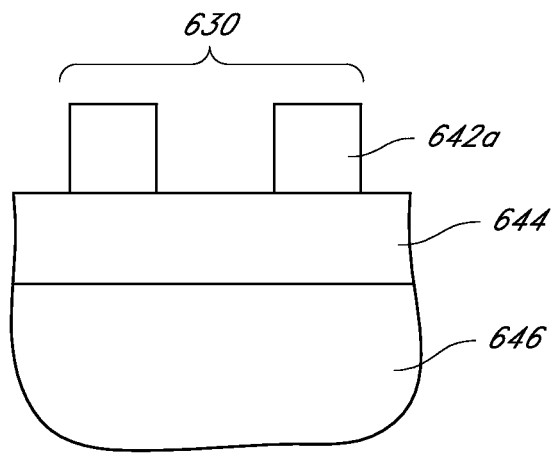

With reference to FIGS. 27A and 27B, a pattern 630 of pillars 635 is formed in a photoresist layer using e-beam lithography. The resist pillars 635 in the illustrated embodiment have square footprints. However, it will be appreciated that other geometries and dimensions are possible. Next, the pattern 630 in the photodefinable layer is transferred to the hard mask layer 640, as shown in FIG. 27C, to define hard mask pillars 640a. The pattern transfer is preferably accomplished using an anisotropic etch, such as an etch using, e.g., a fluorocarbon plasma. If the hard mask layer 640 is suitably thin, a wet (isotropic) etch may be sufficient to effect the pattern transfer. Preferred fluorocarbon plasma etch chemistries include $CFH_3$ $CF_2H_2$ and $CF_3H$. Next, as shown in FIG. 27D, the pattern 630 is transferred to the temporary layer 642 using an anisotropic etch, which can simultaneously remove the photodefinable layer. For example, $SO_2$ or other oxygen-based plasma can etch both carbon and resist. In some embodiments, any remaining hard mask pillars 640a (and photodefinable layer) may be subsequently removed. Consequently, the pattern 630 is formed in the temporary layer 642, as shown in FIG. 27D. The pattern 630 in the temporary layer 642 comprises pillars 642a with substantially similar dimensions as the pillars 635 in the photodefinable layer.

Figure 27E:
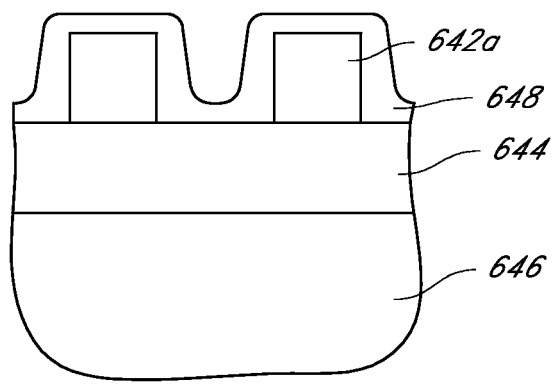
Figure 27F:
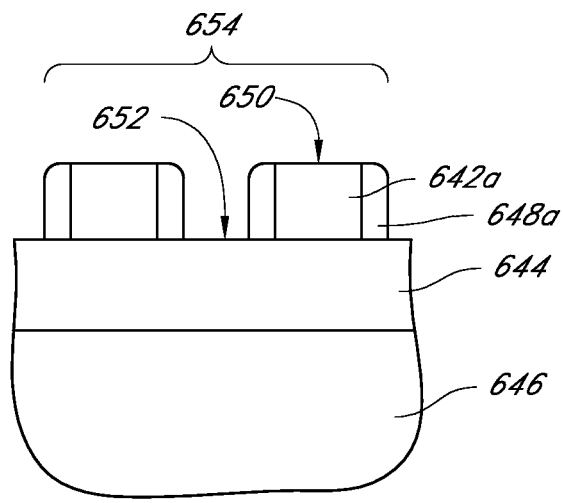

Next, with reference to FIGS. 27E and 27F, a layer 648 of spacer material is deposited over the pillars 642a in the temporary layer 642 and preferentially etched from the horizontal surfaces 650 and 652 to create spacers 648a around the pillars 642a. The combination of pillars 642a and spacers 648a defines an altered pattern of pillars 654. Since the carbon of the temporary layer 642 can withstand more aggressive processing, a wider selection of materials is available for the spacers 648a. For example, the spacers 648a can comprise a form of silicon oxide, such as, e.g., silicon dioxide ($SiO_2$).

Figure 27G:
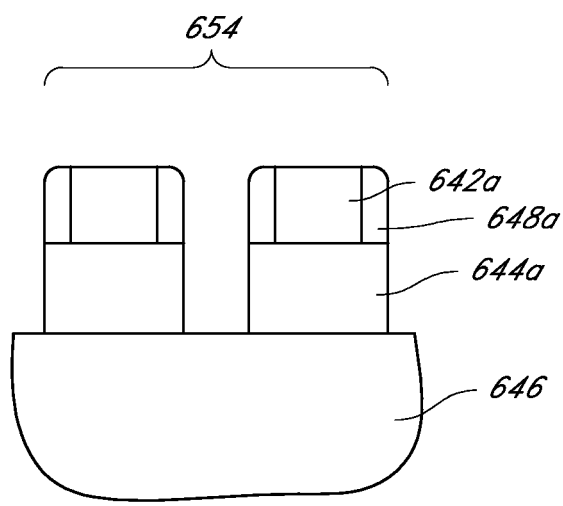
Figure 27H:
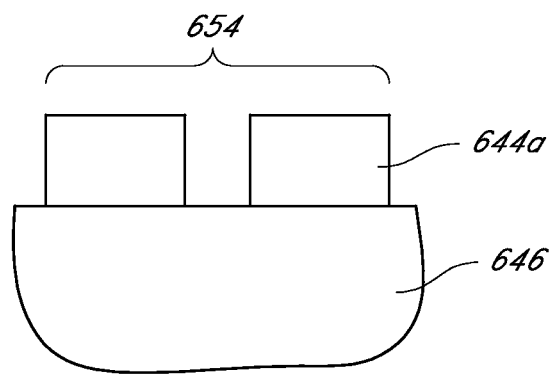
Figure 27I:
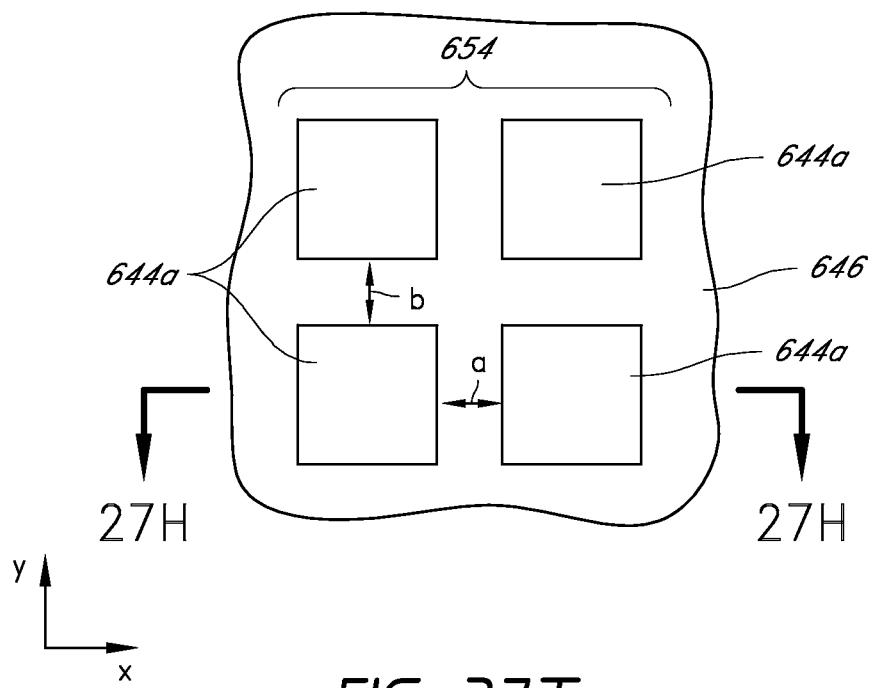

Next, as shown in FIG. 27G, the altered pattern 654 is transferred to the chrome layer 644, preferably by an anisotropic etch. In the illustrated embodiment, the anisotropic etch is selective for chrome and does not substantially etch the quartz plate 646. However, in some embodiments, the anisotropic etch transfers the altered pattern 654 into the quartz substrate 646. In some embodiments, the anisotropic etch into the chrome layer 644 simultaneously removes the mask pillars 642a and spacers 648a. In the illustrated embodiment of FIGS. 27H and 27I, following transfer of the altered pattern 654 into the chrome layer 642, remaining portions of the pillars 642a and spacers 648a are removed by, e.g., an etching chemistry selective for the material comprising the pillars and spacers. Consequently, an altered pattern 654 of chrome pillars 644a is formed on the quartz plate 646. The chrome pillars 644a having the altered pattern 654 are preferably spaced closer to one another than the pillars 635 of the pattern 630 in the photodefinable layer. In the illustrated embodiment, the spacing between the pillars 644a is equal along orthogonal surface vectors 'x' and 'y'. That is, with spacing along vector 'x' equal to 'a' and the spacing along vector 'y' equal to 'b', 'a' is approximately equal to 'b'. Preferably, the pillars 644a are spaced from about 2 nm to 25 nm from one another, more preferably from about 5 nm to 10 nm. In some embodiments, 'a' is not equal to 'b'.

In the illustrated embodiment, the combination of chrome pillars 644a and quartz substrate 646 defines the imprint reticle. In some embodiments, the quartz substrate 646 is attached to another support structure configured for use in contact imprint machinery. In such a case, the combination of chrome pillars 644a, quartz plate 646 and support structure (not shown) defines the imprint reticle.

With reference to FIGS. 28A-28G, in an embodiment of the invention, a pattern of pillars is defined in a quartz plate, without overlying metal.

Figure 28A:
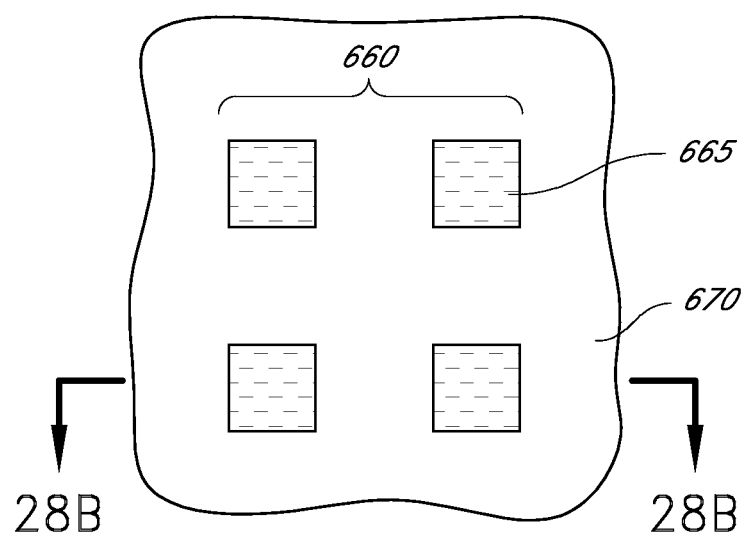
FIGS. 28A-28G are schematic, cross-sectional side and top plan views of a sequence of steps for forming an imprint reticle comprising a pattern of quartz pillars.
Figure 28B:
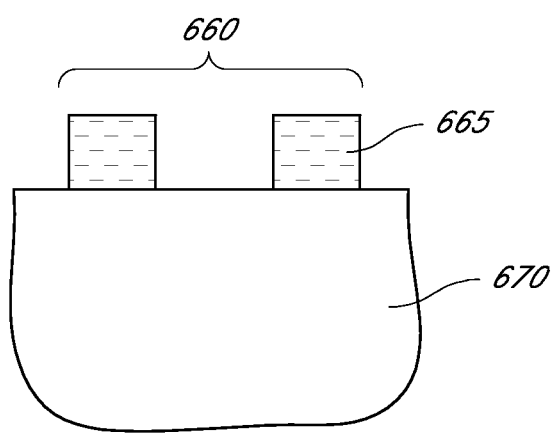

With reference to FIGS. 28A and 28B, a pattern 660 of pillars 665 is formed in a photoresist layer using e-beam lithography. The pillars 665 in the illustrated embodiment have square footprints (i.e., equal lengths and widths), though footprints of other geometries and/or dimensions are possible. The pillars 665 overlie a quartz substrate or reticle plate 670.

Figure 28C:
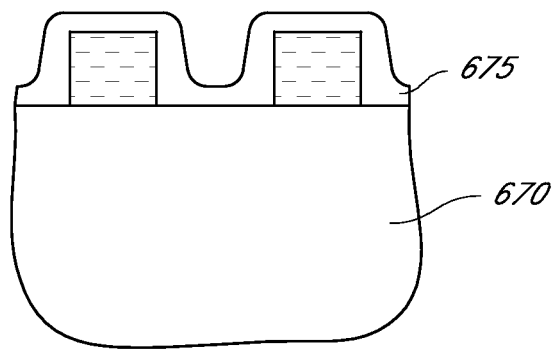
Figure 28D:
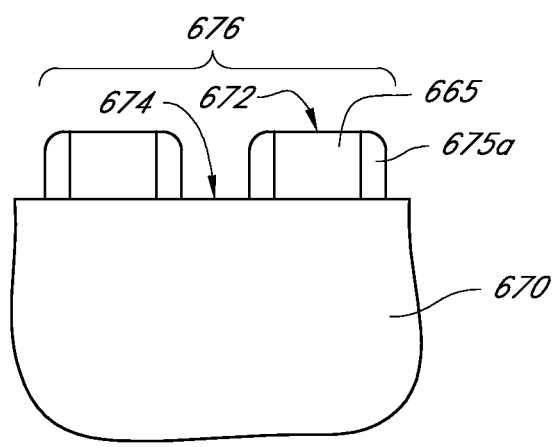

Next, with reference to FIG. 28C, a layer 675 of spacer material (e.g., low temperature silicon oxide) is deposited over the pillars 665. Spacers 675a are then formed on the sides of the pillars 665 by preferentially etching the spacer material from the horizontal surfaces 672 and 674 in an anisotropic etch, as shown in FIG. 28D, thereby creating an altered pattern of pillars 676. The anisotropic etch is performed using, e.g., a $HBr/O_2$ plasma or a $SO_2$-containing plasma.

Figure 28E:
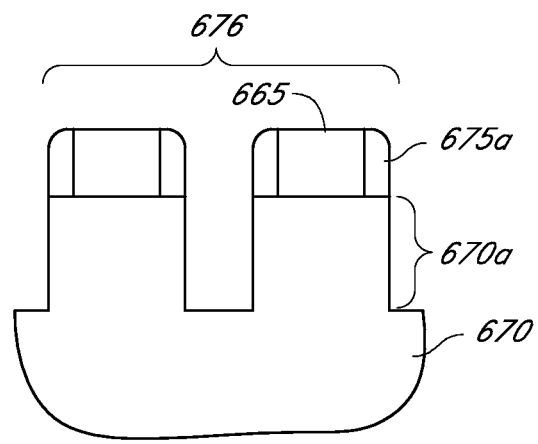
Figure 28F:
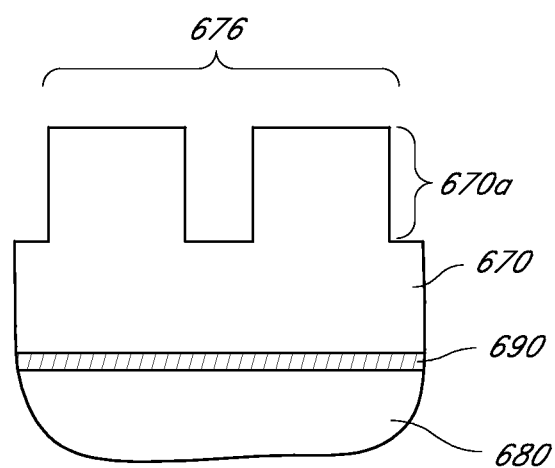
Figure 28G:
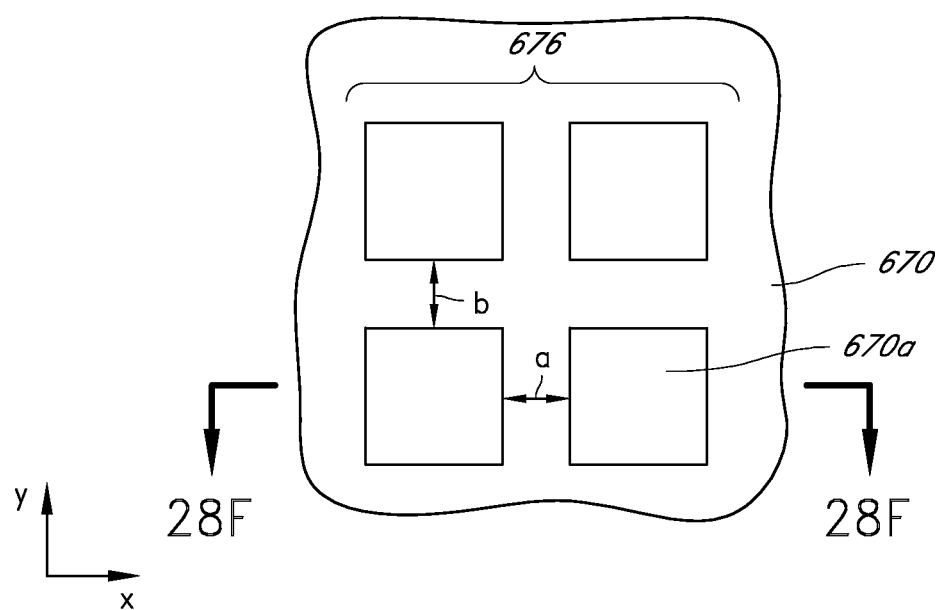

Next, the altered pattern of pillars 627 is transferred to the quartz plate 670 using an anisotropic etch, as shown in FIG. 28E. To transfer the altered pattern 676 to the quartz plate 670, the quartz plate 670 is anisotropically etched using, e.g., a fluorocarbon plasma. In some embodiments, the anisotropic etch into the quartz plate 670 simultaneously removes the mask pillars 665 and spacers 675a. In the illustrated embodiment of FIGS. 28F and 28G, following transfer of the altered pattern 676 into the quartz plate 670, the remaining portions of the pillars 665 and spacers 675a are removed by, e.g., an etching chemistry selective for the material comprising the pillars 665 and spacers 675a. Consequently, the altered pattern 676 is transferred to the quartz plate 670, the altered pattern comprising quartz pillars 670a. The pillars 670a are preferably closer to one another than the pillars 665 comprising the pattern 660. In the illustrated embodiment, the spacing between the pillars 670a is equal along orthogonal surface vectors 'x' and 'y'. That is, with the spacing along vector 'x' equal to 'a' and the spacing along vector 'y' equal to 'b', 'a' is approximately equal to 'b'. Preferably, the pillars 670a are spaced from about 2 nm to 25 nm from one another, more preferably from about 5 nm to 10 nm. In some embodiments, 'a' is not equal to 'b'.

In the illustrated embodiment, the quartz plate 670 is attached to a support structure 680 through an adhesive layer 690 (as described above). The support structure 680 is configured for use with contact imprint machinery. The quartz pillars 670a, quartz plate 670 and support structure 680 together define the imprint reticle. However, in some embodiments the support structure 680 and adhesive layer 690 may be omitted, and the pillars 670a and substrate 670 define the reticle.

While methods of the illustrated embodiments have been used to form closely-spaced pillars, it will be appreciated that other structures in addition to those shown in FIGS. 26-28 can be formed in the imprint reticle. For example, lines may be formed at the periphery of a pattern of closely-spaced pillars. In some embodiment, at least some of the lines are pitch multiplied. In other embodiments, at least some of the features overlap the pillars, with the degree of overlap selected as desired.

It will be appreciated that several alternatives and modifications can be made to the structures illustrated in FIGS. 26-28 without departing from the spirit and scope of the invention. For example, in FIGS. 28A-28G, one or more temporary and/or hard mask layers may be included below the layer of photodefinable material. To this end, a primary mask layer formed of, e.g., amorphous carbon, may be included between the quartz substrate 670 and the photodefinable layer comprising pillars 665. Amorphous carbon can better withstand high temperatures during deposition and energetic spacer etches, opening the process up to a wider variety of spacer materials. Additionally, one or more hard mask layers formed of, e.g., DARC, may be included over and/or below the primary mask layer. As another example, while pillars have been illustrated, isolated island structures with any shape and dimension may be formed. For example, the quartz template (or reticle) of FIGS. 28F and 28G may include columns with circular footprints.

As another example, containers, as opposed to pillars, may be defined by e-beam lithography in the photodefinable layer of FIGS. 27A and 27B. In this respect, an imprint reticle comprising a pattern of containers may be formed. Such hole patterns can be useful, e.g., for imprinting patterns of pillars on substrates for defining, e.g., stud capacitors.

Imprinting Features on a Semiconductor Device

In preferred embodiments of the invention, a reticle, such as that produced by any of the processes of FIGS. 2-25 or FIGS. 26-28, is utilized to produce a periodic array of densely-spaced holes or containers of predetermined sizes in a semiconductor device by contact imprint lithography. As discussed in the context of FIGS. 2-25, a pattern of closely-spaced, isolated pillars is formed by a masking sequence including sidewall spacer formats to define an imprint reticle. The imprint reticle is used to imprint the pattern of isolated pillars into a transfer layer overlying an IC or production substrate. The pattern in the transfer layer is then transferred to the IC substrate, optionally through a series of protective layers using desirable etching chemistries, to form a pattern of holes in the IC substrate.

Figure 29A:
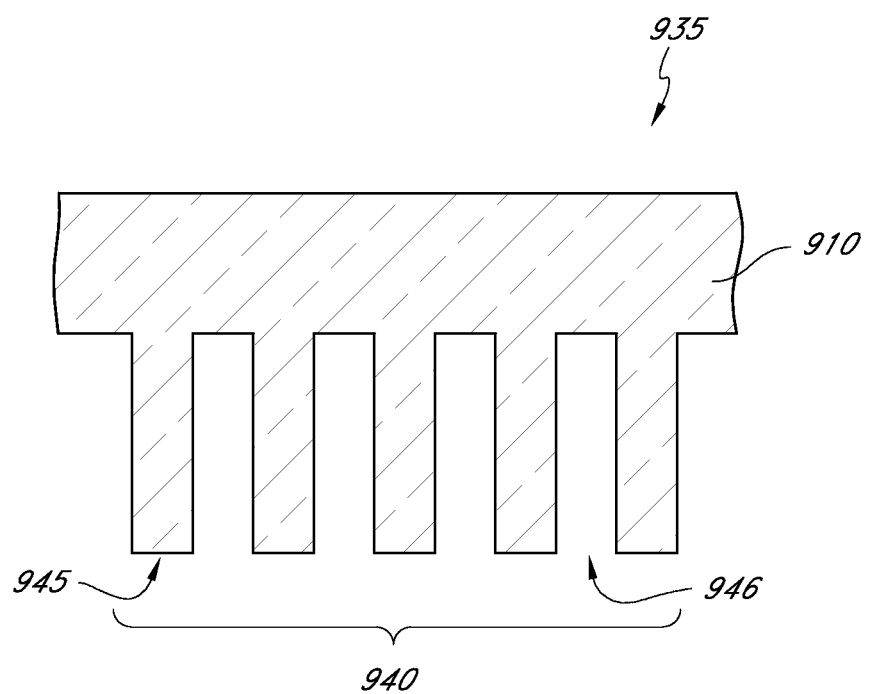
FIGS. 29A and 29B are schematic, cross-sectional side views of a partially formed integrated circuit before and after bringing the imprint reticle of FIG. 25, 26F, 27H or 28F into contact with a transfer layer overlying a substrate in which integrated circuits (ICs) are to be formed.
Figure 29A:
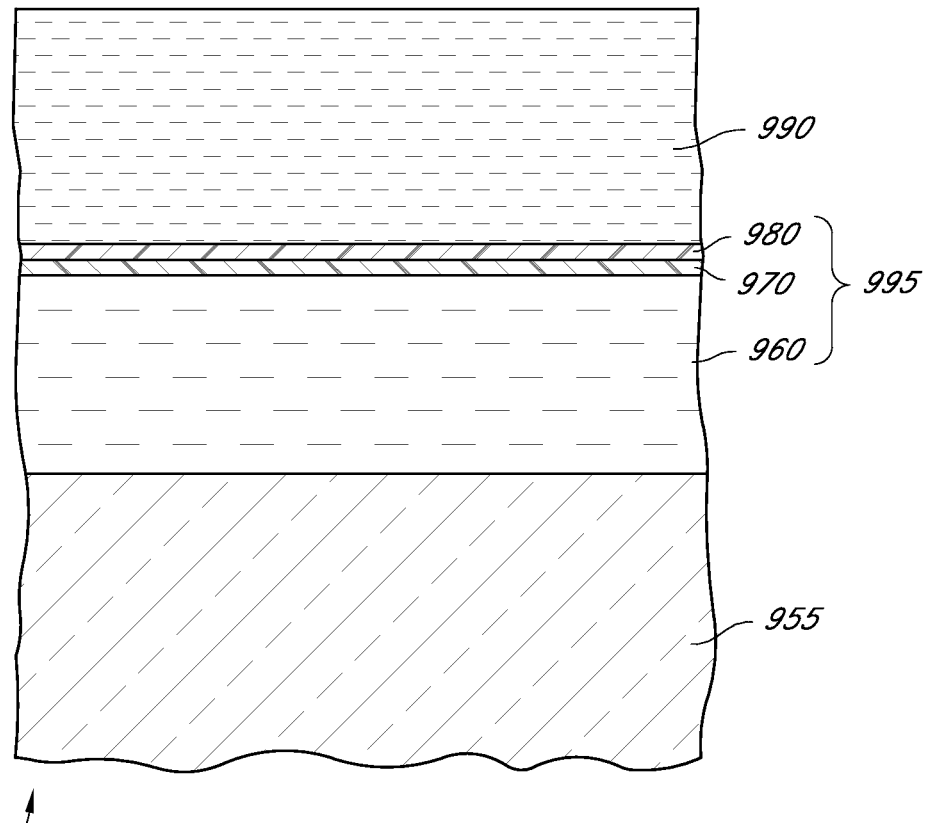
Figure 29B:
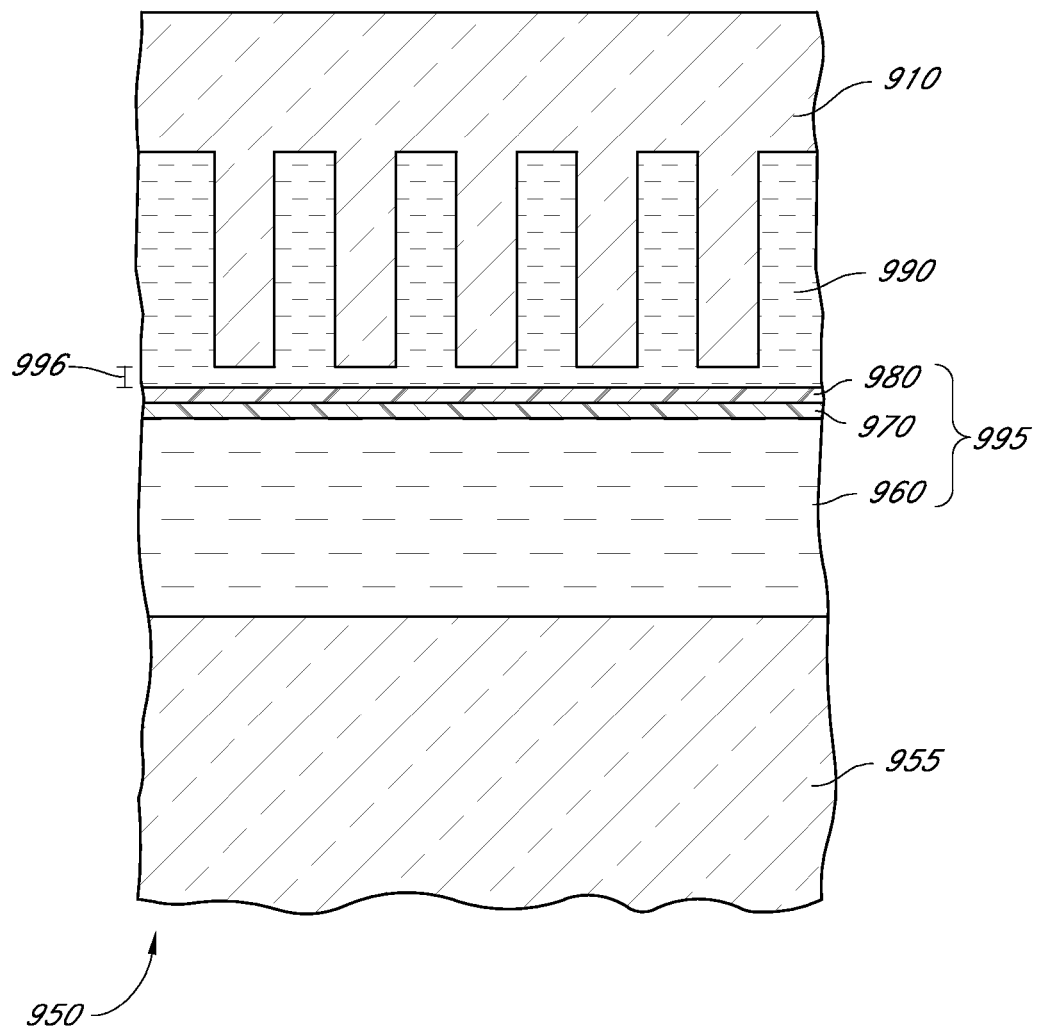

With reference to FIGS. 29A and 29B, features on a substrate 955 at least partially defining an integrated circuit 950 are formed by bringing a quartz reticle 935 into contact with a transfer layer 990 overlying a series of mask layers 995, which further overlie a semiconductor or IC substrate 955. The reticle 935 comprises a quartz plate 910 comprising a pattern 940 of closely-spaced pillars 945 and spaces 946 separating the pillars. While the reticle 935 of the illustrated embodiment is formed of quartz, it will be appreciated that a reticle comprising a metallic layer over quartz, preferably chrome over quartz, may be used. In the illustrated embodiment, the transfer layer 990 overlies a protective layer 980 made of an anti-reflecting coating (ARC), e.g., bottom anti-reflective coating (BARC), which overlies a hard mask layer 970, which overlies a primary mask layer 960, which overlies the substrate 955 to be etched through a mask. The IC substrate 955 preferably includes an upper structural layer, such as TEO or BPSG, in which container shapes are to be formed and subsequently lined with capacitor electrodes and dielectric layers.

The BARC layer 980 is used to control light reflections if and when UV radiation is used to harden the transfer layer 990. The transfer layer is preferably deformable under pressure and does not adhere well to the surface of the reticle 935, especially as the reticle 935 is removed from the substrate 955. Since the transfer layer 990 is deformable, the transfer layer 990 will fill the spaces 946 of the pattern 940 of isolated pillars 945 when the reticle 935 and the IC substrate 955 come together. The transfer layer 990 is preferably a photocurable or photosensitive material, such as a photoresist material. The transfer layer 990 may be formed from conventional photoresist material that is curable by exposure to UV light, such as a curable organosilicon material, though photoresist material that is curable through the application of heat and/or pressure may also be used. Alternatively, the mask layers 995 may include fewer layers than those in the illustrated embodiment. However, better pattern and transfer fidelity can be achieved by transferring the pattern 997 (FIG. 29C) by way of the illustrated mask layers 995.

The layers discussed herein can be formed by various methods. For example, spin-on-coating processes can be used to form the transfer layer 990. Various vapor deposition processes, preferably chemical vapor deposition (CVD) processes, can be used to form the protective layer 980, the hard mask layer 970 and the primary mask layer 960.

A preferred material for the primary mask layer 960 is amorphous carbon. In the preferred embodiment, the primary mask layer 960 comprises a material having good etch selectivity relative to the substrate 955, and vice versa, to allow for an effective transfer and later selective removal. The hard mask layer 970 is preferably preferentially etchable relative to the primary mask layer 960. The hard mask layer 970 is preferably formed of a material that can be deposited at temperatures well tolerated by the underlying carbon, preferably performed at less than about 550° C. and, more preferably, at less than about 450° C. and, most preferably, at less than about 400° C. The hard mask layer 970 is preferably formed of an inorganic material, with examples including silicon oxide ($SiO_2$), a dielectric anti-reflective coating (DARC) (e.g., a silicon oxynitride), a silicon oxide or silicon. The protective layer 980 is preferably formed of an anti-reflecting coating (ARC), e.g., organic bottom anti-reflective coating (BARC).

As noted above, in common methods of transferring patterns, the mask and the underlying substrate are exposed to etchant, which can wear away a mask before the pattern transfer is complete. These difficulties are exacerbated where the substrate comprises multiple different materials to be etched. It is due to its excellent etch selectivity relative to a variety of materials, including oxides, nitrides and silicon, that the primary mask layer 960 is preferably formed of amorphous carbon and, more preferably, transparent carbon.

Figure 29C:
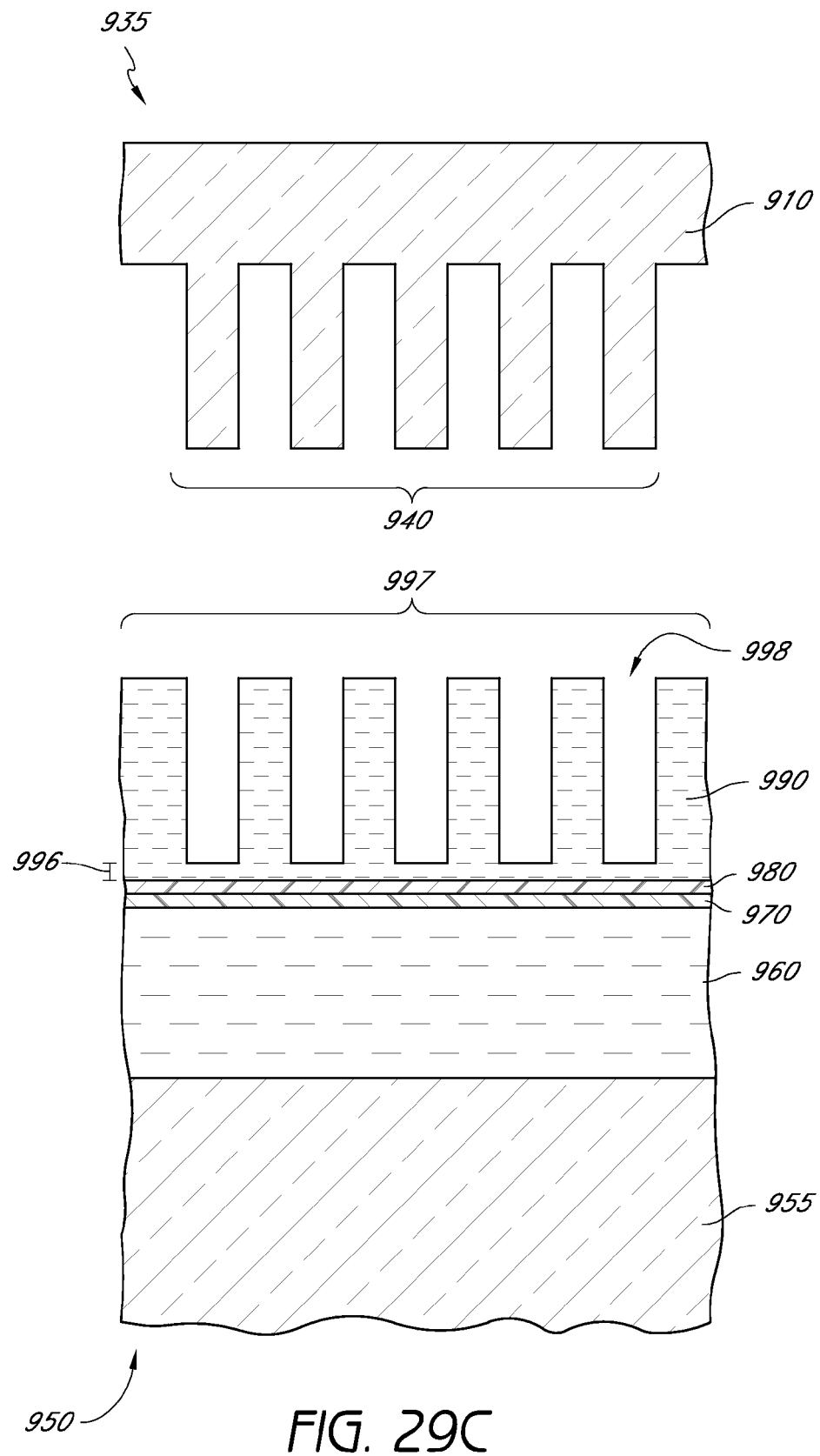
FIG. 29C is a schematic, cross-sectional side view of the partially formed integrated circuit of FIG. 29B after removing the imprint reticle from the transfer layer.

With continued reference to FIGS. 29A and 29B, the IC substrate 955 and the reticle 935 may be maintained substantially parallel, and in close proximity, to one another. The transfer layer 990 and the reticle 935 may be contacted with minimal pressure so that the transfer layer 990 deforms into the imprint pattern 940 of the reticle 935. If the transfer layer 990 is made of UV sensitive material, UV radiation is provided through the reticle 935 to cure the transfer layer 990. Exposure to UV radiation hardens the transfer layer 990, forming an imprinted pattern 997 including features (holes 998, as illustrated), in the transfer layer 990, as shown in FIG. 29C. Alternatively, the transfer layer 990 may be cured through the application of heat, pressure and/or infrared radiation. The imprinted pattern 997 is a negative or inverse image of the pattern 940 in the reticle 935.

With continued reference to FIG. 29C, the reticle 935 is preferably removed from the semiconductor device 950 after the transfer layer 990 has been hardened through the application of, e.g., UV radiation. The reticle 935 may be separated from the IC substrate 955 without damaging, or otherwise adversely affecting, the imprinted pattern 997. The reticle 935 may be treated with a material that lowers the surface energy of the reticle 935, as known in the art, to assist in separating the reticle 935 from the transfer layer 990 without damaging the imprinted pattern 997. Depending on the height of the features in the reticle pattern 940 relative to the thickness of the transfer layer 990, removal of the reticle 935 from the transfer layer 990 will tend to leave residual (or unpatterned) portions 996 of the transfer layer 990.

In the next phase of methods according to the preferred embodiment, the imprinted pattern 997 in the transfer layer 990 is transferred from the transfer layer 990 to the substrate 955, as shown in FIGS. 30A-30D.

It will be appreciated that the "substrate" to which pattern 997 are transferred can include a layer of a single material, a plurality of layers of different materials, a layer or a plurality of layers having regions of different materials or structures in them, etc. These materials can include semiconductors, insulators, conductors, or combinations thereof. Preferably, an upper layer of the substrate 955 is an insulator and the location of mask features can correspond to the desired location of capacitor containers. Examples of structures formed in the substrate include memory cell arrays and DRAM capacitors therefor.

It will be understood that in common methods of transferring patterns, both the mask and the underlying substrate are exposed to an etchant, which preferentially etches away the substrate material. The etchants, however, also wear away the masking materials, albeit at a slower rate. Thus, over the course of transferring pattern, the mask can be worn away by the etchant before the pattern transfer is complete. In such cases, the primary masking layer 960 is desirable to prevent the mask pattern from being worn away before the pattern transfer complete.

Preferably, the primary masking layer 960 is the masking layer that directly overlies and, due to etch selectivity, is primarily used as the mask for etching the substrate 955. In particular, the primary masking layer 960 is preferably formed of a material that allows good etch selectivity relative to both the immediately overlying hard mask layer 970 and the substrate material 955, thereby allowing: the imprinted pattern 997 to be effectively transferred to it; the primary masking layer 960 to be selectively removed without harming the substrate; and the imprinted pattern 997 to be effectively transferred to the substrate 955. It will be appreciated that a material is considered selectively, or preferentially, etched when the etch rate for that material is at least about 2-3 times greater, preferably at least about 10 times greater, more preferably at least about 20 times greater and, most preferably, at least about 40 times greater than that for surrounding materials.

In addition to selecting appropriate materials for the various layers, the thicknesses of the layers 960-990 are preferably chosen depending upon compatibility with the etch chemistries and process conditions described herein. For example, when transferring a pattern from an overlying layer to an underlying layer by selectively etching the underlying layer, materials from both layers are removed to some degree. Thus, the overlying layer is preferably thick enough so that it is not worn away over the course of the etch of the underlying layer. The selected thickness, of course, depends in part on the level of selectivity of the etch chemistry.

In any of the steps described herein, transferring the imprinted pattern 997 from an overlying level to an underlying level involves forming features in the underlying level that generally correspond to features in the overlying level. For example, the location of holes in the underlying level will generally conform to the location holes in the overlying level, and the location of other features in the underlying level will correspond to the location of similar features in the overlying level. The precise shapes and sizes of features can vary from the overlying level to the underlying level, however. For example, depending upon etch chemistries and conditions, the sizes of and relative spacings between the features forming the transferred pattern can be enlarged or diminished relative to the pattern on the overlying level, while still resembling the same initial "pattern." Thus, even with some changes in the dimensions of the features, the transferred pattern is still considered to be the same pattern as the initial pattern.

In the illustrated embodiment, the transfer layer 990 is formed of a UV curable photoresist material, the protective layer 980 is formed of bottom anti-reflective coating (BARC), the hard mask layer 970 is formed of dielectric anti-reflective coating (DARC), the primary mask layer 960 is formed of amorphous carbon and the substrate 955 includes an upper structural layer of oxide in which the holes or container shapes are to be formed.

Figure 30A:
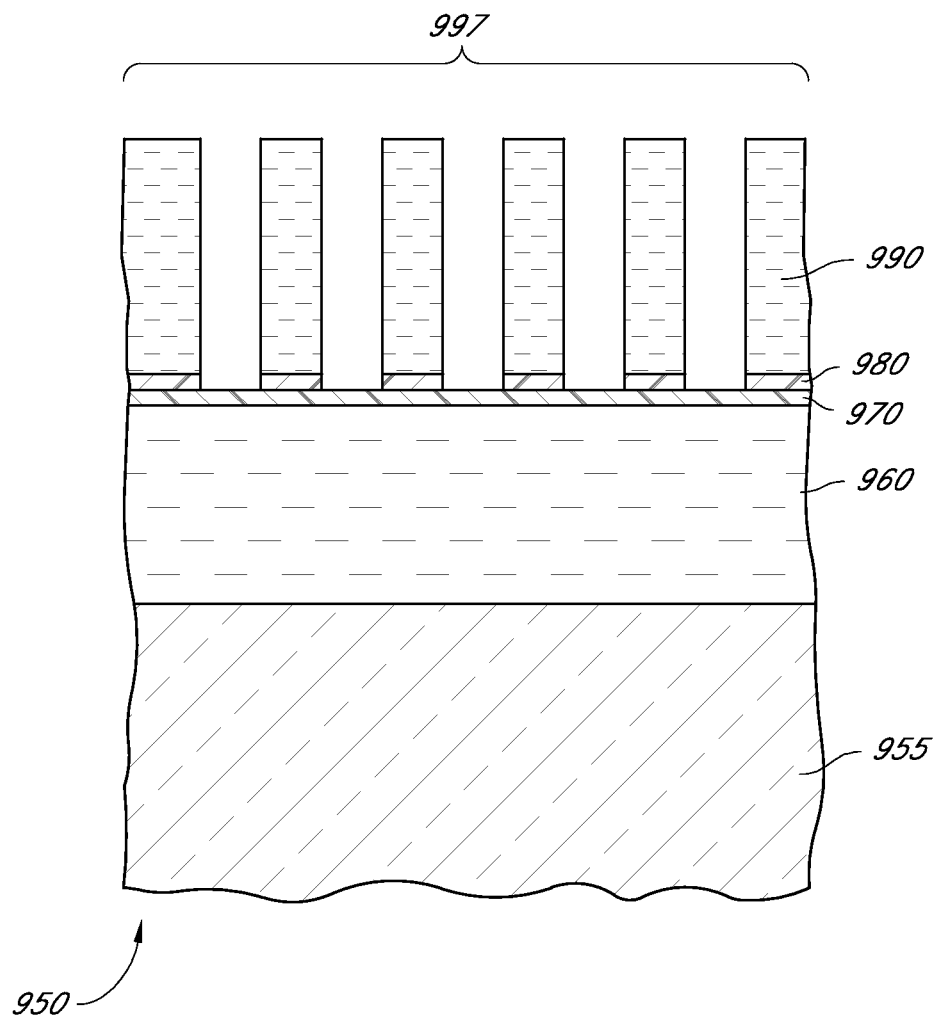
FIG. 30A is a schematic, cross-sectional side view of the partially formed integrated circuit of FIG. 29C after transferring the imprinted pattern from the transfer layer to an underlying protective layer.

With reference to FIG. 30A, the imprinted pattern 997 comprising closely-spaced isolated holes pitch-multiplied in two dimensions, is transferred from the transfer layer 990 to the protective layer 980. Initially, the residual portion 996 of the transfer layer 990 is removed by applying an etch, preferably an anisotropic etch, to the transfer layer 990, which also lowers the thickness of all features, including pattern 997 in the transfer layer 990. Next, an anisotropic etch is performed to define the imprinted pattern 997 in the protective layer 980. The transfer layer 990 and the protective layer 980, if both are organic, are preferably selectively etched through an anisotropic etch, using, e.g., a $HBr/O_2$ plasma or a $SO_2$-containing plasma. If the transfer layer 990 and the protective layer 980 are both organic, as in the illustrated embodiment, the selective anisotropic etch can simultaneously remove the residual portion 996 (FIG. 29C) of the transfer layer 990 and the subsequent uncovered (etched) portions of the protective layer 980, thereby transferring the imprinted pattern 997 to the protective layer 980.

Figure 30B:
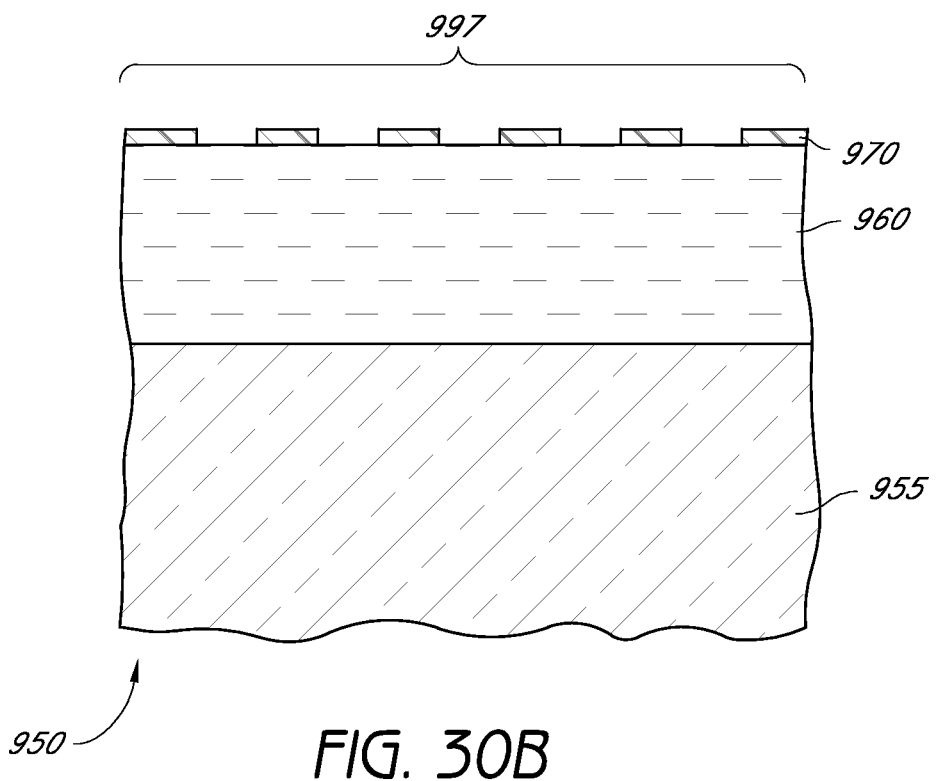
FIG. 30B is a schematic, cross-sectional side view of the partially formed integrated circuit of FIG. 30A after transferring the imprinted pattern from the protective layer to an underlying hard mask layer and removal of overlying mask layers.

With reference to FIG. 30B, the imprinted pattern 997 is transferred from the protective layer 980 to the hard mask layer 970. The pattern transfer is preferably accomplished using an anisotropic etch, such as an etch using a fluorocarbon plasma. Preferred fluorocarbon plasma etch chemistries include $CFH_3$ $CF_2H_2$ and $CF_3H$.

In some cases, performing an etch through the transfer layer 990 can result in polymerization of the transfer layer 990 material. This polymerization can leave deposits around pattern features, thereby distorting features of the imprinted pattern 997. This distortion can be particularly problematic given the small pitches for which pitch multiplication is typically used. As a result, after etching the imprinted pattern 997 into the hard mask layer 970, a cleaning step may be performed to remove remaining portions of the transfer layer 990 and protective layer 980, and any polymerized transfer layer 990 material. If the protective layer 980 and the transfer layer 990 are made of an organic material and the hard mask layer 970 is made of an inorganic material, as in the illustrated embodiment, the transfer layer 990 and the protective layer 980 are removed using, e.g., an isotropic etch with $O_2$ plasma. Because the transfer layer 990, the protective layer 980 and the underlying primary mask layer 960 are preferably all carbon-based materials, this cleaning step can undesirably etch the primary mask layer 960. This is especially a concern where the cleaning is accomplished using an isotropic etch, which can etch the primary mask layer 960 uncontrollably and typically does not form well-defined features. Thus, an additional hard mask layer (not shown) underlying the hard mask layer 970 may be used to protect the primary mask layer 960 during the cleaning step.

Figure 30C:
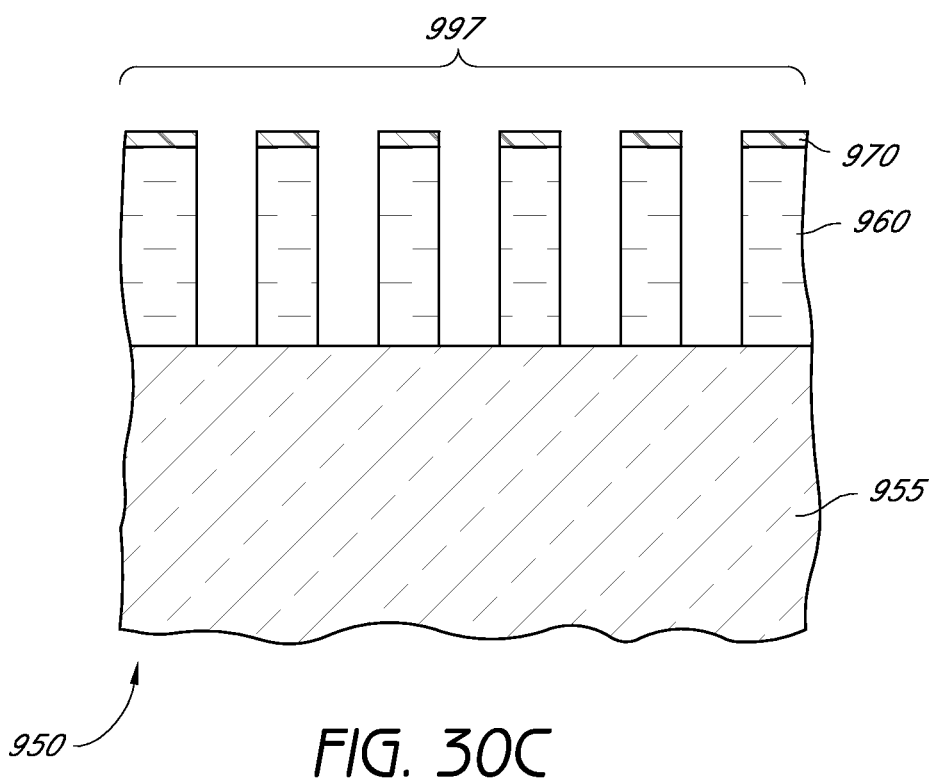
FIG. 30C is a schematic, cross-sectional side view of the partially formed integrated circuit of FIG. 30B after transferring the imprinted pattern from the hard mask layer to a primary mask layer.

With reference to FIG. 30C, the imprinted pattern 997 is transferred down to the primary mask layer 960. To transfer the pattern 997 to the primary mask layer 960, the primary mask layer 960 is anisotropically etched, preferably using a $SO_2$-containing plasma, which can simultaneously remove any remaining transfer layer 990 and protective layer 980 material that was not removed in the previous step. Other suitable etch chemistries include a $Cl_2/O_2$, $HBr/O_2/N_2$, $SiCl_4/O_2/N_2/HBr$, $SiCl_4/O_2$ etch recipes and other oxygen-containing plasmas. However, the $SO_2$-containing plasma is preferably used as it has been found to have excellent selectivity for the amorphous carbon of the primary mask layer 960 relative to the inorganic hard mask layer 970.

Figure 30D:
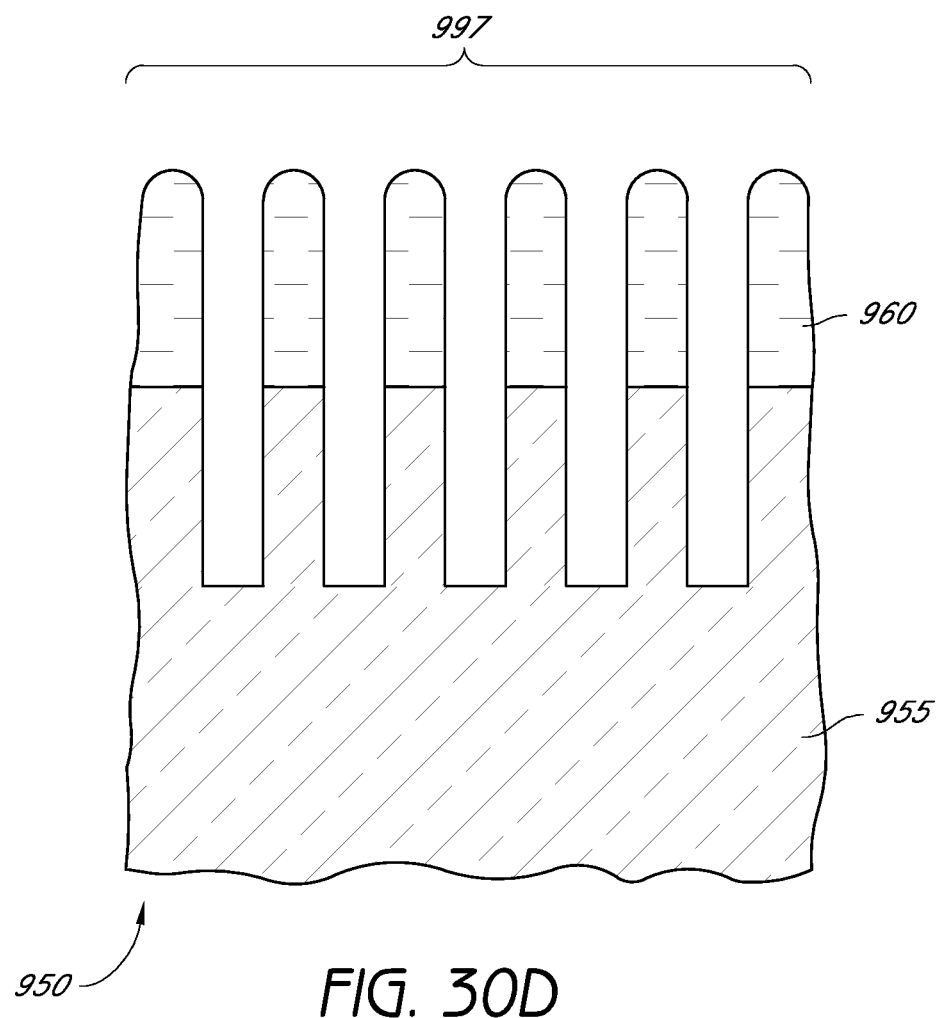
FIG. 30D is a schematic, cross-sectional side view of the partially formed integrated circuit of FIG. 30C after transferring the imprinted pattern from the primary mask layer to the IC substrate.

With reference to FIG. 30D, the imprinted pattern 997 is then preferably transferred from the primary mask layer 960 to the underlying substrate 955. The imprinted pattern 997 is transferred to the substrate 955 using the imprinted pattern 997 in the primary mask layer 960 as a mask. The pattern transfer can be readily accomplished using conventional etches appropriate for the material or materials of the substrate 955. Advantageously, any etch chemistry appropriate for the substrate material(s) can be used. For example, where the substrate comprises an insulator, such as silicon oxide, a fluorocarbon etch comprising $CF_4$ or $C_2F_6$ can be used to etch the substrate. It will be appreciated that, depending upon the chemistry or chemistries used, the hard mask layer 970 may be etched, as shown in FIG. 30D. The amorphous carbon of the primary mask layer 960, however, advantageously offers excellent resistance to conventional etch chemistries, especially those used for etching silicon-containing materials such as silicon, silicon nitride, or silicon oxide. Accordingly, the primary mask layer 960 can be effectively used as a mask for etching for forming high aspect ratio containers.

Figure 31A:
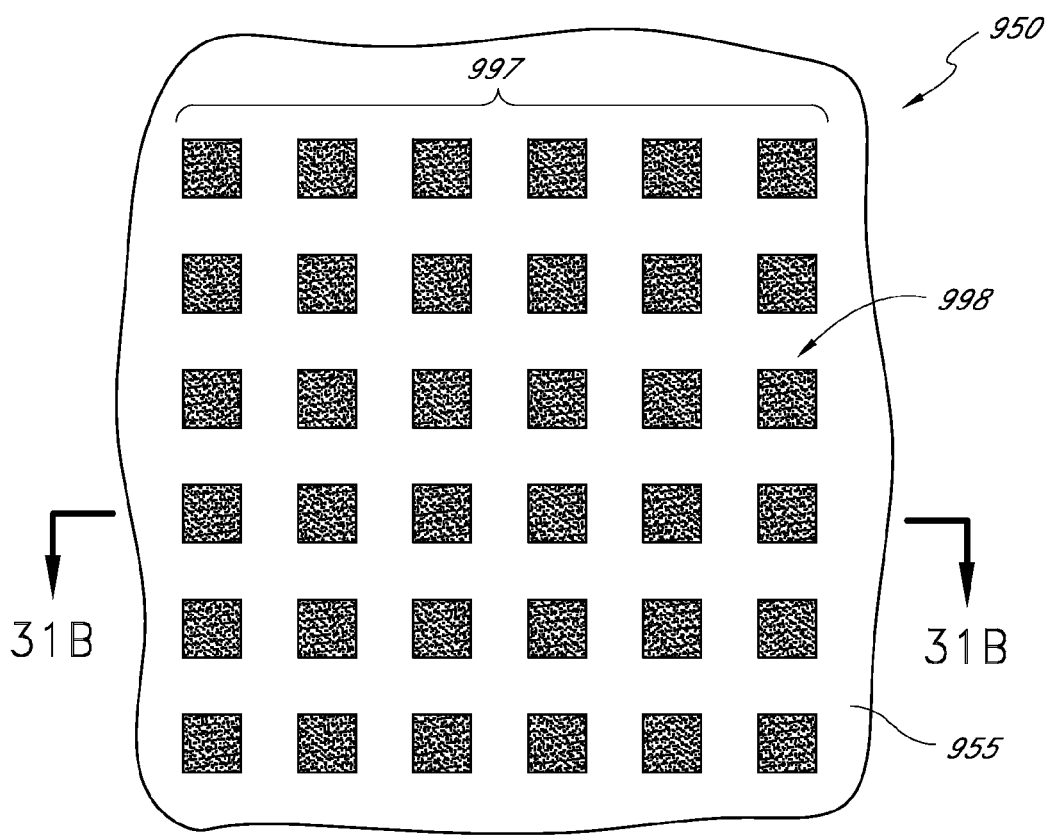
FIGS. 31A and 31B are schematic, top plan and cross-sectional side views of the partially formed integrated circuit of FIG. 30D after removing the primary mask layer overlying the IC substrate, leaving a pattern of closely spaced holes that can be used, e.g., for forming container-shaped capacitors.
Figure 31B:
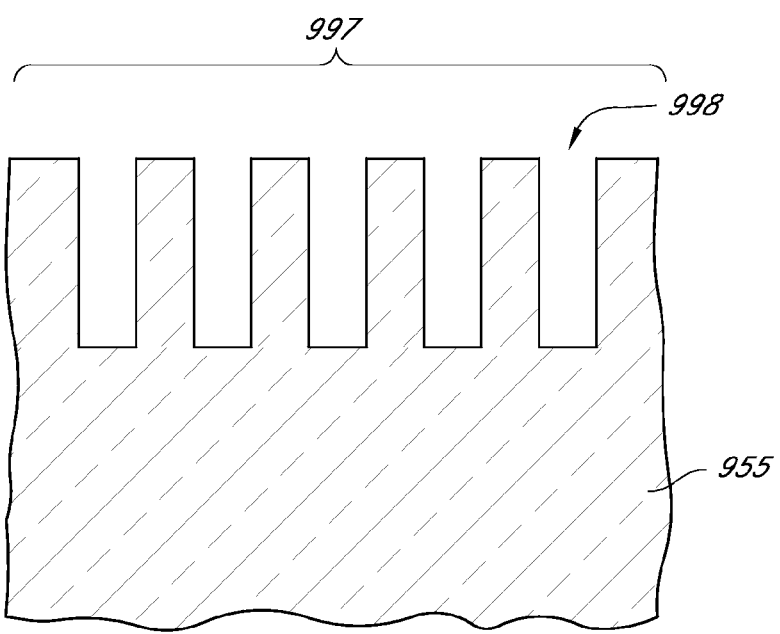

With reference to FIGS. 31A and 31B, the primary mask layer 960 can be removed for further processing of the substrate 955. FIG. 31B is a schematic, cross-sectional side view taken along line 31B-31B of FIG. 31A. Removal of the primary mask layer 960 can be accomplished using chemical mechanical polishing (CMP) or a selective carbon etch (e.g., oxygen-based plasma). Removal of the primary mask layer 960 produces a pattern of isolated and closely-spaced features (holes, as illustrated). In the illustrated embodiment, the holes 998 have square footprints and are preferably spaced less than about 100 nanometers ("nm") from one another, more preferably from about 10 nm to 60 nm from one another. In other embodiments, the holes 998 may have footprints that are rectangular, round, ovular, etc.

Thus, the imprinted pattern 997 is formed in the substrate 955. The imprinted pattern 997 in the substrate 955 is a negative or inverse image of the pattern 940 in the reticle 935. In one embodiment, the imprinted pattern 997 in the substrate 955 is a positive image of the pattern of holes 412 in the sacrificial substrate 110 (FIGS. 21A and 21B).

In at least some of the aforesaid embodiments, any element used in an embodiment can interchangeably be used in another embodiment unless such a replacement is not feasible.

Advantageously, the illustrated embodiments can reliably produce dense patterns of features that are closely-spaced (e.g., less than or equal to about 100 nm, and more preferably less than about 60 nm spacing). One illustrated embodiment employs contact imprint reticles with isolated pillars pitch-multiplied in two dimensions on a sacrificial substrate by use of sidewall spacers. In several other embodiments, isolated pillars are formed directly on a reticle plate using e-beam lithography, and sidewall spacers are employed to reduce spacing without changing the pitch. Advantageously, high surface area capacitors can be formed in closely spaced container shapes.

Following definition of the closely spaced holes 998, the IC fabrication continues to complete the product. For example, layers of bottom electrode material, cell dielectric material and upper electrode material can line the containers, in sequence. In one "double-sided container" arrangement, the bottom electrode containers can be isolated from one another by, e.g., planarization, followed by removal of the remaining structural oxide (thus exposing the outside surfaces of the containers), followed by cell dielectric and upper electrode deposition. Prior and subsequent processes create latching transistors, wordlines, bit lines, contacts and upper metal layers for interconnection.

Thus, in one embodiment of the invention, a method for forming an imprint reticle including an array of isolated features is provided. The method comprises defining a pattern of features over a substrate. Spacers are formed over sidewalls of the features to form an altered pattern of features. At least part of the altered pattern of features is transferred to the imprint reticle to define the array of isolated features.

In another embodiment of the invention, a method for forming an imprint reticle including a pattern of pillars is provided. The method comprises defining a first pattern of pillars over an imprint reticle plate. Spacing between the pillars of the first pattern is decreased to form a second pattern of pillars over the plate. The second pattern of pillars is transferred to the plate.

In yet another embodiment of the invention, a method for forming an imprint reticle including a pattern of pillars is provided. The method comprises performing a first pitch multiplication process to define a first pattern of lines and performing a second pitch multiplication process to define a second pattern of lines crossing the first pattern of lines over a substrate. The first and second patterns of lines are consolidated into a single level to form a pattern of features over the substrate. The pattern of features is transferred to the imprint reticle to form the pattern of pillars in the imprint reticle.

In still another embodiment of the invention, a method for forming a pattern of holes in a substrate is provided. The method comprises forming a pattern of isolated features over a sacrificial substrate. The pattern of isolated features is transferred to an imprint reticle to form a pattern of pillars in the imprint reticle. The pattern of pillars is imprinted into a transfer layer overlying an integrated circuit (IC) substrate to form an imprinted pattern. The imprinted pattern is transferred from the transfer layer to the IC substrate to form a pattern of holes in the IC substrate, wherein the spacing between a first hole and a second hole in the pattern of holes is about 100 nanometers (nm) or less.

In still another embodiment of the invention, a method for forming a pattern of containers in an integrated circuit is provided. The method comprises defining a first pattern of pillars over an imprint reticle plate. Spacing between the pillars of the first pattern is decreased to form a second pattern of pillars over the plate. The second pattern of pillars is transferred to the plate to form a pattern of pillars in the plate. The pattern of pillars in the plate is imprinted into a transfer layer overlying a substrate to form an imprinted pattern. The imprinted pattern is transferred from the transfer layer to the substrate to form a pattern of containers in the substrate.

In still another embodiment of the invention, an imprint reticles for use in contact imprint lithography is provided. The imprint reticle comprises a pattern of isolated features on a surface thereof, each of the isolated features having a length and a width, wherein the spacing between a first isolated feature and a second isolated feature is 60 nanometers (nm) or less.

It will be appreciated by those skilled in the art that various other omissions, additions and modifications may be made to the methods and structures described above without departing from the scope of the invention. As an example, the pattern of isolated features (holes or pillars) disclosed herein may include features, such as lines and/or landing pads, at the periphery of said features. In some cases, one or more of the features may overlap at least some of the holes and/or pillars, with the degree of overlap (i.e., partial or complete overlap) selected as desired. All such modifications and changes are intended to fall within the scope of the invention, as defined by the appended claims.

I claim:

1. A method comprising:
providing a plurality of mandrels over a partially-formed imprint reticle;
forming a first plurality of lines by forming spacers on sidewalls of the mandrels, wherein the spacers define the plurality of lines;
forming a second plurality of lines over the first plurality of lines, wherein the second plurality of lines cross the first plurality of lines, as seen in a top down view; and
transferring a pattern defined by the first and the second plurality of lines to the partially-formed imprint reticle to form an array of isolated features in the partially-formed imprint reticle.

2. The method of claim 1, wherein providing the plurality of mandrels comprises photolithographically defining a pattern corresponding to the mandrels in a photoresist layer.

3. The method of claim 2, wherein providing the plurality of mandrels further comprises transferring the pattern corresponding to the mandrels to an underlying temporary layer, wherein features in the temporary layer constitute the mandrels.

4. The method of claim 1, wherein forming the first plurality of lines comprises:
blanket depositing a layer of spacer material on the mandrels;
subjecting the layer of spacer material to a directional etch to define the spacers on sidewalls of the mandrels; and
selectively removing the mandrels.

5. The method of claim 4, wherein the spacers constitute a spacer mask, wherein forming the first plurality of lines further comprises:
etching through the spacer mask to form features in an underlying layer, wherein the features in the underlying layer constitute the first plurality of lines; and
removing the spacers.

6. The method of claim 1, wherein forming the second plurality of lines comprises:
providing an other plurality of mandrels;
blanket depositing a layer of spacer material on the other plurality of mandrels;
subjecting the layer of spacer material to a directional etch to define other spacers on sidewalls of mandrels of the other plurality of mandrels; and
selectively removing the other plurality of mandrels,
wherein the other spacers constitute the second plurality of lines.

7. The method of claim 1, wherein the array of isolated features comprises holes, wherein transferring the pattern comprises etching the partially-formed imprint reticle.

8. The method of claim 1, further comprising:
imprinting a pattern formed by the array of isolated features into a transfer layer overlying a substrate to form an imprinted pattern; and
transferring the imprinted pattern from the transfer layer to the substrate to form a pattern of holes in the substrate.

9. The method of claim 1, wherein a spacing between isolated features in the array of features is about 60 nanometers or less.

10. A method comprising:
providing an imprint reticle formed by:
providing a plurality of mandrels over a partially-formed imprint reticle;
forming a first plurality of lines by forming spacers on sidewalls of the mandrels, wherein the spacers define the plurality of lines;
forming a second plurality of lines over the first plurality of lines, wherein the second plurality of lines cross the first plurality of lines, as seen in a top down view; and
transferring a pattern defined by the first and the second plurality of lines to the partially-formed imprint reticle to formed an imprint reticle pattern comprising an array of isolated features in the partially-formed imprint reticle; and
transferring the imprint reticle pattern to a substrate.

11. The method of claim 10, wherein transferring the imprint reticle pattern comprises:
providing a substrate having an overlying transfer layer;
contacting the imprint reticle to the transfer layer to imprint a pattern formed by the array of isolated features into the transfer layer; and
transferring the imprinted pattern from the transfer layer to the substrate to form a pattern of isolated features in the substrate.

12. The method of claim 11, wherein the isolated features define an array of electrical devices in an integrated circuit.

13. A method comprising:
providing an initial pattern comprising a plurality of mandrels over a sacrificial substrate;
forming spacers on sidewalls of the mandrels to define a first pattern of lines from the initial pattern;
forming a second pattern of lines over the first pattern of lines, wherein the second pattern of lines cross the first pattern of lines, as seen in a top down view, and wherein the first and the second patterns of lines form an altered pattern; and
transferring the altered pattern to an imprint reticle plate to define an array of isolated features in the imprint reticle plate.

14. The method of claim 13, wherein transferring the altered pattern comprises etching the altered pattern into the sacrificial substrate to form a plurality of openings in the sacrificial substrate.

15. The method of claim 14, wherein transferring the altered pattern further comprises:
depositing a material into the openings and over the sacrificial substrate; and
planarizing the material deposited into the openings to form a planar layer.

16. The method of claim 15, wherein transferring the altered pattern further comprises removing the sacrificial substrate after planarizing the material deposited into the openings, wherein the planar layer forms at least part of the imprint reticle.

17. The method of claim 16, further comprising attaching the planar layer to a support structure before removing the sacrificial substrate.

18. The method of claim 15, wherein the openings comprise holes and depositing the material forms pillars composed of the material deposited in the openings.

19. The method of claim 13, further comprises consolidating the first and second patterns of lines into a single level over the sacrificial substrate before transferring the altered pattern to the imprint reticle.

20. The method of claim 13, wherein lines of the first pattern of lines are formed by different material from lines of the second pattern of lines.

* * * * *

UNITED STATES PATENT AND TRADEMARK OFFICE
CERTIFICATE OF CORRECTION

PATENT NO. : 8,663,532 B2  
APPLICATION NO. : 13/888042  
DATED : March 4, 2014  
INVENTOR(S) : Gurtej S. Sandhu Page 1 of 1

It is certified that error appears in the above-identified patent and that said Letters Patent is hereby corrected as shown below:

On the title page, in item (56), under "Other Publications", in column 2, line 3, delete "2013," and insert -- 2003, --, therefor.

In the Claims

In column 31, line 55, in Claim 10, delete "formed" and insert -- form --, therefor.

Signed and Sealed this
Fourth Day of November, 2014

Michelle K. Lee
*Deputy Director of the United States Patent and Trademark Office*